United States Patent
Widjaja et al.

(10) Patent No.: US 9,905,564 B2
(45) Date of Patent: Feb. 27, 2018

(54) MEMORY CELL COMPRISING FIRST AND SECOND TRANSISTORS AND METHODS OF OPERATING

(71) Applicant: Zeno Semiconductor, Inc., Cupertino, CA (US)

(72) Inventors: Yuniarto Widjaja, San Jose, CA (US); Jin-Woo Han, San Jose, CA (US); Benjamin S. Louie, Fremont, CA (US)

(73) Assignee: Zeno Semiconductors, Inc., Sunnyvale, CA (US)

( * ) Notice: Subject to any disclaimer, the term of this patent is extended or adjusted under 35 U.S.C. 154(b) by 72 days.

(21) Appl. No.: 14/380,779

(22) PCT Filed: Feb. 15, 2013

(86) PCT No.: PCT/US2013/026466
§ 371 (c)(1),
(2) Date: Aug. 25, 2014

(87) PCT Pub. No.: WO2013/123415
PCT Pub. Date: Aug. 22, 2013

(65) Prior Publication Data
US 2015/0023105 A1    Jan. 22, 2015

Related U.S. Application Data

(63) Continuation-in-part of application No. 13/746,523, filed on Jan. 22, 2013, now Pat. No. 9,230,651.
(Continued)

(51) Int. Cl.
*H01L 29/78* (2006.01)
*H01L 29/70* (2006.01)
(Continued)

(52) U.S. Cl.
CPC ...... *H01L 27/10802* (2013.01); *G11C 11/404* (2013.01); *G11C 16/0433* (2013.01);
(Continued)

(58) Field of Classification Search
CPC ............... H01L 21/84; H01L 27/10802; H01L 29/1095; H01L 29/0821; H01L 29/73;
(Continued)

(56) References Cited

U.S. PATENT DOCUMENTS

| | | |
|---|---|---|
| 4,300,212 A | 11/1981 | Simko |
| 4,959,812 A | 9/1990 | Momodomi et al. |

(Continued)

FOREIGN PATENT DOCUMENTS

KR    1020100073871    7/2010

OTHER PUBLICATIONS

Morishita et al., "A Capacitorless Twin-Transistor Random Access Memory (TTRAM) on SOI", IEICE Transactions on Electronics, Institute of Electronics, Tokyo, JP, vol. E09C, No. 4, Apr. 1, 2007, pp. 765-771.

(Continued)

*Primary Examiner* — Latanya N Crawford
(74) *Attorney, Agent, or Firm* — Law Office of Alan W. Cannon; Alan W. Cannon

(57) ABSTRACT

Semiconductor memory cells, array and methods of operating are disclosed. In one instance, a memory cell includes a bi-stable floating body transistor and an access device; wherein the bi-stable floating body transistor and the access device are electrically connected in series.

14 Claims, 56 Drawing Sheets

Related U.S. Application Data

(60) Provisional application No. 61/599,425, filed on Feb. 16, 2012, provisional application No. 61/621,546, filed on Apr. 8, 2012.

(51) Int. Cl.

| | | |
|---|---|---|
| *H01L 27/108* | (2006.01) | |
| *G11C 11/404* | (2006.01) | |
| *G11C 16/04* | (2006.01) | |
| *G11C 16/10* | (2006.01) | |
| *H01L 27/11524* | (2017.01) | |
| *H01L 27/102* | (2006.01) | |
| *H01L 29/08* | (2006.01) | |
| *H01L 29/10* | (2006.01) | |
| *H01L 29/73* | (2006.01) | |

(52) U.S. Cl.
CPC .......... *G11C 16/10* (2013.01); *H01L 27/1023* (2013.01); *H01L 27/11524* (2013.01); *H01L 29/0804* (2013.01); *H01L 29/0821* (2013.01); *H01L 29/1095* (2013.01); *H01L 29/70* (2013.01); *H01L 29/73* (2013.01); *H01L 29/7841* (2013.01)

(58) Field of Classification Search
CPC ............. H01L 27/1023; H01L 29/0804; H01L 27/11524; H01L 29/70; H01L 29/7841; G11C 16/10; G11C 16/0433; G11C 11/404; G11C 16/0483; G11C 11/4023; G11C 11/407; G11C 11/412; G11C 11/417; G11C 17/12; G11C 19/184; G11C 5/06; G11C 5/063; G11C 5/066; G11C 5/08; G11C 5/10
See application file for complete search history.

(56) References Cited

U.S. PATENT DOCUMENTS

| | | |
|---|---|---|
| 5,519,831 A | 5/1996 | Holzhammer |
| 5,581,504 A | 12/1996 | Chang et al. |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |
| 6,166,407 A | 12/2000 | Ohta |
| 6,229,161 B1 | 5/2001 | Nemati et al. |
| 6,307,781 B1 | 10/2001 | Shum |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,653,175 B1 | 11/2003 | Nemati et al. |
| 6,661,042 B2 | 12/2003 | Hsu |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,937,516 B2 | 8/2005 | Fazan et al. |
| 6,954,377 B2 | 10/2005 | Choi et al. |
| 6,956,256 B2 | 10/2005 | Forbes |
| 6,969,662 B2 | 11/2005 | Fazan et al. |
| 7,061,806 B2 | 6/2006 | Tang et al. |
| 7,081,653 B2 | 7/2006 | Kawanaka |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,224,019 B2 | 5/2007 | Hieda et al. |
| 7,224,020 B2 | 5/2007 | Wang et al. |
| 7,259,420 B2 | 8/2007 | Anderson et al. |
| 7,259,992 B2 | 8/2007 | Shirota |
| 7,285,820 B2 | 10/2007 | Park et al. |
| 7,285,832 B2 | 10/2007 | Hoefler et al. |
| 7,301,803 B2 | 11/2007 | Okhonin et al. |
| 7,329,580 B2 | 2/2008 | Choi et al. |
| 7,391,640 B2 | 6/2008 | Tang et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Mathew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,683,430 B2 | 3/2010 | Okhonin |
| 7,701,751 B2 | 4/2010 | Kang et al. |
| 7,701,763 B2 | 4/2010 | Roohparvar |
| 7,733,693 B2 | 6/2010 | Ferrant et al. |
| 7,738,312 B2 | 6/2010 | Shimano et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,898,009 B2 | 3/2011 | Wilson et al. |
| 7,903,472 B2 | 3/2011 | Chen et al. |
| 7,924,630 B2 | 4/2011 | Carman |
| 7,933,140 B2 | 4/2011 | Wang et al. |
| 8,014,200 B2 | 9/2011 | Widjaja |
| 8,018,007 B2 | 9/2011 | Chang et al. |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja et al. |
| 8,243,499 B2 | 8/2012 | Widjaja |
| 8,264,875 B2 | 9/2012 | Widjaja et al. |
| 8,294,193 B2 | 10/2012 | Widjaja |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,582,359 B2 | 11/2013 | Widjaja |
| 8,654,583 B2 | 2/2014 | Widjaja |
| 8,711,622 B2 | 4/2014 | Widjaja |
| 8,767,458 B2 | 7/2014 | Widjaja |
| 8,787,085 B2 | 7/2014 | Widjaja |
| 8,837,247 B2 | 9/2014 | Widjaja |
| 2002/0018366 A1 | 2/2002 | Von Schwerin et al. |
| 2002/0048193 A1 | 4/2002 | Tanikawa et al. |
| 2005/0013163 A1 | 1/2005 | Ferrant et al. |
| 2005/0024968 A1 | 2/2005 | Lee et al. |
| 2005/0032313 A1 | 2/2005 | Forbes |
| 2005/0124120 A1 | 6/2005 | Du et al. |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0187706 A1 | 8/2006 | Tang et al. |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2006/0279985 A1 | 12/2006 | Keshavarzi et al. |
| 2007/0004149 A1 | 1/2007 | Tews |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0211535 A1 | 9/2007 | Kim |
| 2007/0215954 A1 | 9/2007 | Mouli |
| 2007/0284648 A1 | 12/2007 | Park et al. |

(56) References Cited

U.S. PATENT DOCUMENTS

| | | |
|---|---|---|
| 2008/0048239 A1 | 2/2008 | Huo et al. |
| 2008/0080248 A1 | 4/2008 | Lue et al. |
| 2008/0123418 A1 | 5/2008 | Widjaja |
| 2008/0142868 A1* | 6/2008 | Tak .................. H01L 21/84 257/315 |
| 2008/0179656 A1 | 7/2008 | Aoki |
| 2008/0224202 A1 | 9/2008 | Young et al. |
| 2008/0265305 A1 | 10/2008 | He et al. |
| 2008/0303079 A1 | 12/2008 | Cho et al. |
| 2009/0010055 A1 | 1/2009 | Kang et al. |
| 2009/0016101 A1 | 1/2009 | Okhonin et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0155798 A1 | 6/2010 | Hwang |
| 2010/0159650 A1* | 6/2010 | Song .................. H01L 27/108 438/155 |
| 2010/0221877 A1 | 9/2010 | Park et al. |
| 2010/0246277 A1 | 9/2010 | Widjaja |
| 2010/0246284 A1 | 9/2010 | Widjaja |
| 2010/0329043 A1 | 12/2010 | Fossum et al. |
| 2011/0012202 A1* | 1/2011 | Chang .................. H01L 21/845 257/350 |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |
| 2013/0099316 A1* | 4/2013 | Chang .................. H01L 21/845 257/347 |
| 2013/0148422 A1 | 6/2013 | Widjaja |
| 2013/0250685 A1 | 9/2013 | Widjaja |
| 2013/0264656 A1 | 10/2013 | Widjaja et al. |
| 2013/0292635 A1 | 11/2013 | Widjaja |
| 2013/0301349 A1 | 11/2013 | Widjaja |
| 2014/0021549 A1 | 1/2014 | Widjaja |
| 2014/0036577 A1 | 2/2014 | Widjaja et al. |
| 2014/0159156 A1 | 6/2014 | Widjaja |
| 2014/0160868 A1 | 6/2014 | Widjaja et al. |
| 2014/0198551 A1 | 7/2014 | Louie et al. |
| 2014/0332899 A1 | 11/2014 | Widjaja |

OTHER PUBLICATIONS

Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.

Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.

Aoulaiche, et al. "Junction Field Effect on the Retention Time for One-Transistor Floating-Body RAM." Electron Devices, IEEE Transactions on, vol. 59, No. 8, 2012, pp. 2167-2172.

Aoulaiche, et al. "Hot hole induced damage in 1T-FBRAM on bulk FinFET." Reliability Physics Symposium (IRPS), 2011 IEEE International. IEEE, 2011, pp. 99-104.

Avci, et al. "Floating-Body Diode—A Novel DRAM Device." Electron Device Letters, IEEE, vol. 33, No. 2, 2012, pp. 161-163.

Bawedin, et al., "Floating-Body SOI Memory: Concepts, Physics, and Challenges", ECS Transactions 19.4 (2009), pp. 243-256.

Ban, et al. "Integration of Back-Gate doping for 15-nm node floating body cell (FBC) memory." VLSI Technology (VLSIT), 2010 Symposium on. IEEE, 2010, pp. 159-160.

Cho, et al. "Variation-aware study of BJT-based capacitorless DRAM cell scaling limit." Silicon Nanoelectronics Workshop (SNW), 2012 IEEE. IEEE, 2012, pp. 1-2.

Cho, et al. "Variation Study and Implications for BJT-Based Thin-Body Capacitorless DRAM." Electron Device Letters, IEEE, vol. 33, No. 3, 2012, pp. 312-314.

Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.

Chiu, et al. "A simple process of thin-film transistor using the trench-oxide layer for improving 1T-DRAM performance." Next-Generation Electronics (ISNE), 2010 International Symposium on. IEEE, 2010, pp. 254-257.

Chun, et al. "A 1.1 V, 667MHz random cycle, asymmetric 2T gain cell embedded DRAM with a 99.9 percentile retention time of 110 μsec." VLSI Circuits (VLSIC), 2010 IEEE Symposium on. IEEE, 2010, pp. 191-192.

Chun, et al. "A 667 MHz Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.

Cao, et al. "A Novel 1T-1D DRAM Cell for Embedded Application." Electron Devices, IEEE Transactions on, vol. 59, No. 5, 2012, pp. 1304-1310.

Collaert, et al. "Substrate bias dependency of sense margin and retention in bulk FinFET 1T-DRAM cells." Solid-State Electronics 65 (2011), pp. 205-210.

Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.

Chatterjee, et al. "Taper isolated dynamic gain RAM cell." Electron Devices Meeting, 1978 International. vol. 24. IEEE, 1978, pp. 698-699.

Chatterjee, et al. Circuit Optimization of the Paper Isolated Dynamic Gain RAM Cell for VLSI Memories, pp. 22-23, 1979 IEEE International Solid-State Circuits Conference.

Chatterjee, et al. "A survey of high-density dynamic RAM cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Galeti, M., et al. "BJT effect analysis in p- and n-SOI MuGFETs with high-k gate dielectrics and TiN metal gate electrode for a 1T-DRAM application." SOI Conference (SOI), 2011 IEEE International. IEEE, 2011, pp. 1-2.

Gamiz, et al. "3D Trigate 1T-DRAM Memory Cell for 2x nm Nodes." Memory Workshop (IMW), 2012 4th IEEE International. IEEE, 2012, pp. 1-4.

Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.

Giusi, et al. "Bipolar mode operation and scalability of double-gate capacitorless 1T-DRAM cells." Electron Devices, IEEE Transactions on, vol. 57, No. 8 (2010), pp. 1743-1750.

Gupta, et al. "32nm high-density high-speed T-RAM embedded memory technology." Electron Devices Meeting (IEDM), 2010 IEEE International. IEEE, 2010, pp. 12-1.

(56) References Cited

OTHER PUBLICATIONS

Han, et al. "Bistable resistor (biristor)-gateless silicon nanowire memory." VLSI Technology (VLSIT), 2010 Symposium on. IEEE, 2010, pp. 171-172.
Han, et al. "Biristor—Bistable resistor based on a silicon nanowire." Electron Device Letters, IEEE 31.8 (2010): 797-799.
Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.
Hwang, et al. "Offset buried metal gate vertical floating body memory technology with excellent retention time for DRAM application." VLSI Technology (VLSIT), 2011 Symposium on. IEEE, 2011, pp. 172-173.
Kim, et al. "Vertical double gate Z-RAM technology with remarkable low voltage operation for DRAM application." VLSI Technology (VLSIT), 2010 Symposium on, 2010, pp. 163-164.
Kim, et al. "Silicon on replacement insulator (SRI) floating body cell (FBC) memory." VLSI Technology (VLSIT), 2010 Symposium on. IEEE, 2010, pp. 165-166.
Kim, et al. "Optical charge-pumping: A universal trap characterization technique for nanoscale floating body devices." VLSI Technology (VLSIT), 2011 Symposium on. IEEE, 2011, pp. 190-191.
Kim, et al. "Investigation of 1T DRAM cell with non-overlap structure and recessed channel." Silicon Nanoelectronics Workshop (SNW), 2010. IEEE, 2010, pp. 1-2.
Lu, et al., "A Simplified Superior Floating-Body/Gate DRAM Cell", IEEE Elec. Dev. Letters, vol. 30, No. 3, Mar. 2009, pp. 282-284.
Lu, et al., "A Floating-Body/Gate DRAM Cell Upgraded for Long Retention Time", IEEE Elec. Dev. Letters, vol. 32, No. 6, pp. 731-733, Jun. 2011.
Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.
Lee, et al. "A Novel Capacitorless 1T DRAM Cell for Data Retention Time Improvement." Nanotechnology, IEEE Transactions on, vol. 10, No. 3, 2011, pp. 462-466.
Leiss, et al, "dRAM Design Using the Taper-Isolated Dynamic RAM Cell." Solid-State Circuits, IEEE Journal of 17.2 (1982): 337-344.
Mahatme, et al. "Total ionizing dose effects on ultra thin buried oxide floating body memories." Reliability Physics Symposium (IRPS), 2012 IEEE International, 2012, pp. 1-5.
Moon, et al. "Fin-width dependence of BJT-based 1T-DRAM implemented on FinFET." Electron Device Letters, vol. 31, No. 9 (2010): 909-911.
Moon, et al. "An optically assisted program method for capacitor-less 1T-DRAM." Electron Devices, IEEE Transactions on, vol. 57, No. 7, 2010, pp. 1714-1718.
Moon, et al. "Multi-functional universal device using a band-engineered vertical structure." Electron Devices Meeting (IEDM), 2011 IEEE International. IEEE, 2011, pp. 24.6.2-24.6.4.
Moon, et al. "Ultimately scaled 20nm unified-RAM." Electron Devices Meeting (IEDM), 2010 IEEE International. IEEE, 2010, pp. 12.2.1-12.2.4.
Nicoletti, et al. "The Dependence of Retention Time on Gate Length in UTBOX FBRAM With Different Source/Drain Junction Engineering." Electron Device Letters, vol. 33, No. 7, 2012, pp. 940-942.
Ohsawa, et al, "A Novel Capacitor-less DRAM Cell: Floating Body Cell", CRC Press, Taylor & Francis Group, 2012, pp. 1-7.
Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.
Okhonin et al. A Capicitor-Less 1T-DRAM Cell, IEEE Electron Device Letters, vol. 23, No. 2, Feb. 2002, pp. 85-87.

Ohsawa, et al. "Autonomous refresh of floating body cell (FBC)." Electron Devices Meeting, 2008. IEDM 2008. IEEE International. IEEE, 2008, pp. 801-804.
Ohsawa et al., Memory Design Using One-Transistor Gain Cell on SOI, Tech. Digest, IEEE International Solid-State Circuits, vol. 37, No. 11, 2002, pp. 1510-1522.
Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.
Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.
Campardo G. et al., VLSI Design of Non-Volatile Memories, Springer Berlin Heidelberg New York, 2005, pp. 94-95.
Cho et al., A novel capacitor-less DRAM cell using Thin Capacitively-Coupled Thyristor (TCCT), pp. 1-4, 2005.
Celler et al., "Frontiers of Silicon-on-insulator", Journal of Applied Physics, vol. 93, No. 9, pp. 4955-4978, May 2003.
Han et al. Programming/Erasing Characteristics of 45 nm NOR-Type Flash Memory Based on SOI FinFET Structure. J. Korean Phys. Society, vol. 47, Nov. 2005, pp. S564-S567.
Rothemund, et al., The importance of being modular, Nature, vol. 485, May 2012 pp. 584-585.
Reisch, "On bistable behavior and open-base breakdown of bipolar transistors in the avalanche regime-modeling and applications." Electron Devices, IEEE Transactions on 39.6 (1992): 1398-1409.
Robert F. Pierret. Semiconductor Device Fundamentals, ISBN: 0-201-54393-1, 1996, by Addison-Wesley Publishing Company, Inc. PNPN Devices 463-476.
Rodriguez, et al. "A-RAM: Novel capacitor-less DRAM memory." In SOI Conference, 2009 IEEE International, pp. 1-2. IEEE, 2009.
Rodriguez, et al. "A-RAM memory cell: concept and operation." Electron Device Letters, IEEE, vol. 31, No. 9 (2010), pp. 972-974.
Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.
Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.
Sugizaki et al., Ultra-high-speed Novel Bulk Thyristor-SRAM (BT-RAM) Cell with Selective Epitaxy Anode (SEA), pp. 1-4, 2006.
Sakui, K., et al. "A new static memory cell based on the reverse base current effect of bipolar transistors." Electron Devices, IEEE Transactions on 36.6 (1989): 1215-1217.
Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.
Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.
Ohsawa, et al. Autonomous refresh of floating-body cell due to Current Anomaly of Impact Ionization, IEEE Transactions on Electron Devices, vol. 56, No. 10, pp. 2302-2311, 2009.
Ohsawa et al., "a Novel Capacitor-less DRAM Cell Floating Body Cell", Pan Stanford Publishing, 2012, Table of Contents and Preface.
Villaret et al., "Mechanisms of charge modulation in the floating body of triple-well nMOSFET capacitor-less DRAMs", Microelectronic Engineering 72 (2004) 434-439.
IPRP and Written Opinion of the International Searching Authority re PCT/US2013/026466.
Headland. Hot electron injection, Feb. 19, 2004.
Langholz, et al., Foundations of Digital Logic Design, World Scientific Publishing Co., 1998, pp. 339-342 and 344.
Lanyon, et al., "Bandgap Narrowing in Moderately to Heavily Doped Silicon", IEEE Trans. on Electron Devices, vol. ED-26, No. 7, 1979, pp. 1014-1018.

(56) References Cited

OTHER PUBLICATIONS

Lin, et al., "A new 1T DRAM Cell with enhanced Floating Body Effect", Proc. of 2006 IEEE International Workshop on Memory Tech., Design and Testing, pp. 1-5, 2006.
Montaanaro et al., A 160-MHz, 32-b, 05-W CMOS RISC Microprocessor, IEEE J. Solid State Circuits, vol. 31, No. 11, pp. 1703-1714, Nov. 1996.
Oh, et al., "a 4-Bit Double SONOS memory (DSM) with 4 Storage Nodes per Cell for Ultimate Multi-Bit Operation", 2006 Symposium on VLSI Tech. Digest of Tech. Papers, pp. 1-2, 2006.
Okhonin, et al., Principles of Transient Charge Pumping on Partially Depleted SOI MOSFETs, IEEE Electron Device Letters, vol. 23, No. 5, May 2002, pp. 279-281.
Okhonin et al. A SOI Capacitor-less 1T-DRAM Concept, 2001IEEE International SOI Conference, 2001, pp. 153-154.
Ohsawa et al., An 18.5ns 128Mb SOI DRAM with a Floating body Cell, IEEE International Solid-State Circuits Conference, 2005, pp. 458-459, 609.
Pellizzer et al., A 90nm Phase Change Memory Technology for Stand-Alone Non-Volatile Memory Applications, IEEE 2006 Symposium on VLSI Tech. Digest of Tech. Papers, pp. 1-2, 2006.
Ranica, et al. "Scaled IT-Bulk devices built with CMOS 90nm technology for low-cost eDRAM applications." VLSI Technology, 2005. Digest of Technical Papers. 2005 Symposium on. IEEE, 2005, pp. 38-39.
Shin, et al. "Vertical-Gate Si/SiGe Double-HBT-Based Capacitorless 1T DRAM Cell for Extended Retention Time at Low Latch Voltage." Electron Device Letters, vol. 33, No. 2, 2012, pp. 134-136.
Shin, et al. "A novel double HBT-based capacitorless 1T DRAM cell with Si/SiGe heterojunctions." Electron Device Letters, vol. 32, No. 7, 2011, pp. 850-852.
Sze, et al. Physics of Semiconductor Devices, Wiley-Interscience, 2007, p. 104.
Tack, et al. "The multistable charge-controlled memory effect in SOI MOS transistors at low temperatures." Electron Devices, IEEE Transactions on 37.5 (1990): 1373-1382.
Terada, et al. "A new VLSI memory cell using capacitance coupling (CC cell)." Electron Devices, IEEE Transactions on 31.9 (1984): pp. 319-1324.
Villaret, et al. "Further insight into the physics and modeling of floating-body capacitorless DRAMs." Electron Devices, IEEE Transactions on 52.11 (2005): pp. 2447-2454.
Ventrice, et al. "Analytical model of deeply-scaled thyristors for memory applications." Microelectronics and Electron Devices (WMED), 2012 IEEE Workshop on. IEEE, 2012, pp. 1-4.
Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.
Yoshida et al., A Design of a Capacitorless 1T-DRAM Cell Using Gate-Induced Drain Leakage (GIDL) Current for Low-power and High-speed Embedded Memory, International Electron Devices Meeting, 2003, pp. 1-4.
Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.
Ohsawa, et al. Autonomous refresh of floating body cell (FBC), IEEE, pp. 801-804, 2008.

\* cited by examiner

Floating Body 24 is positively charged and V(SL 16) = 0.0V

FB is neutrally charged; and V(SL 16) = V(FB 24) = 0V

MEMORY CELL COMPRISING FIRST AND SECOND TRANSISTORS AND METHODS OF OPERATING

CROSS-REFERENCE

This application claims the benefit of U.S. Provisional Application No. 61/599,425, filed on Feb. 16, 2012, which application is hereby incorporated herein, in its entirety, by reference thereto.

This application claims the benefit of U.S. Provisional Application No. 61/621,546 filed on Apr. 8, 2012, which application is hereby incorporated herein, in its entirety, by reference thereto.

This application is a continuation-in-part of co-pending U.S. application Ser. No. 13/746,523 filed on Jan. 22, 2013, which application is hereby incorporated herein, in its entirety, by reference thereto.

This application claims the benefit under 35 USC 371(c) of co-pending PCT Application No. PCT/US2013/026466, filed 15 Feb. 2013, which claims the benefit of U.S. Provisional Application No. 61/599,425, filed Feb. 16, 2012, and U.S. Provisional Application No. 61/621,546, filed Apr. 8, 2012, and U.S. application Ser. No. 13/746,523, filed Jan. 22, 2013, which applications are each hereby incorporated herein, in their entireties, by reference thereto and to which applications we claim priority under 35 U.S.C. Sections 371, 119 and 120, respectively.

FIELD OF THE INVENTION

The present invention relates to semiconductor memory technology. More specifically, the present invention relates to a semiconductor memory device comprising an electrically floating body transistor and an access transistor.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

DRAM based on the electrically floating body effect has been proposed (see for example "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002). Such memory eliminates the capacitor used in the conventional 1T/1C memory cell, and thus is easier to scale to smaller feature size. In addition, such memory allows for a smaller cell size compared to the conventional 1T/1C memory cell.

Widjaja and Or-Bach describes a bi-stable SRAM cell incorporating a floating body transistor, where more than one stable state exists for each memory cell (for example as described in U.S. Patent Application Publication No. 2010/00246284 to Widjaja et al., titled "Semiconductor Memory Having Floating Body Transistor and Method of Operating" and U.S. Patent Application Publication No. 2010/0034041, "Method of Operating Semiconductor Memory Device with Floating Body Transistor Using Silicon Controlled Rectifier Principle", which are both hereby incorporated herein, in their entireties, by reference thereto). This bi-stability is achieved due to the applied back bias which causes impact ionization and generates holes to compensate for the charge leakage current and recombination.

In a memory array comprising rows and columns of memory cells, performing an operation on a memory cell may trigger a change in its surrounding memory cells, a condition often referred to as disturb. There is a continuing need for improving disturb resistance in memory cells. Two-transistor memory cells, for example as described in "Capacitorless Twin-Transistor Random Access Memory (TTRAM) on SOI", F. Morishita et al, Custom Integrated Circuits Conference, 2005, pp. 435-438, "A configurable enhanced TTRAM macro for system-level power management unified memory", F. Morishita et al., Solid-State Circuits, IEEE Journal of, vol. 42 no. 4 (2007), pp. 853-861, "A high-density scalable twin transistor RAM (TTRAM) with verify control for SOI platform memory IPs", K. Arimoto et al., Solid-State Circuits, IEEE Journal of, vol. 42, no. 11 (2007), pp. 2611-2619, and "A Scalable ET2RAM (SE-TRAM) with Verify Control for SoC Platform Memory IP on SOI", K. Arimoto et al. pp. 429-432, Custom Integrated Circuits Conference, 2006, which are hereby incorporated herein, in their entireties, may improve the disturb resistance of the memory cells.

SUMMARY OF THE INVENTION

The present invention address the continuing need for improving disturb resistance by providing an improvement of disturb resistance during memory cell operation by incorporating an access transistor.

In one aspect of the present invention, a semiconductor memory cell includes: a bi-stable floating body transistor; and an access device; wherein the bi-stable floating body transistor and said access device are electrically connected in series.

In at least one embodiment, the access device comprises a metal-oxide-semiconductor transistor.

In at least one embodiment, the access device comprises a bipolar transistor.

In at least one embodiment, the access transistor is of the same conductivity type as the bi-stable floating body transistor.

In at least one embodiment, the access transistor has a conductivity type different from a conductivity type of the bi-stable floating body transistor.

In at least one embodiment, the bi-stable floating body transistor comprises a buried well region.

In at least one embodiment, the bi-stable floating body transistor comprises a multiple port floating body transistor, and the access device comprises multiple access transistors.

In at least one embodiment, the bi-stable floating body transistor comprises a dual-port floating body transistor, and the access device comprises two access transistors.

In another aspect of the present invention, a semiconductor memory cell includes: a first transistor having a first body; a second transistor having a second body; a substrate underlying both of the first and second bodies; a buried layer interposed between the substrate and at least one of the first and second bodies; a first source region contacting the first body; a first drain region separated from the first source line region and contacting the first body; a first gate insulated from the first body; an insulating member insulating the first body from the second body; a second source region contacting the second body; a second drain region separated from the second source region and contacting the second body; and a second gate insulated from the second body.

In at least one embodiment, the first gate is positioned between the first source region and the first drain region and the second gate is positioned between the second source region and the second drain region.

In at least one embodiment, the first transistor is a floating body transistor and the second transistor is an access transistor.

In at least one embodiment, the first body is a floating body and the second body is a well region electrically connected to the substrate.

In at least one embodiment, the first drain region is electrically connected to the second source region.

In at least one embodiment, the first body has a first conductivity type selected from p-type conductivity type and n-type conductivity type, wherein the second body has the first conductivity type, and wherein the first and second source regions and first and second drain regions each have a second conductivity type selected from the p-type conductivity type and n-type conductivity type, and wherein the first conductivity type is different from the second conductivity type.

In at least one embodiment, the first body is a floating body and the second body is a well region electrically connected to the buried layer, wherein the first body has a first conductivity type selected from p-type conductivity type and n-type conductivity type, and wherein the second body has a second conductivity type selected from the p-type conductivity type and n-type conductivity type, and wherein the first conductivity type is different from the second conductivity type.

In at least one embodiment, the semiconductor memory cell comprises a reference cell, the reference cell further comprising: a sense line region spaced apart from the first source region and the first drain region and contacting the first body, wherein the first body has a first conductivity type selected from p-type conductivity type and n-type conductivity type, and wherein the sense line region has the first conductivity type.

In at least one embodiment, the first drain region is electrically connected to the second gate.

In at least one embodiment, the first transistor is a floating body transistor and the second transistor is a floating body transistor.

In at least one embodiment, the first and second floating body transistors are configured to store complementary charges.

In at least one embodiment, at least one of the first and second bodies is a bi-stable floating body.

In another aspect of the present invention, a semiconductor memory cell includes: a first transistor having a floating body; a buried layer below the floating body, wherein application of voltage on the buried layer maintains a state of the memory cell; and a second transistor; wherein the first and second transistors are connected in series.

In another aspect of the present invention, a semiconductor memory cell includes: a bi-stable floating body transistor; and a floating gate transistor.

In another aspect of the present invention, a semiconductor memory cell includes: a first bi-stable floating body transistor; and a second bi-stable floating body transistor; wherein the first and second floating body transistors are configured to store complementary charges.

In another aspect of the present invention, a method of operating a semiconductor memory cell having a bi-stable floating body transistor and an access transistor includes: applying voltage to the access transistor to turn on the access transistor; and assisting selection of the memory cell for an operation by activating the access transistor.

In at least one embodiment, the operation is a read operation comprising monitoring current through the memory cell to sense a state of the floating body transistor.

In at least one embodiment, the operation is a write logic-1 operation, wherein the voltage applied to the access transistor is a positive bias applied to a bit line terminal of the access transistor, and wherein the access transistor passes the positive bias to a drain region of the floating body transistor.

In at least one embodiment, the method further includes further biasing the floating body transistor to maximize hole generation through an impact ionization mechanism.

In at least one embodiment, the voltage applied to the access transistor is biased to cause a source region of the access transistor to float, the method further comprising increasing potential of a floating body of the floating body transistor by capacitive coupling.

In at least one embodiment, the operation is a write logic-0 operation, wherein the voltage applied to the access transistor is a negative bias, and wherein the access transistor passes the negative bias to a drain region of the floating body transistor.

In at least one embodiment, the operation is an active low read operation.

In at least one embodiment, the operation is an active low write logic-1 operation.

In at least one embodiment, the operation is a read operation comprising monitoring current through the memory cell to sense a state of the floating body transistor; and wherein the voltage applied to turn on the access transistor is zero voltage.

In at least one embodiment, the operation is a write logic-1 operation, wherein the voltage applied to the access transistor comprises applying zero voltage to a word line terminal of the access transistor, and the write logic-1 operation is performed by a band-to-band tunneling mechanism.

In at least one embodiment, the operation is a write logic-1 operation, wherein the voltage applied to the access transistor comprises applying zero voltage to a word line terminal of the access transistor, and the write logic-1 operation is performed by through an impact ionization mechanism.

In at least one embodiment, the operation is a write logic-1 operation, and the voltage applied to the access transistor is a positive voltage biased to cause a source region of the access transistor to float, the method further comprising increasing potential of a floating body of the floating body transistor by capacitive coupling.

In at least one embodiment, the operation is a write logic-0 operation, wherein the voltage applied to the access transistor is a positive bias applied to a word line terminal of the access transistor.

In at least one embodiment, the operation is a write logic-0 operation, wherein the voltage applied to the a word line terminal of the access transistor is a negative bias that is more negative than a negative bias applied to a drain region of the floating body transistor.

These and other features of the invention will become apparent to those persons skilled in the art upon reading the details of the memory devices and methods as more fully described below.

DETAILED DESCRIPTION OF THE INVENTION

Before the present memory devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a cell" includes a plurality of such cells and reference to "the terminal" includes reference to one or more terminals and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Figure 1A:
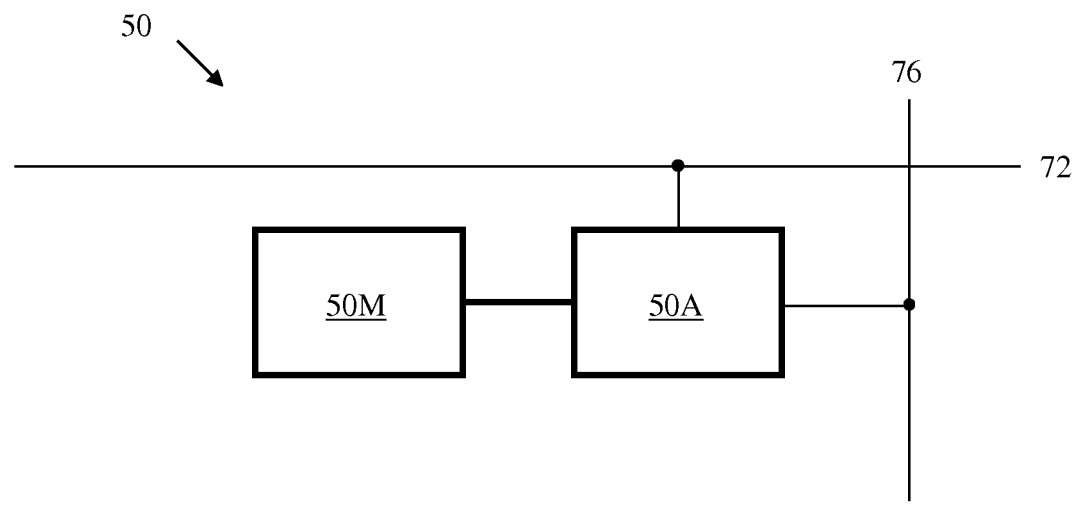
FIG. 1A schematically illustrates a memory cell which comprises memory device and an access device that are connected in series, according to a generic embodiment of the present invention.

FIG. 1A schematically illustrates a memory cell 50 according to an embodiment of the present invention, which comprises memory device 50M and access device 50A, that are connected in series. Memory cell 50 is a generic representation of a memory cell comprising a memory device and access device as described, and generically represents more specific embodiment described herein, such as 100, 100B, 102, 104, 100R1, 100R2, 200, 300, and 500. Memory device 50M functions to store the state of the memory cell 50, and is accessed through the access device 50A. The access device 50A is connected to terminals, for example the word line terminal 72 and the bit line terminal 76 as shown in FIG. 1A, which are used to select a memory cell 50 in a memory array comprising a plurality of rows and columns of memory cells 50. In a series connection, such as in memory device 50M and access device 50A, the same current flows through each of the device. Therefore, the access device 50A can be used to turn-off or deselect an unselected memory cell 50 during read or write operations.

Figure 1B:
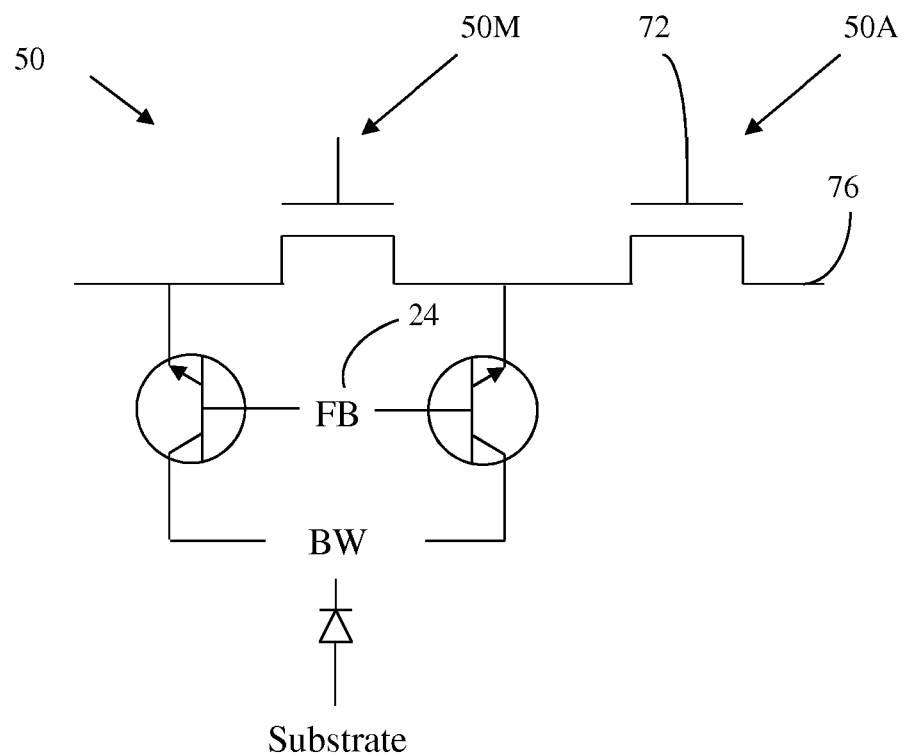
FIG. 1B schematically illustrates an equivalent circuit representation of the memory cell of FIG. 1A, where the memory device is a bi-stable floating body device, according to an embodiment of the present invention.

FIG. 1B illustrates a memory cell 50 according to an embodiment of the present invention, where memory device 50M is a bi-stable floating body device, for example as described in U.S. Patent Application Publication No. 2010/00246284 to Widjaja et al., titled "Semiconductor Memory Having Floating Body Transistor and Method of Operating" ("Widjaja-1"), U.S. Patent Application Publication No. 2010/0034041, "Method of Operating Semiconductor Memory Device with Floating Body Transistor Using Silicon Controlled Rectifier Principle" ("Widjaja-2"), U.S. Patent Application Publication No. 2012/0217549, "Asymmetric Semiconductor Memory Device Having Electrically Floating Body Transistor" ("Widjaja-3"), and U.S. patent application Ser. No. 13/746,523, "Memory Device Having Electrically Floating Body" ("Widjaja-4"), which are all hereby incorporated herein, in their entireties, by reference thereto), and where access device 50A is a metal-oxide-semiconductor (MOS) transistor.

Figure 2A:
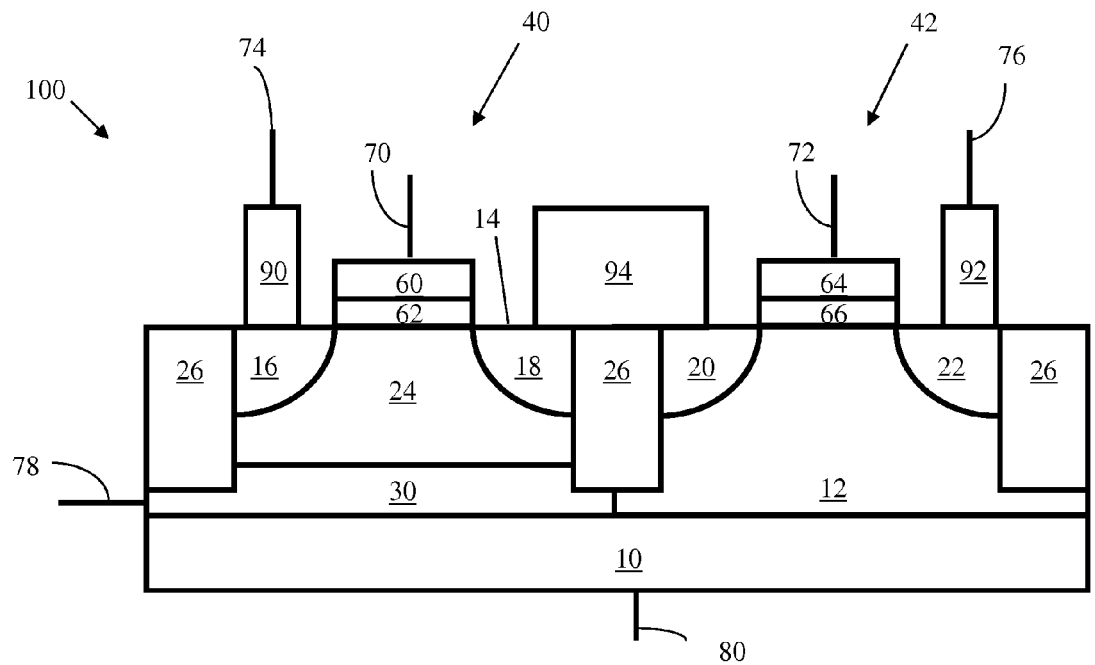
FIG. 2A is a schematic illustration of a memory cell according to the present invention.

A schematic cross-sectional view of a memory device 100 according to an embodiment of the present invention is shown in FIG. 2A. Memory device 100 comprises two transistors: transistor 40 having an electrically floating body 24 and access transistor 42. Memory cell 100 includes a substrate 10 of a first conductivity type such as p-type, for example. Substrate 10 is typically made of silicon, but may also comprise, for example, germanium, silicon germanium, gallium arsenide, carbon nanotubes, or other semiconductor materials. In some embodiments of the invention, substrate 10 can be the bulk material of the semiconductor wafer. In other embodiments, substrate 10 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate 10 will usually be drawn as the semiconductor bulk material as it is in FIG. 2A.

Floating body transistor 40 also comprises a buried layer region 30 of a second conductivity type, such as n-type, for example; a floating body region 24 of the first conductivity type, such as p-type, for example; and source/drain regions 16 and 18 of the second conductivity type, such as n-type, for example.

Buried layer 30 may be formed by an ion implantation process on the material of substrate 10. Alternatively, buried layer 30 can be grown epitaxially on top of substrate 10.

The floating body region 24 of the first conductivity type is bounded on top by surface 14, source line region 16, drain region 18, and insulating layer 62, on the sides by insulating layer 26, and on the bottom by buried layer 30. Floating body 24 may be the portion of the original substrate 10 above buried layer 30 if buried layer 30 is implanted. Alternatively, floating body 24 may be epitaxially grown. Depending on how buried layer 30 and floating body 24 are formed, floating body 24 may have the same doping as substrate 10 in some embodiments or a different doping, if desired in other embodiments.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Insulating layers 26 (like, for example, shallow trench isolation (STI)), may be made of silicon oxide, for example, though other insulating materials may be used. Insulating layers 26 insulate floating body transistor 40 from adjacent floating body transistor 40 and adjacent access transistor 42. The bottom of insulating layer 26 may reside inside the buried region 30 allowing buried region 30 to be continuous as shown in FIG. 2A. Alternatively, the bottom of insulating layer 26 may reside below the buried region 30 as shown in FIG. 2C. This requires a shallower insulating layer 28, which insulates the floating body region 24, but allows the buried layer 30 to be continuous in the perpendicular direction of the cross-sectional view shown in FIG. 2C. For simplicity, only memory cell 100 with continuous buried region 30 in all directions will be shown from hereon.

Access transistor 42 comprises a well region 12 of the first conductivity type, such as p-type, source region 20 and bit line region 22 of the second conductivity type, such as n-type. The well region 12 of the first conductivity type is electrically connected to the substrate region 10, and is therefore not floating. A gate 64 is positioned in between the source region 20 and the bit line region 22. The gate 64 is insulated from the well region 12 by an insulating layer 66. Insulating layer 66 may be made of silicon oxide and/or other dielectric materials, including high-K dielectric materials, such as, but not limited to, tantalum peroxide, titanium oxide, zirconium oxide, hafnium oxide, and/or aluminum oxide. The gate 64 may be made of, for example, polysilicon material or metal gate electrode, such as tungsten, tantalum, titanium and their nitrides.

The drain region 18 of the floating body transistor 40 is connected to the source region 20 of the access transistor 42 through a conductive element 94. Conductive element 90 connects the source line region 16 of the floating body transistor 40 (which may be referred to as the source line region 16 of the memory device 100 interchangeably) to the source line (SL) terminal 74, while conductive element 92 connects the bit line region 22 of the access transistor (which may be referred to as the bit line region 22 of the memory device 100 interchangeably) to the bit line (BL) terminal 76. The conductive elements 90, 92, and 94 may be formed of, but not limited to, tungsten or silicided silicon.

In addition to the SL terminal 74 and BL terminal 76, memory cell 100 also includes word line 1 (WL1) terminal 70, which is electrically connected to the gate 60 of the floating body transistor 40, word line 2 (WL2) terminal 72, which is electrically connected to the gate 64 of the access transistor 42, buried well (BW) terminal 78, which is electrically connected to the buried well region 30 of the floating body transistor 40, and substrate (SUB) terminal 80, which is connected to the substrate region 10.

Figure 2B:
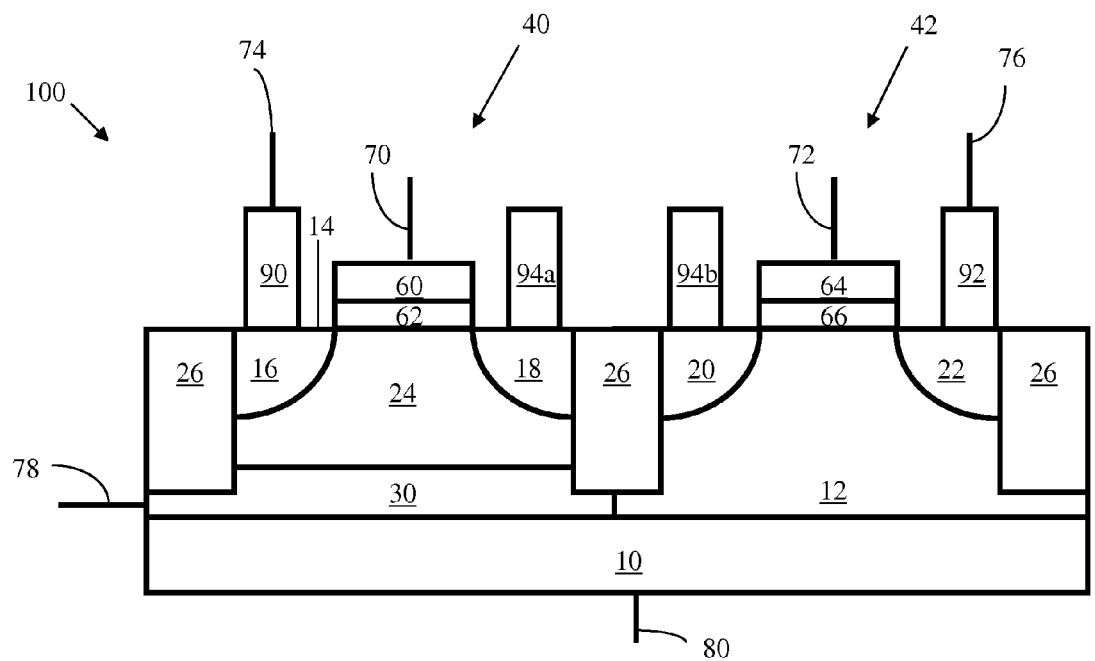
FIG. 2B is a schematic illustration of a memory cell in which the drain region of the floating body transistor and the source region of the access transistor are connected through separate conductive elements, according to another embodiment of the present invention.
Figure 2C:
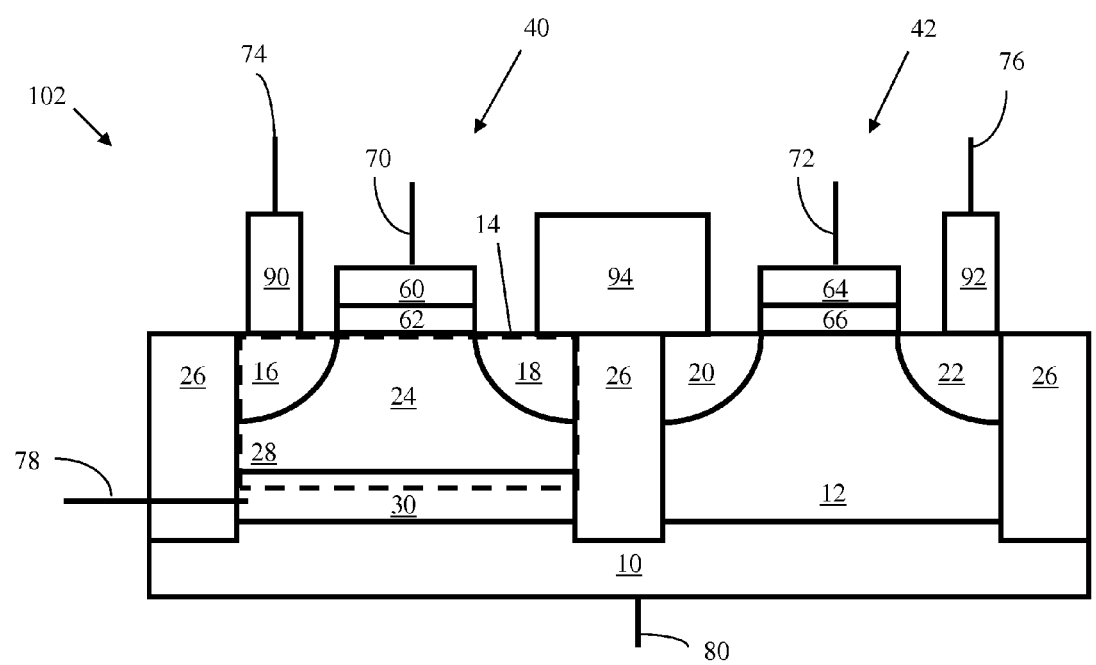
FIG. 2C is a schematic illustration of a memory cell according to an embodiment of the present invention.

In an alternative embodiment illustrated in FIG. 2B, the drain region 18 of the floating body transistor 40 and the source region 20 of the access transistor may be connected through separate conductive elements 94a and 94b, which may then be connected using another conducting material, such as aluminum or copper metal (not shown in FIG. 2B).

Figure 3A:
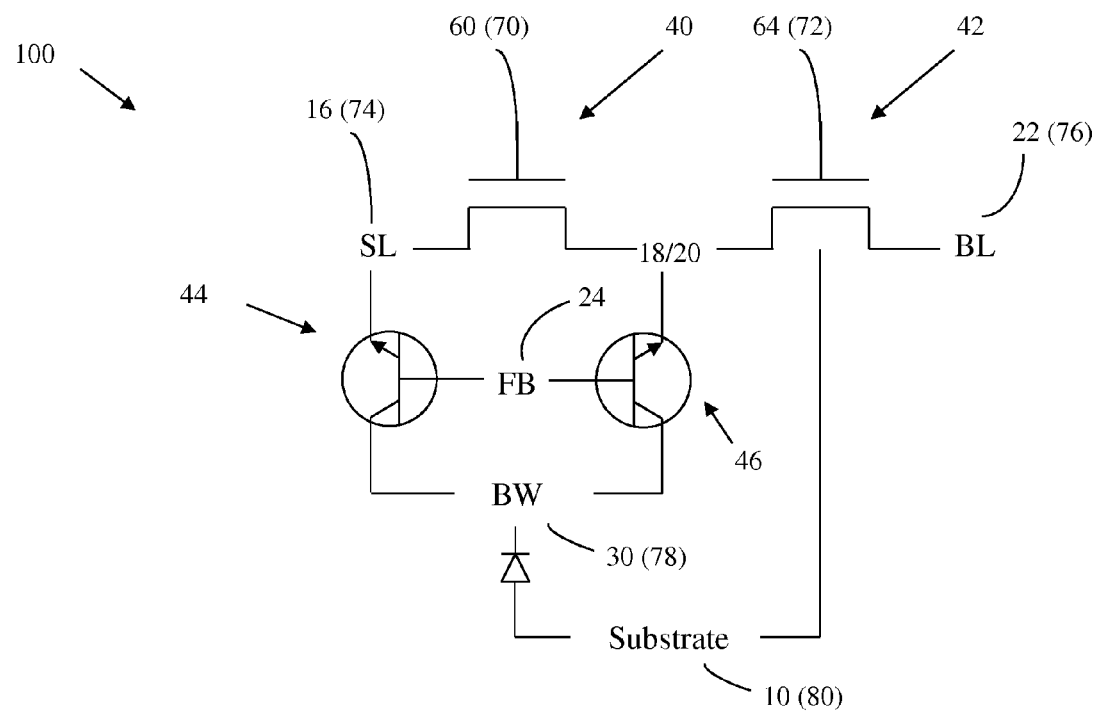
FIG. 3A is an equivalent circuit representation of a portion of a memory cell of FIG. 2A or FIG. 2B according to an embodiment of the present invention.

FIG. 3A illustrates the equivalent circuit representation of the memory device 100, showing the floating body transistor 40, formed by the source line region 16, drain region 18, and the gate 60, and access transistor 42, formed by the source region 20, the bit line region 22, and the gate 64, connected in series. Inherent in the floating body transistor 40 is bipolar device 44, formed by the buried well region 30, the floating body region 24, and the source line region 16, and bipolar device 46, formed by the buried well region 30, the floating body region 24, and the drain region 18.

Also inherent in floating body transistor 40 is bipolar device 48, formed by the source line region 16, floating body region 24, and the drain region 18. For drawings clarity, bipolar device 48 is shown separately in FIG. 3B.

Figure 4A:
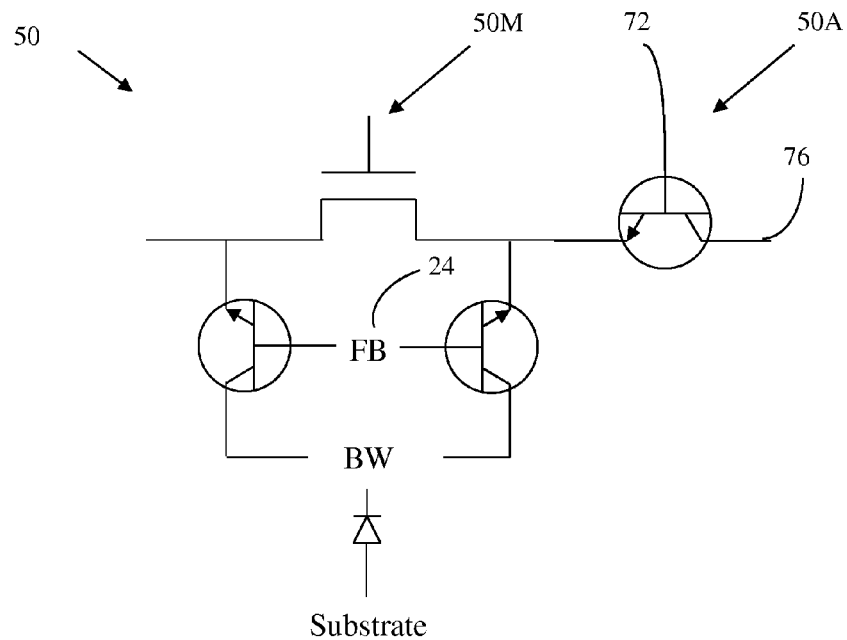
FIG. 4A schematically illustrates a memory cell according to another embodiment of the present invention.

FIG. 4A illustrates memory cell 50 according to another embodiment of the present invention, where memory device 50M is a bi-stable floating body device and access device 50A is a bipolar transistor.

Figure 4B:
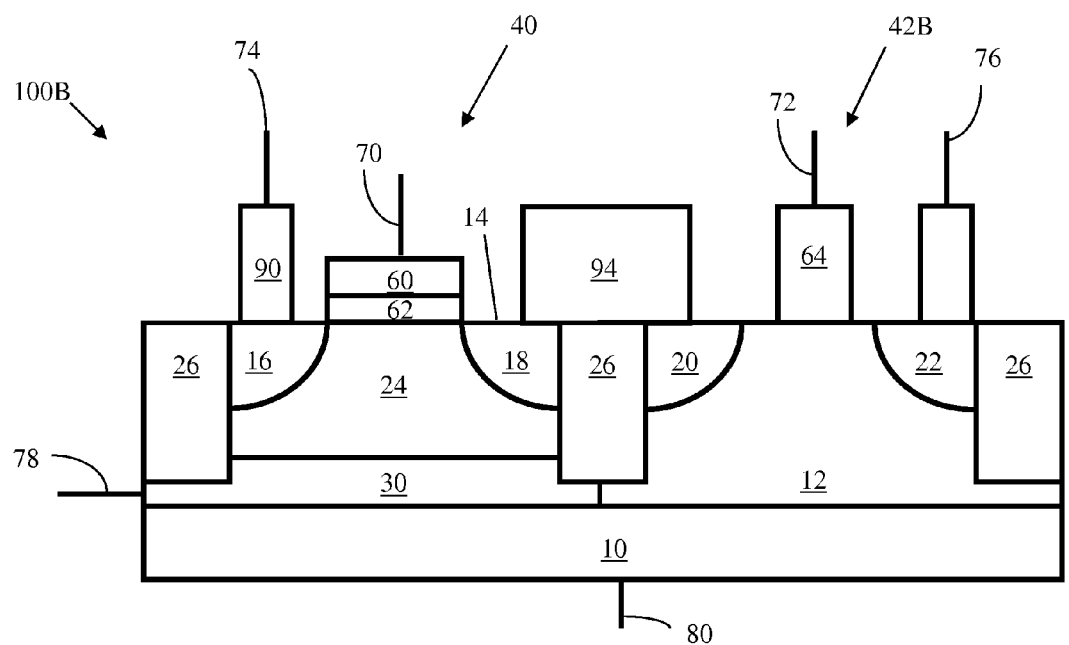
FIG. 4B schematically illustrates a cross-sectional view of a memory cell, where the access device is a bipolar transistor of the type described with regard to FIG. 4A, according to an embodiment of the present invention.

FIG. 4B illustrates a schematic cross-sectional view of memory cell 100B, which is an exemplary implementation of memory cell 50 described in FIG. 4A. In the exemplary memory cell 100B, the state of the memory cell 100B is stored in the floating body transistor 40 (which corresponds to the memory device 50M in FIG. 4A) and the bipolar transistor 42B functions as the access device (which corresponds to the access device 50A in FIG. 4A). Bipolar transistor 42B (a specific embodiment of the generic representation of transistor 50A in FIG. 4A and more generally the access transistor 50A in FIG. 1A), formed by the source region 20, the well region 12, and the drain region 22, serves as the access device of the memory cell 100B. The gate electrode 64 (connected to the WL2 terminal 72) is not insulated from the well region 12, and serves as the base terminal of the bipolar transistor 42B.

Figure 3B:
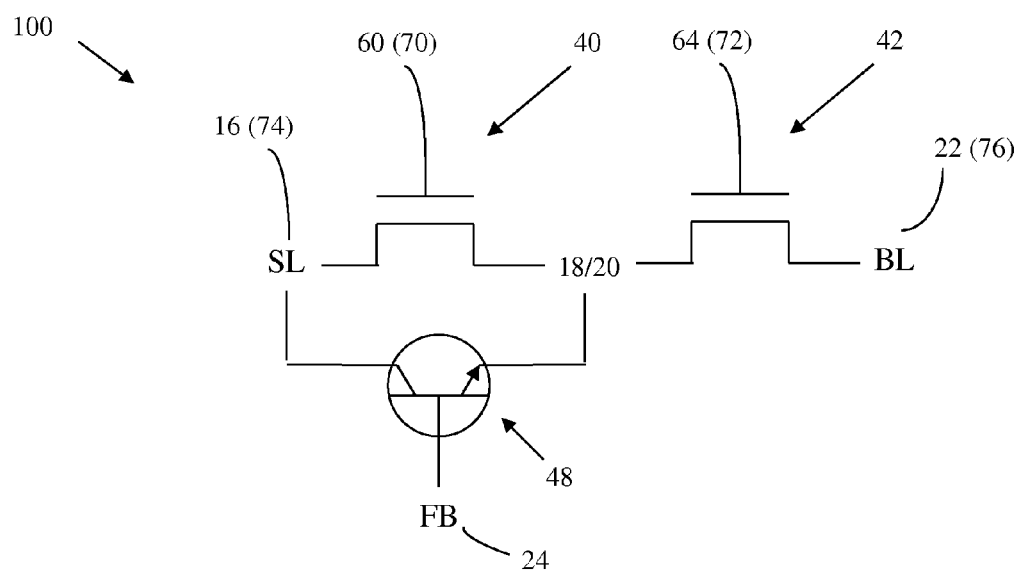
FIG. 3B is an equivalent circuit representation of a bipolar device of the floating body transistor of FIG. 2A or 2B, formed by the source line region, floating body region, and the drain region, according to an embodiment of the present invention.

A memory array comprising a plurality of the memory cells 100 as illustrated in FIGS. 3A-3B (as an exemplary implementation of memory cell 50 shown in FIG. 1A) along with the memory cells operation will be described. For simplicity, most of the descriptions that follow will use a MOS transistor as an example of the access device 50A. However, it should be understood that the operations of the memory cells 50 using a bipolar transistor as the access device follows the same principles.

Figure 5:
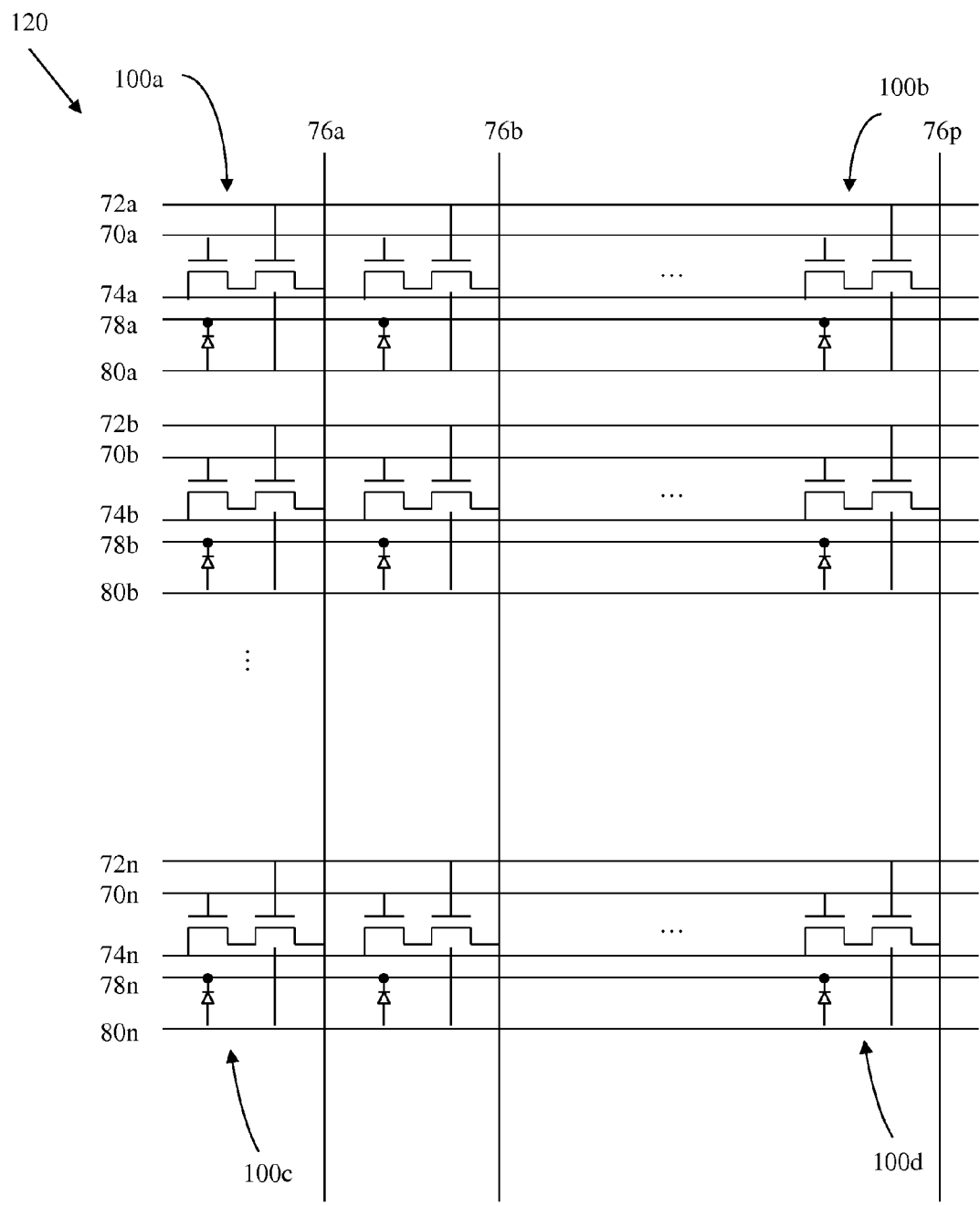
FIG. 5 schematically illustrates multiple cells of the type shown in FIGS. 3A-3B joined to make a memory array, according to an embodiment of the present invention.

FIG. 5 shows an exemplary memory array 120 of memory cells 100 (including four exemplary instances of memory cell 100 being labeled as 100a, 100b, 100c, and 100d) arranged in rows and columns. In many, but not all, of the figures where exemplary array 120 appears, representative memory cell 100a will be representative of a "selected" memory cell 100 when the operation being described has one (or more in some embodiments) selected memory cells 100. In such figures, representative memory cell 100b will be representative of an unselected memory cell 100 sharing the same row as selected representative memory cell 100a, representative memory cell 100c will be representative of an unselected memory cell 100 sharing the same column as selected representative memory cell 100a, and representative memory cell 100d will be representative of a memory cell 100 sharing neither a row or a column with selected representative memory cell 100a.

Present in FIG. 5 are WL1 terminals 70a through 70n, WL2 terminals 72a through 72n, SL terminals 74a through 74n, BW terminals 78a through 78n, SUB terminals 80a through 80n, and BL terminals 76a through 76p. Each of the WL1, WL2, SL, and BW terminals are shown associated with a single row of memory cells 100 and each of the BL terminals 76 is associated with a single column of memory cells 100. Persons of ordinary skill in the art will appreciate that many other organizations and layouts of memory array 120 are possible, for example, only one common SUB terminal 80 is present throughout a segment of the memory array 120 or throughout the entire memory array 120. Similarly, other terminals may be segmented or buffered, while control circuits such as word decoders, column decoders, segmentation devices, sense amplifiers, write amplifiers, etc., may be arrayed around array 120 or inserted between sub-arrays of array 120. Thus the exemplary embodiments, features, design options, etc., described are not limiting in any way.

Figure 6:
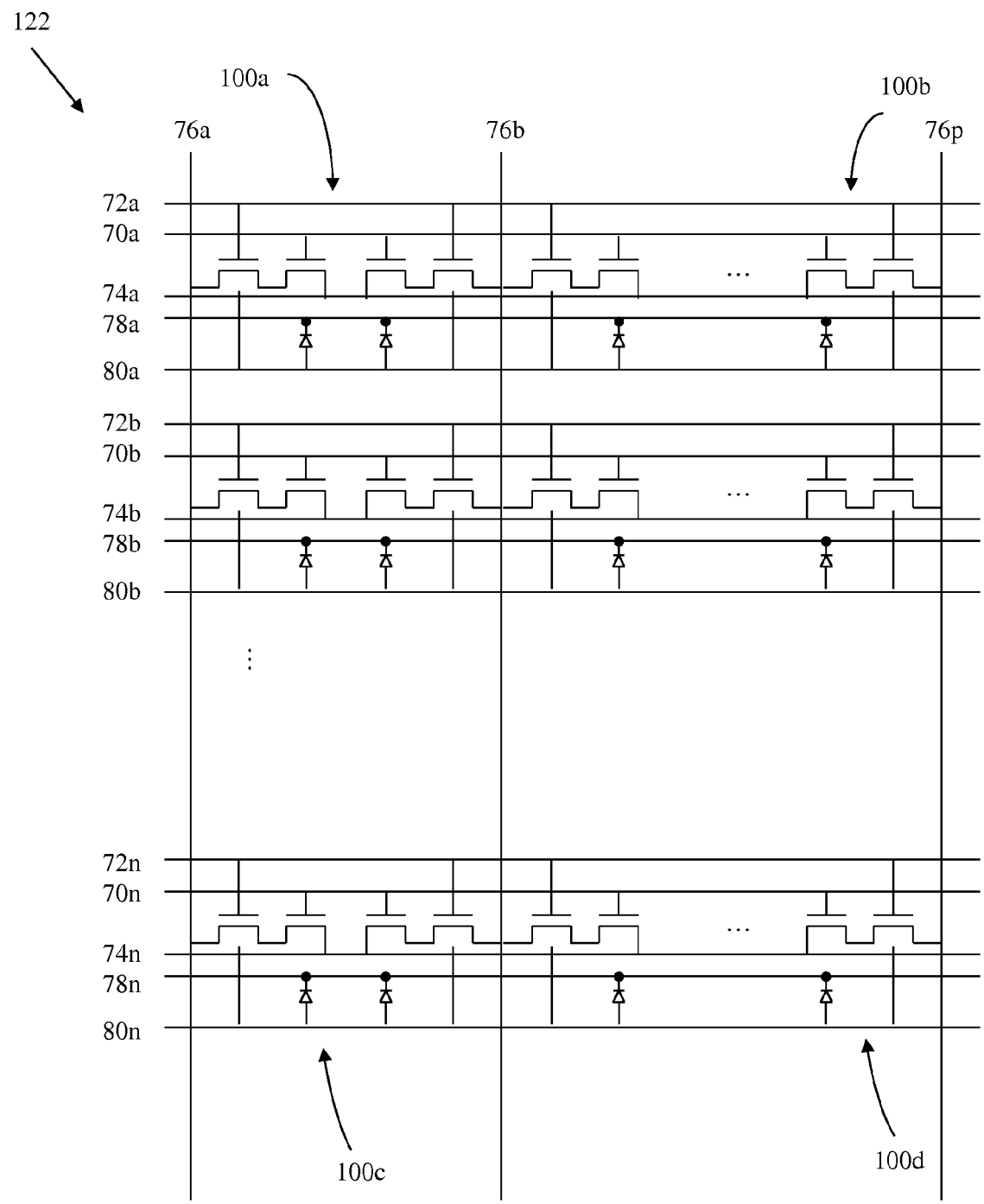
FIG. 6 schematically illustrates multiple cells of the type shown in FIGS. 3A-3B joined to make a memory array according to another embodiment of the present invention.

FIG. 6 shows an alternative array 122 where memory cells 100 are laid out in mirror configuration, where the source line region 16 (connected to the SL terminals 74) of one memory cell 100 is adjacent to a source line region 16 of a neighboring cell 100 with the bit line region 22 (connected to the BL terminals 76) being adjacent to the bit line region 22 of another neighboring cell 100, according to an embodiment of the present invention.

Several operations can be performed to memory cell 100, such as: holding, read, write logic-1 and write logic-0 operations.

Figure 7:
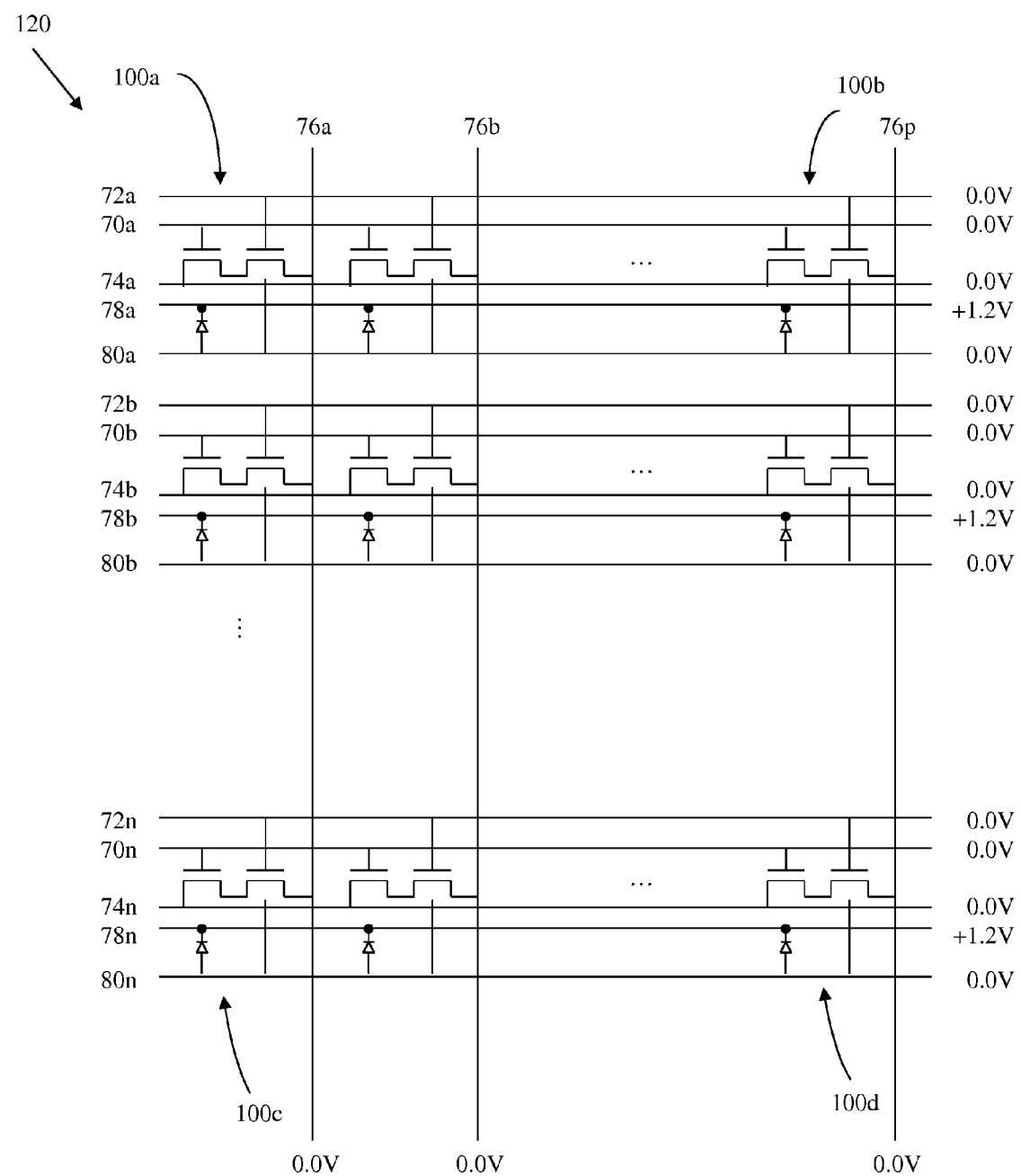
FIG. 7 schematically illustrates a holding operation performed on a memory array according to an embodiment of the present invention.
Figure 8:
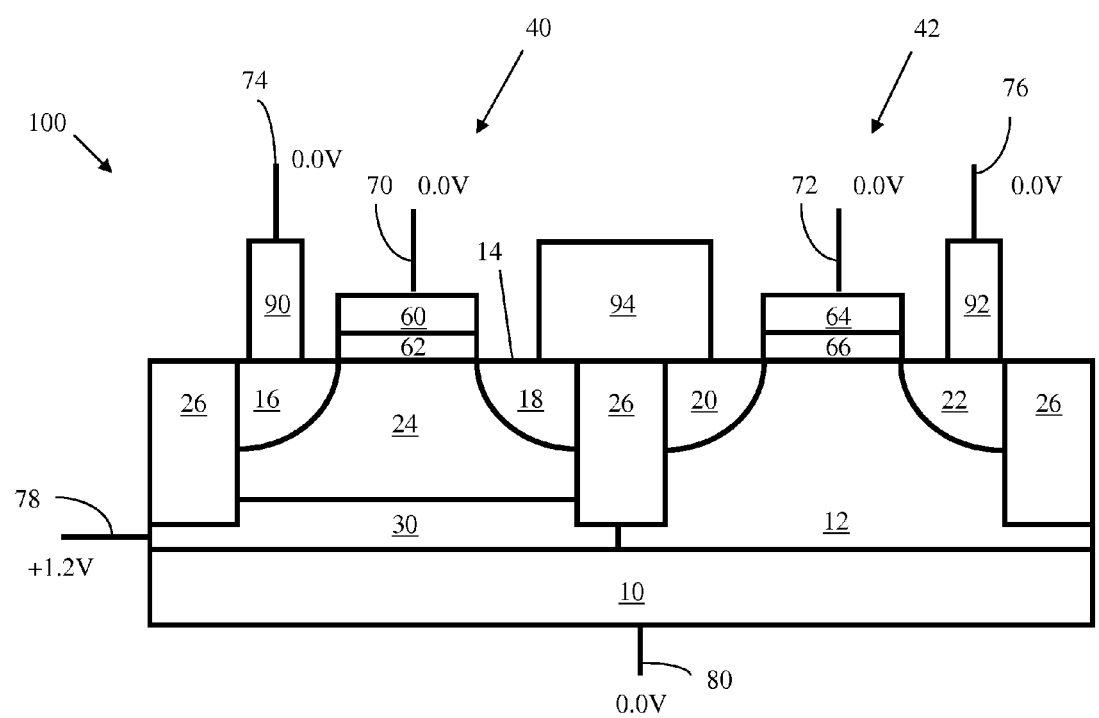
FIG. 8 illustrates exemplary bias conditions applied on the terminals of a memory cell of the array of FIG. 7.

FIGS. 7 and 8 illustrate a holding operation being performed on memory array 120 and on a selected memory cell 100, respectively. The holding operation is performed by applying a positive back bias to the BW terminal 78, zero or low negative bias on the WL1 terminal 70 and WL2 terminal 72 to turn-off the channel regions of the floating body transistor 40 and the access transistor 42, and zero bias on the SL terminal 74, SUB terminal 80, and BL terminal 76. The positive back bias applied to the buried layer region 30 connected to the BW terminal 78 will maintain the state of the memory cell 100 that it is connected to by maintaining the charge stored in the floating body region 24 of the corresponding floating body transistor 40.

In one embodiment the bias conditions for the holding operation for memory cell 100 are: 0.0 volts is applied to WL1 terminal 70, WL2 terminal 72, SL terminal 74, BL terminal 76, and SUB terminal 78, and a positive voltage like, for example, +1.2 volts is applied to BW terminal 78. In other embodiments, different voltages may be applied to the various terminals of memory cell 100 as a matter of design choice and the exemplary voltages described are not limiting in any way.

Figure 9A:
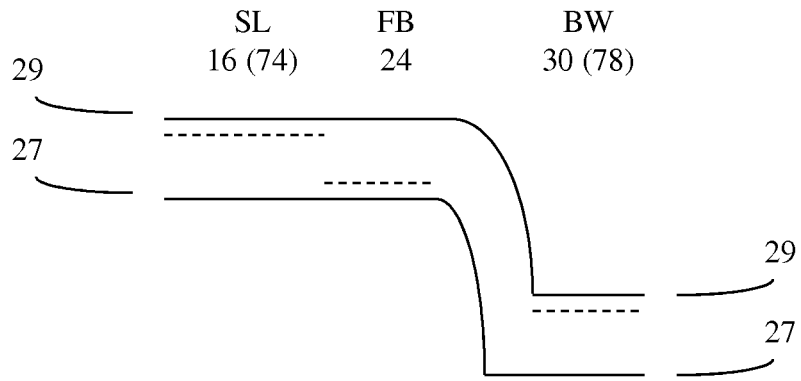
FIG. 9A shows an energy band diagram characterizing an intrinsic bipolar device when a floating body region is positively charged and a positive bias is applied to a buried well region of a memory cell according to an embodiment of the present invention.
Figure 9B:
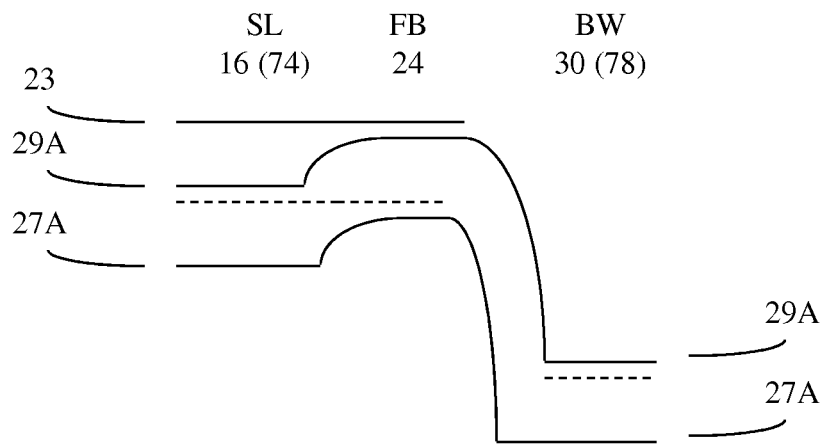
FIG. 9B shows an energy band diagram of an intrinsic bipolar device when a floating body region is neutrally charged and a positive bias is applied to a buried well region of a memory cell according to an embodiment of the present invention.

From the equivalent circuit representation of memory cell 100 shown in FIG. 3, inherent in the floating body transistor 40 of the memory cell 100 are bipolar devices 44 and 46, with the band diagram of the bipolar device 44 shown in FIGS. 9A and 9B.

FIG. 9A shows the band diagram of the bipolar device 44 when the floating body region 24 is positively charged and a positive bias is applied to the buried region 30. The energy band diagram of the bipolar device 46 is similar to the one shown in FIG. 9A, with the drain region 18 replacing the source line region 16. The dashed lines indicate the Fermi levels in the various regions of the bipolar device 44. The Fermi level is located in the band gap between the solid line 27 indicating the top of the valence band (the bottom of the band gap) and the solid line 29 indicating the bottom of the conduction band (the top of the band gap) as is well known in the art. If floating body 24 is positively charged, a state corresponding to logic-1, the bipolar transistors 44 and 46 will be turned on as the positive charge in the floating body region lowers the energy barrier of electron flow into the base region. Once injected into the floating body region 24, the electrons will be swept into the buried well region 30 (connected to BW terminal 78) due to the positive bias applied to the buried well region 30. As a result of the positive bias, the electrons are accelerated and create additional hot carriers (hot hole and hot electron pairs) through an impact ionization mechanism. The resulting hot electrons flow into the BW terminal 78 while the resulting hot holes will subsequently flow into the floating body region 24. When the following condition is met: $\beta \times (M-1) \approx 1$—where $\beta$ is the forward common-emitter current gain of the bipolar transistor 44 or 46 and M is the impact ionization coefficient—the amount of holes injected into the floating body region 24 compensates for the charge lost due to p-n junction forward bias current between the floating body region 24 and the source line region 16 or bit line region 18 and due to holes recombination. As a result of a positive-feedback mechanism, this process maintains the charge (i.e. holes) stored in the floating body region 24 which will keep the n-p-n bipolar transistors 44 and 46 on for as long as a positive bias is applied to the buried well region 22 through BW terminal 78.

The region where the product $\beta \times (M-1)$ approaches 1 and is characterized by hole current moving into the base region of a bipolar transistor is sometimes referred to as the reverse base current region and has been described for example in "A New Static Memory Cell Based on Reverse Base Current (RBC) Effect of Bipolar Transistor", K. Sakui et al., pp. 44-47, International Electron Devices Meeting, 1988 ("Sakui-1"), "A New Static Memory Cell Based on the Reverse Base Current Effect of Bipolar Transistors", K. Sakui et al., pp. 1215-1217, IEEE Transactions on Electron Devices, vol. 36, no. 6, June 1989 ("Sakui-2"), "On Bistable Behavior and Open-Base Breakdown of Bipolar Transistors in the Avalanche Regime—Modeling and Applications", M. Reisch, pp. 1398-1409, IEEE Transactions on Electron Devices, vol. 39, no. 6, June 1992 ("Reisch"), which are hereby incorporated herein, in their entireties, by reference thereto.

The latching behavior based on the reverse base current region has also been described in a biristor (i.e. bi-stable resistor) for example in "Bistable resistor (Biristor)—Gateless Silicon Nanowire Memory", J.-W. Han and Y.-K. Choi, pp. 171-172, 2010 Symposium on VLSI Technology, Digest of Technical Papers, 2010 ("J.-W. Han"), which is hereby incorporated herein, in its entirety, by reference thereto. In a two-terminal biristor device, a refresh operation is still required. J.-W. Han describes a 200 ms data retention for the silicon nanowire biristor memory. In memory cell 100, the state of the memory cell is maintained due to the vertical bipolar transistors 44 and 46, while the remaining cell operations (i.e. read and write operations) are governed by the lateral bipolar transistor 48 and MOS transistor 40. Hence, the holding operation does not require any interruptions to the memory cell 100 access.

If floating body 24 is neutrally charged (the voltage on floating body 24 being equal to the voltage on grounded source line region 16), a state corresponding to logic-0, no current will flow through bipolar transistors 44 and 46. The bipolar devices 44 and 46 will remain off and no impact ionization occurs. Consequently memory cells in the logic-0 state will remain in the logic-0 state.

FIG. 9B shows the energy band diagram of the intrinsic bipolar device 44 when the floating body region 24 is neutrally charged and a bias voltage is applied to the buried well region 30. In this state the energy level of the band gap bounded by solid lines 27A and 29A is different in the various regions of bipolar device 44. Because the potential of the floating body region 24 and the source line region 16 is equal, the Fermi levels are constant, resulting in an energy barrier between the source line region 16 and the floating body region 24. Solid line 23 indicates, for reference purposes, the energy barrier between the source line region 16 and the floating body region 24. The energy barrier prevents electron flow from the source line region 16 (connected to SL terminal 74) to the floating body region 24. Thus the bipolar device 44 will remain off.

An autonomous refresh for a floating body memory, without requiring to first read the memory cell state, has been described for example in "Autonomous Refresh of Floating Body Cell (FBC)", Ohsawa et al., pp. 801-804, International Electron Device Meeting, 2008 ("Ohsawa"), U.S. Pat. No. 7,170,807 "Data Storage Device and Refreshing Method for Use with Such Device", Fazan et al. ("Fazan"), which are hereby incorporated herein, in their entireties, by reference thereto. Ohsawa and Fazan teach an autonomous refresh method by applying periodic gate and drain voltage pulses, which interrupt access to the memory cells being refreshed. In memory cell 100, more than one stable state is achieved because of the vertical bipolar transistors 44 and 46. The read and write operations of the memory cell 100 are governed by the lateral bipolar transistor 48 and MOS transistor 40. Hence, the holding operation does not require any interruptions to the memory cell 100 access.

In the holding operation described in FIG. 7, there is no individually selected memory cell. Rather cells are selected in rows by the buried well terminals 78a through 78n and may be selected as individual rows, as multiple rows, or as all of the rows comprising array 120.

Figure 9C:
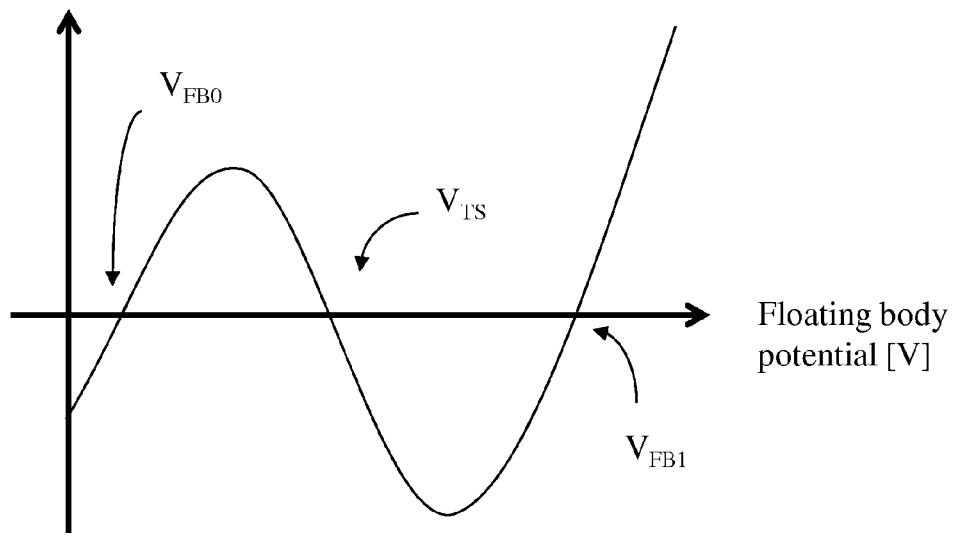
FIG. 9C shows a graph of the net current I flowing into or out of a floating body region as a function of the potential V of the floating body, according to an embodiment of the present invention.

FIG. 9C shows a graph of the net current I flowing into or out of the floating body region 24 as a function of the potential V of the floating body 24 (not drawn to scale). A negative current indicates a net current flowing into the floating body region 24, while a positive current indicates a net current flowing out of the floating body region 24. At low floating body 24 potential, between 0V and $V_{FB0}$ indicated in FIG. 9C, the net current is flowing into the floating body region 24 as a result of the p-n diode formed by the floating body region 24 and the buried well region 30 being reverse biased. If the value of the floating body 24 potential is between $V_{FB0}$ and $V_{TS}$, the current will switch direction, resulting in a net current flowing out of the floating body region 24. This is because of the p-n diode, formed by the floating body region 24 and the buried well region 30, being forward biased as the floating body region 24 becomes increasingly more positive. As a result, if the potential of the floating body region 24 is less than $V_{TS}$, then at steady state the floating body region 24 will reach $V_{FB0}$. If the potential of the floating body region 24 is higher than $V_{TS}$, the current will switch direction, resulting in a net current flowing into the floating body region 24. This is as a result of the base current flowing into the floating body region 24 being greater than the p-n diode leakage current. When the floating body 24 potential is higher than $V_{FB1}$, the net current will be out of the floating body region 24. This is because the p-n diode leakage current is once again greater than the base current of the bipolar devices 44 and 46.

Figure 9D:
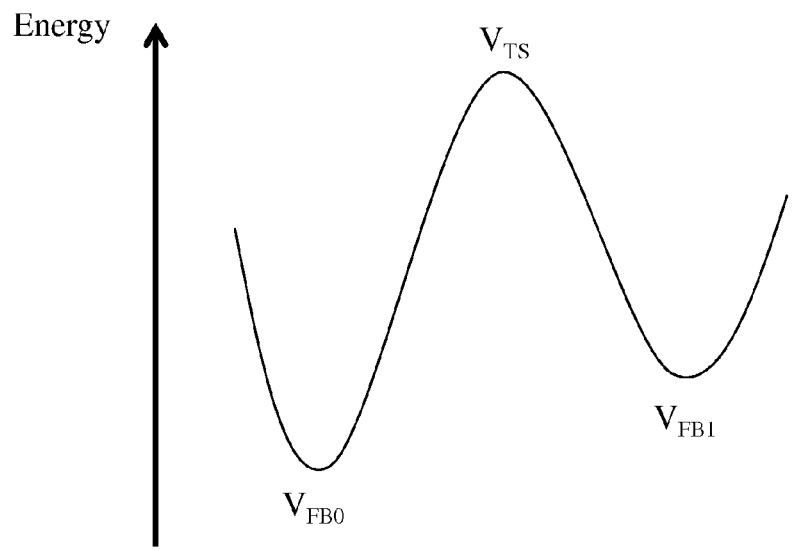
FIG. 9D shows a schematic curve of a potential energy surface (PES) of a memory cell according to an embodiment of the present invention.

The holding operation results in the floating body memory cell having two stable states: the logic-0 state and the logic-1 state separated by an energy barrier, which are represented by $V_{FB0}$, $V_{FB1}$, and $V_{TS}$, respectively. FIG. 9D shows a schematic curve of a potential energy surface (PES) of the memory cell 100, which shows another representation of the two stable states resulting from applying a back bias to the BW terminal 78 (connected to the buried well region 30).

The values of the floating body 24 potential where the current changes direction, i.e. $V_{FB0}$, $V_{FB1}$, and $V_{TS}$, can be modulated by the potential applied to the BW terminal 78. These values are also temperature dependent.

Figure 9E:
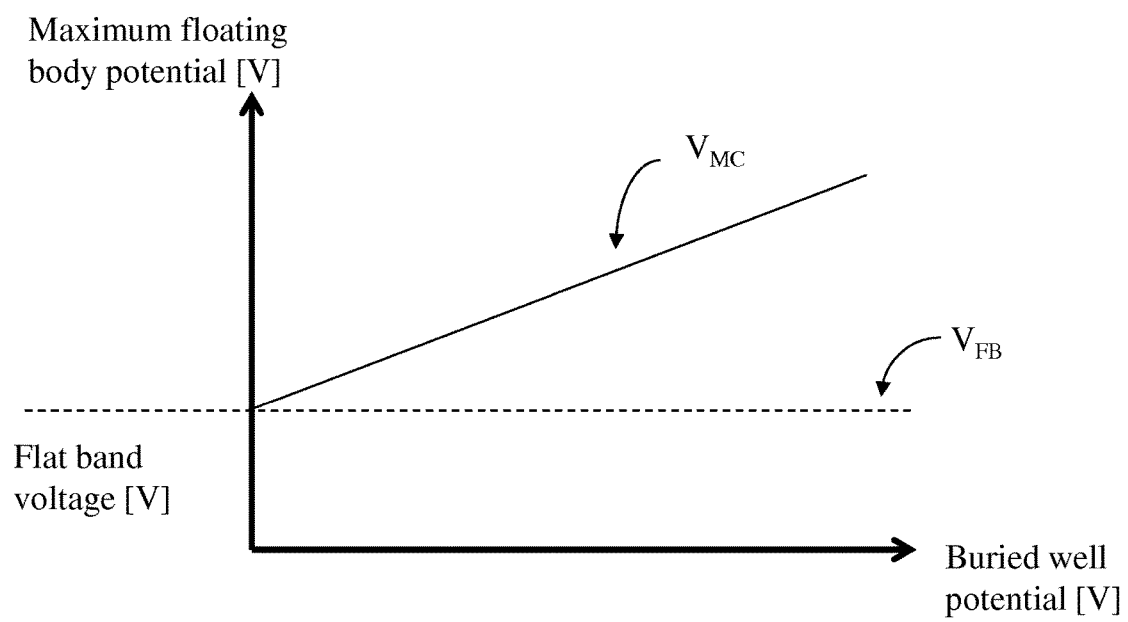
FIG. 9E illustrates a charge stored in a floating body region of a memory cell as a function of a potential applied to a buried well region, connected to a BW terminal, according to an embodiment of the present invention.

The holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current to regions 16 and 18 increases exponentially at floating body potential greater than $V_{FB}$. However, by applying a positive voltage to BW terminal 78, the bipolar action results in a hole current flowing into the floating body 24, compensating for the junction leakage current between floating body 24 and regions 16 and 18. As a result, the maximum charge $V_{MC}$ stored in floating body 24 can be increased by applying a positive bias to the BW terminal 78 as shown in FIG. 9E. The increase in the maximum charge stored in the floating body 24 results in a larger memory window.

Floating body DRAM cells described in Ranica-1, Ranica-2, Villaret, and Pulicani only exhibit one stable state, which is often assigned as logic-0 state. Villaret describes the intrinsic bipolar transistors enhance the data retention of logic-1 state, by drawing the electrons which otherwise would recombine with the holes stored in the floating body region. However, only one stable state is observed because there is no hole injection into the floating body region to compensate for the charge leakage and recombination.

Figure 10:
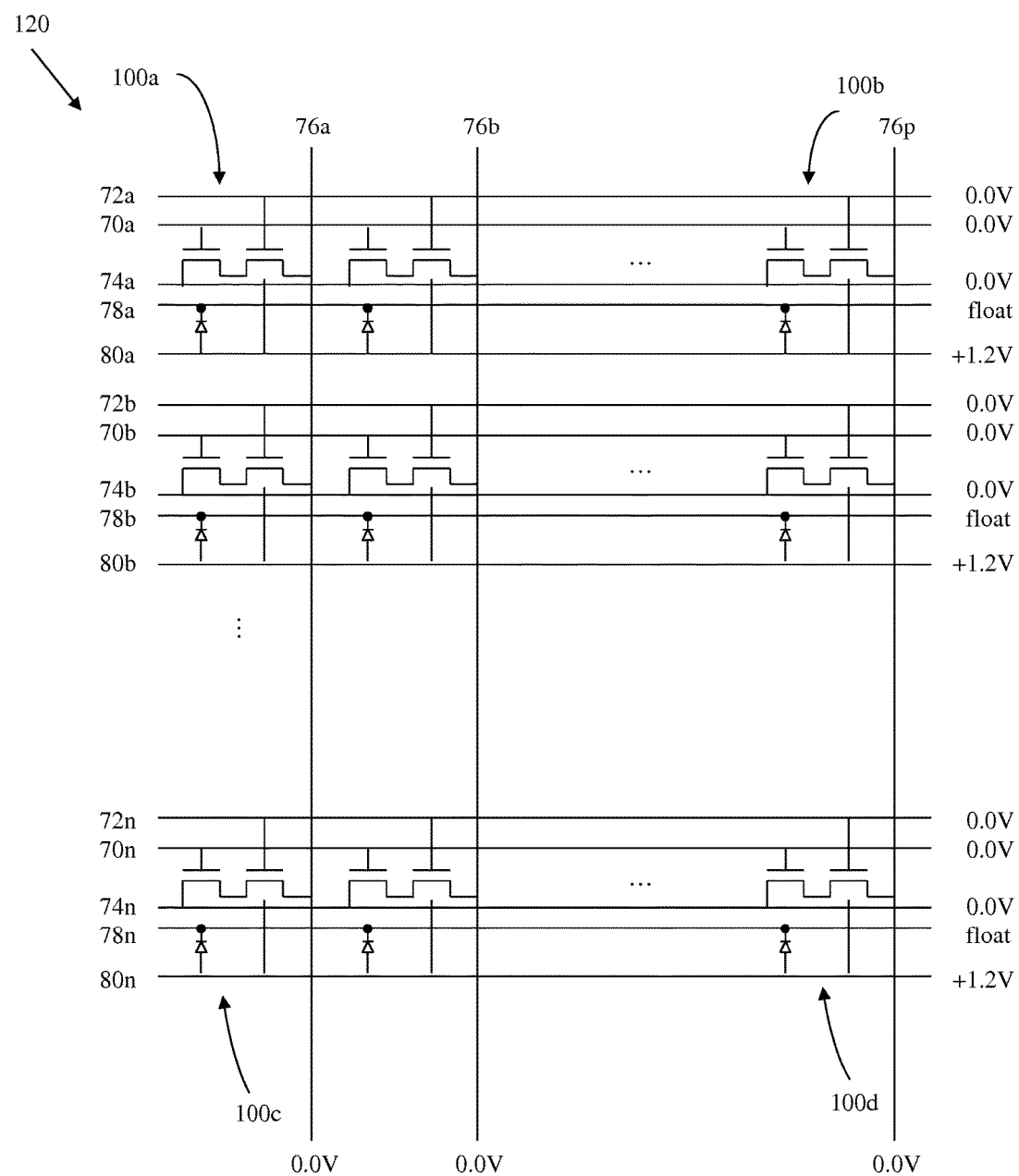
FIG. 10 schematically illustrates an alternative holding operation performed on a memory array according to an embodiment of the present invention.
Figure 11:
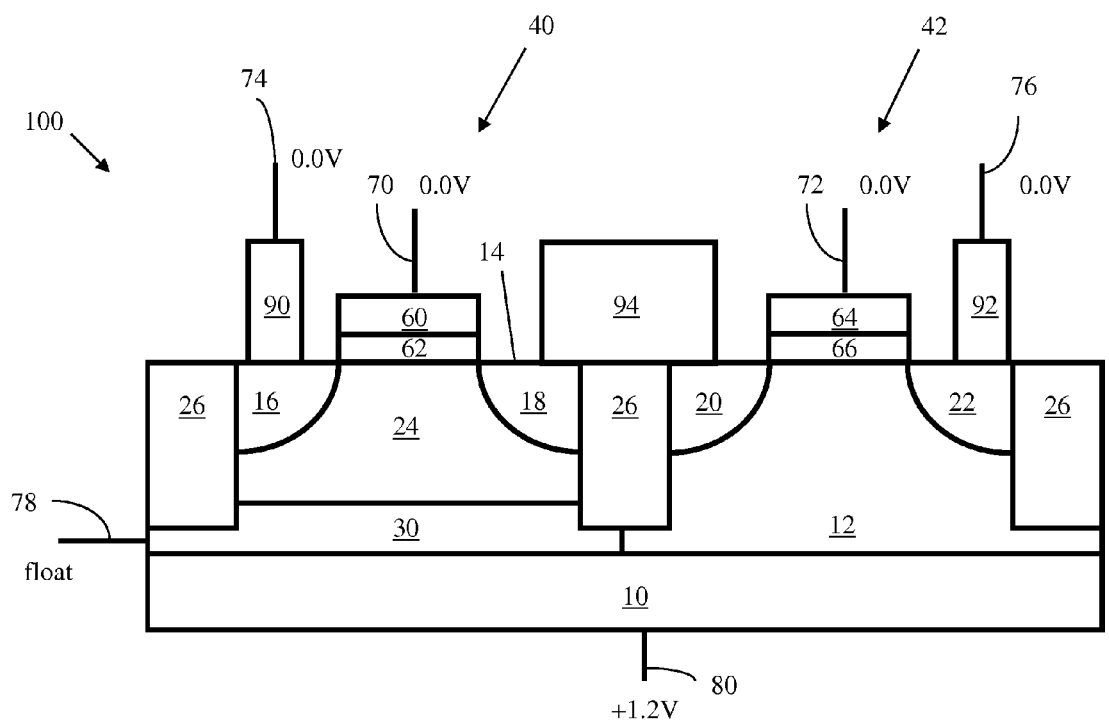
FIG. 11 illustrates exemplary bias conditions applied on the terminals of a memory cell of the array of FIG. 10.

FIGS. 10 and 11 illustrate an alternative holding operation performed on memory array 120 and a selected memory cell 100, respectively. The holding operation is performed by applying a positive back bias to the SUB terminal 80, zero or small negative bias on the WL1 terminal 70 and WL2 terminal 72 to turn-off the channel of the floating body transistor 40 and the access transistor 42, zero bias on SL terminal 74, BL terminal 76, while leaving the BW terminal 78 floating. Under these conditions, if the memory cell 100 is in logic-1 state having a positive charge stored in the floating body region 24, the intrinsic silicon controlled rectifier (SCR) of memory cell 100, formed by the substrate 10, buried well region 30, floating body region 24, and the source line region 16 or the drain region 18, is turned on, thereby maintaining the positive charge on the floating body region 24. Memory cells in logic-0 state will remain in blocking mode, since the voltage of the floating body region 24 is not substantially positive and therefore floating body 24 does not turn on the SCR device. Accordingly, current does not flow through the SCR device and memory cell 100 maintains the logic-0 state. In this holding operation, all memory cells 100 commonly connected to the same SUB terminal will be maintained to accurately hold their data states.

In one embodiment, the following bias conditions are applied for the alternative holding operation: 0.0 volts is applied to WL1 terminal 70, WL2 terminal 72, SL2 terminal 74, BL terminal 76; a positive voltage like, for example, +1.2 volts is applied to SUB terminal 80; while the BW terminal 78 is left floating. In other embodiments, different voltages may be applied to the various terminals of memory cell 100 as a matter of design choice and the exemplary voltages described are not limiting in any way. Alternatively, the BW terminal 78 may be eliminated from the array 120, leaving the buried well region 30 floating.

Applications of the back bias, either through the BW terminal 78 as shown in FIGS. 7 and 8, or to the SUB terminal 80 as shown in FIGS. 10 and 11, result in two stable floating body 24 states (for example as described in Widjaja-1, Widjaja-2, Widjaja-3, and Widjaja-4). A bistable behavior of bipolar transistors has also been described for example in "Bistable Behavior and Open-Base Breakdown of Bipolar Transistors", M. Reisch, pp. 1398-1409, IEEE Transactions on Electron Devices, vol. 39, no. 6, June 1992 ("Reisch"), which is hereby incorporated herein, in its entirety by reference thereto. Reisch and Sakui both describe a double-poly BiCMOS SRAM cell, which employs one bipolar transistor and one MOS transistor. This in contrast with where a floating body transistor operates as a capacitorless DRAM, with only one stable floating body 24 state in a memory cell (for example as described in "A Capacitor-less 1T-DRAM Cell", S. Okhonin et al., pp. 85-87, IEEE Electron Device Letters, vol. 23, no. 2, February 2002 ("Okhonin-1"), "Memory Design Using One-Transistor Gain Cell on SOI", T. Ohsawa et al., pp. 152-153, Tech. Digest, 2002 IEEE International Solid-State Circuits Conference, February 2002 ("Ohsawa-1"), "Further Insight Into the Physics and Modeling of Floating-Body Capacitorless DRAMs", A. Villaret et al., pp. 2447-2454, IEEE Transactions on Electron Devices, vol. 52, no. 11, November 2005 ("Villaret"), "Scaled 1T-Bulk Devices Built with CMOS 90 nm Technology for Low-cost eDRAM Applications", R. Ranica, et al., pp. 38-41, Tech. Digest, Symposium on VLSI Technology, 2005 ("Ranica"), and "Simulation of Intrinsic Bipolar Transistor Mechanisms for future capacitor-less eDRAM on bulk substrate", R. Pulicani et al., pp. 966-969, 2010 17th IEEE International Conference on Electronics, Circuits, and Systems, December 2010 ("Pulicani"), which are hereby incorporated herein, in their entireties, by reference thereto).

Figure 12:
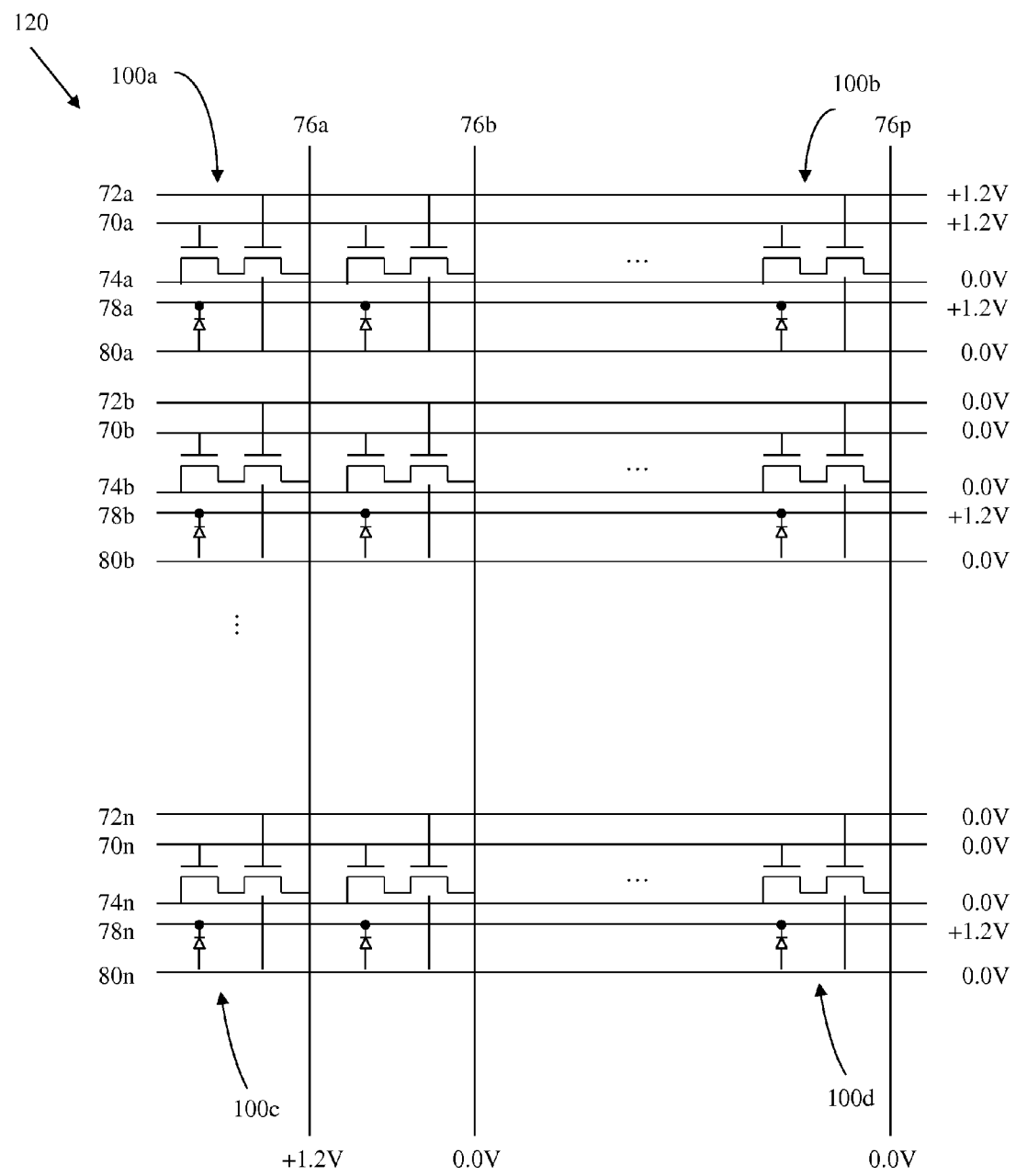
FIG. 12 schematically illustrates a read operation performed on a memory array according to an embodiment of the present invention.
Figure 13:
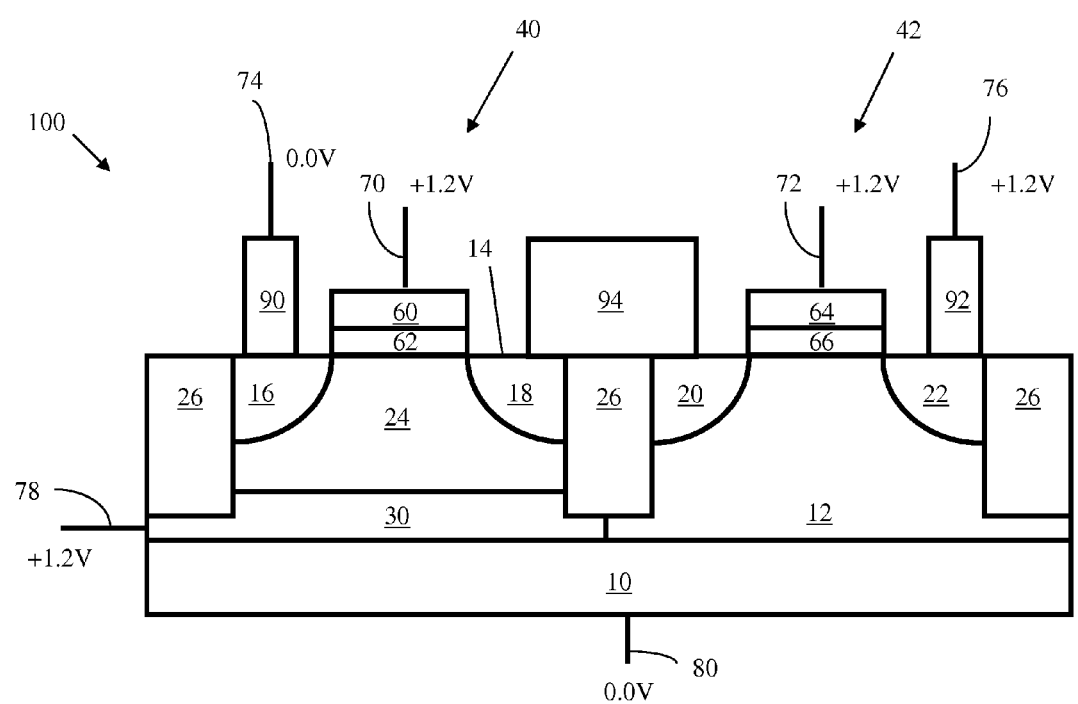
FIG. 13 illustrates bias conditions applied on the terminals of a memory cell to perform a read operation.

The read operation of the memory cell 100 and array 120 will be described in conjunction with FIGS. 12 and 13. Any sensing scheme known in the art can be used with memory cell 100. The amount of charge stored in the floating body 24 can be sensed by monitoring the cell current of the memory cell 100. If memory cell 100 is in a logic-1 state having holes in the body region 24, then the memory cell will have a higher cell current (e.g. current flowing from the BL terminal 76 to SL terminal 74), compared to if cell 100 is in a logic-0 state having no holes in floating body region 24. A sensing circuit typically connected to BL terminal 76 can then be used to determine the data state of the memory cell.

A read operation for example can be performed on memory cell 100 by applying the following bias conditions. A positive voltage is applied to the WL2 terminal 72, which turns on the access transistor 42, a positive voltage is applied to the BL terminal 76, zero voltage is applied to the SL terminal 74, zero or positive voltage is applied to the BW terminal 78, and zero voltage is applied to the SUB terminal 80. Positive voltage may also be applied to the WL1 terminal 70 to further enhance the current flowing through the memory cell 100, from the BL terminal 76 to the SL terminal 74. If memory cell 100 is in a logic-1 state having holes in the floating body region 24, then a higher current will flow from the BL terminal 76 to the SL terminal 74 of the selected memory cell 100, compared to if memory cell 100 is in a logic-0 state having no holes in the floating body region 24. In one particular embodiment, +1.2 volts is applied to the WL1 terminal 70, WL2 terminal 72, BL terminal 76, BW terminal 78, 0.0 volts is applied to the SL terminal 74 and SUB terminal 80. In other embodiments, different voltages may be applied to the various terminals of memory cell 100 as a matter of design choice and the exemplary voltages described are not limiting in any way.

The access transistor 42 is used to assist the selection of the memory cell 100 during a read operation. Because the access transistor 42 of the unselected memory cells in different rows (e.g. memory cells 100c and 100d) are turned off, it will not pass the positive voltage applied to the BL terminal 76 to the drain region 18 of the floating body transistor 40. As a result, no current will flow through the floating body transistor 40 of the unselected memory cells in different rows.

The unselected memory cells in different columns (e.g. memory cells 100*b* and 100*d*) will not conduct current since zero bias is applied to both the BL terminal 76 and SL terminal 74.

Figure 14:
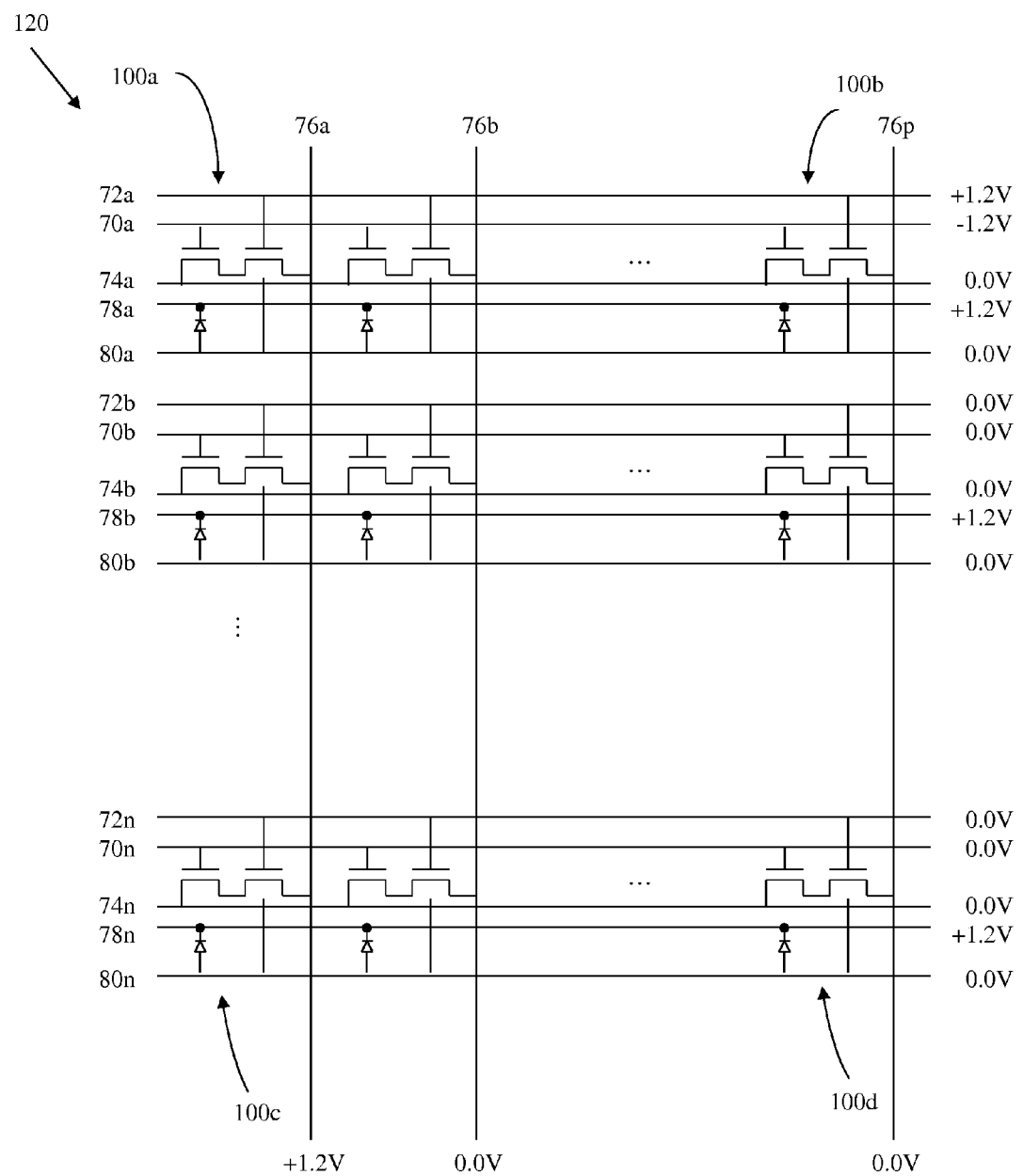
FIG. 14 schematically illustrates a write logic-1 operation performed on a memory array according to an embodiment of the present invention.
Figure 15:
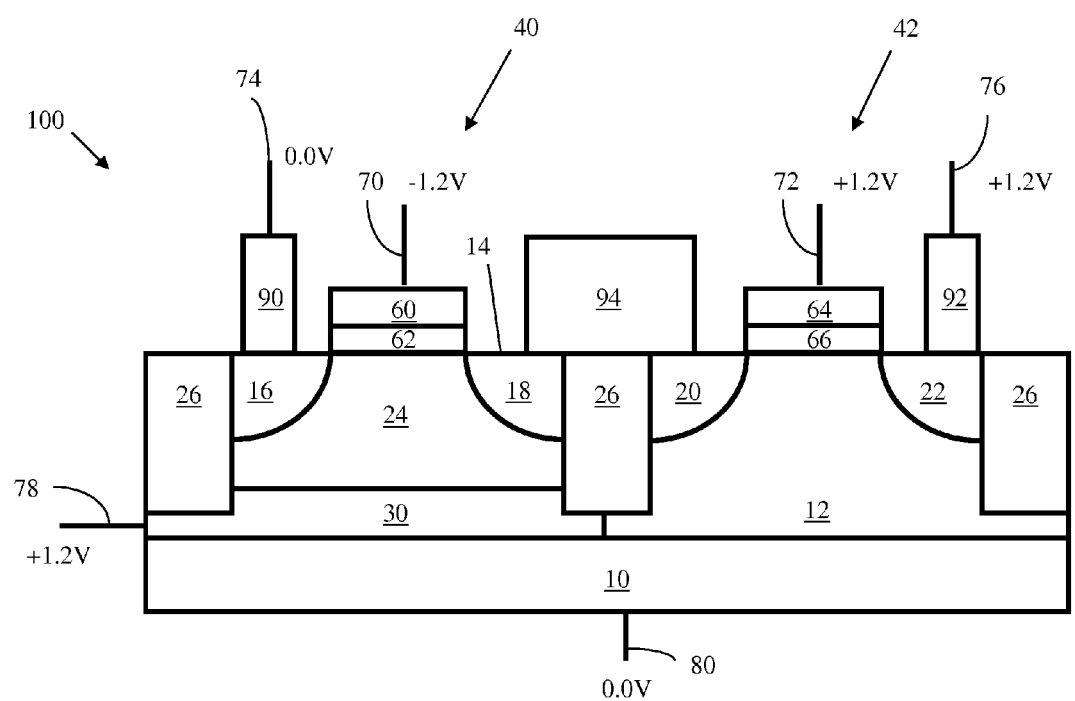
FIG. 15 illustrates bias conditions applied on the terminals of a memory cell to perform a write logic-1 operation.

FIGS. 14 and 15 illustrate an exemplary write logic-1 operation using band-to-band tunneling mechanism, where the following bias conditions are applied: a positive bias is applied to WL2 terminal 72, which turns on the access transistor 42 of the selected memory cell 100, a negative bias is applied to the WL1 terminal 70, a positive bias is applied to the BL terminal 76, zero bias is applied to the SL terminal 74, zero or positive bias is applied to the BW terminal 78, and zero bias is applied to the SUB terminal 80.

In one particular non-limiting embodiment, about +1.2 volts is applied to the selected WL2 terminal 72, about −1.2 volts is applied to the selected WL1 terminal 70, about +1.2 volts is applied to the selected BL terminal 76, about +1.2 volts is applied to the selected BW terminal 78, and about 0.0 volts is applied to the SUB terminal 80.

The positive bias applied to the WL2 terminal 72 will turn on the access transistor 42, which will pass the positive bias applied to the BL terminal 76 to the drain region 18 of the floating body transistor 40. The positive bias now present on the drain region 18 of the floating body transistor 40, along with the negative voltage applied to the WL1 terminal 70 (connected to the gate 60), will create a strong electric field around the junction area of the drain region 18 in the proximity of the gate 60. The strong electric field bends the energy band sharply upward near the gate 60 and drain region 18 junction overlap region, causing electrons to tunnel from the valence band of the floating body region 24 to the conduction band of the drain region 18, leaving holes in the valence band of the floating body region 24. The electrons which tunnel across the energy band become the drain region 18 leakage current, while the holes are injected into floating body region 24 and become the hole charge that creates the logic-1 state.

Figure 16:
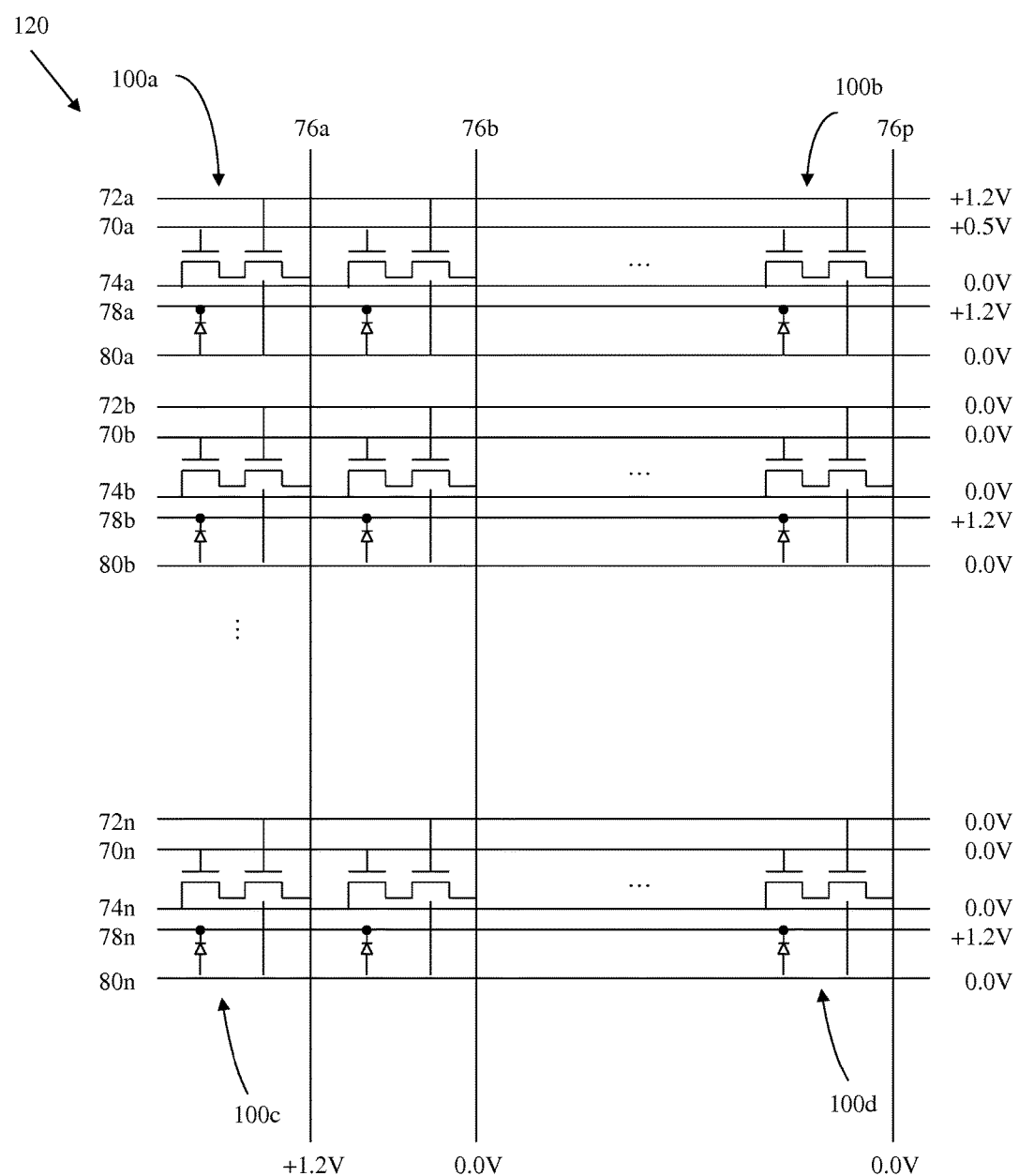
FIG. 16 schematically illustrates an alternative write logic-1 operation performed on a memory array according to an embodiment of the present invention.
Figure 17:
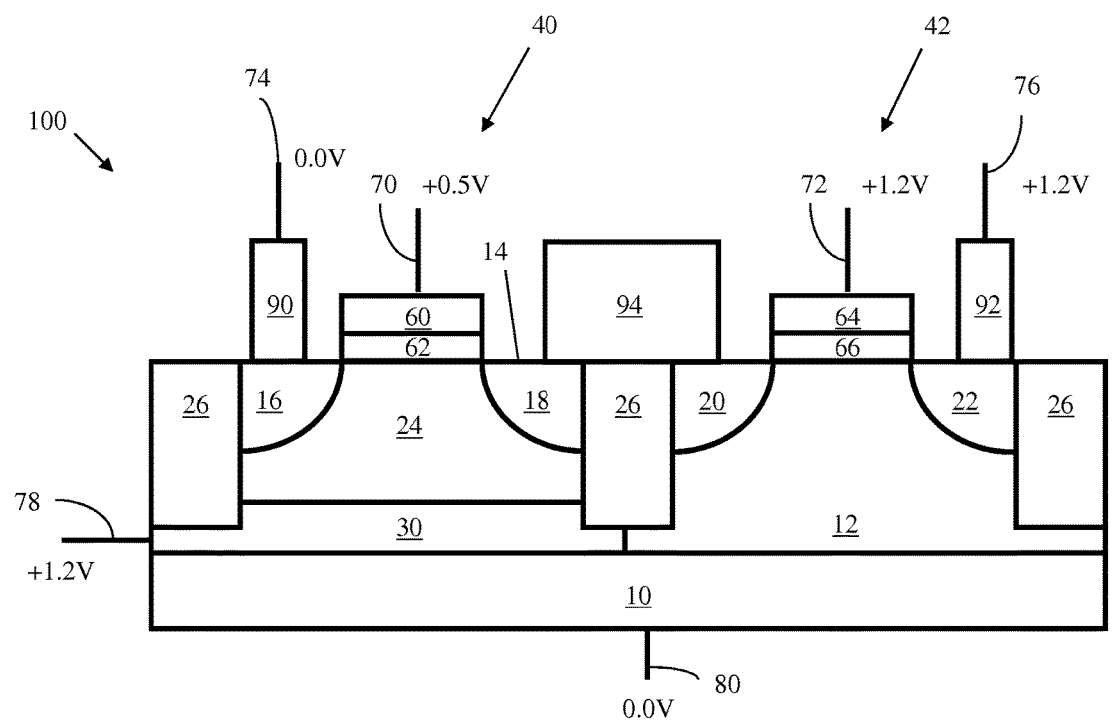
FIG. 17 illustrates bias conditions applied on the terminals of a memory cell to perform an alternative write logic-1 operation.

FIGS. 16 and 17 illustrate exemplary bias conditions for a write logic-1 operation through an impact ionization mechanism, performed on the memory array 120 and a selected memory cell 100, respectively, where the following bias conditions are applied: a positive voltage is applied to the selected WL2 terminal 72, a positive voltage is applied to the selected WL1 terminal 70, a positive voltage is applied to the selected BL terminal 76, zero voltage is applied to the SL terminal 74, zero or positive voltage is applied to the BW terminal 78, and zero voltage is applied to the SUB terminal 80. The positive voltage applied to the WL1 terminal 70 and the BL terminal 76 is configured to maximize hole generation through the impact ionization process, where the voltage on the drain region 18 of the floating body transistor 40 is typically greater than the voltage applied to the gate 60 (connected to the WL1 terminal 70) of the floating body transistor 40.

In one particular non-limiting embodiment, about +1.2 volts is applied to the selected WL2 terminal 72, about +0.5 volts is applied to the selected WL1 terminal 70, about +1.2 volts is applied to the selected BL terminal 76, about +1.2 volts is applied to the selected BW terminal 78, and about 0.0 volts is applied to the SUB terminal 80. These voltage levels are exemplary only and may vary from embodiment to embodiment. Thus the exemplary embodiments, features, bias levels, etc., described are not limiting.

Figure 18:
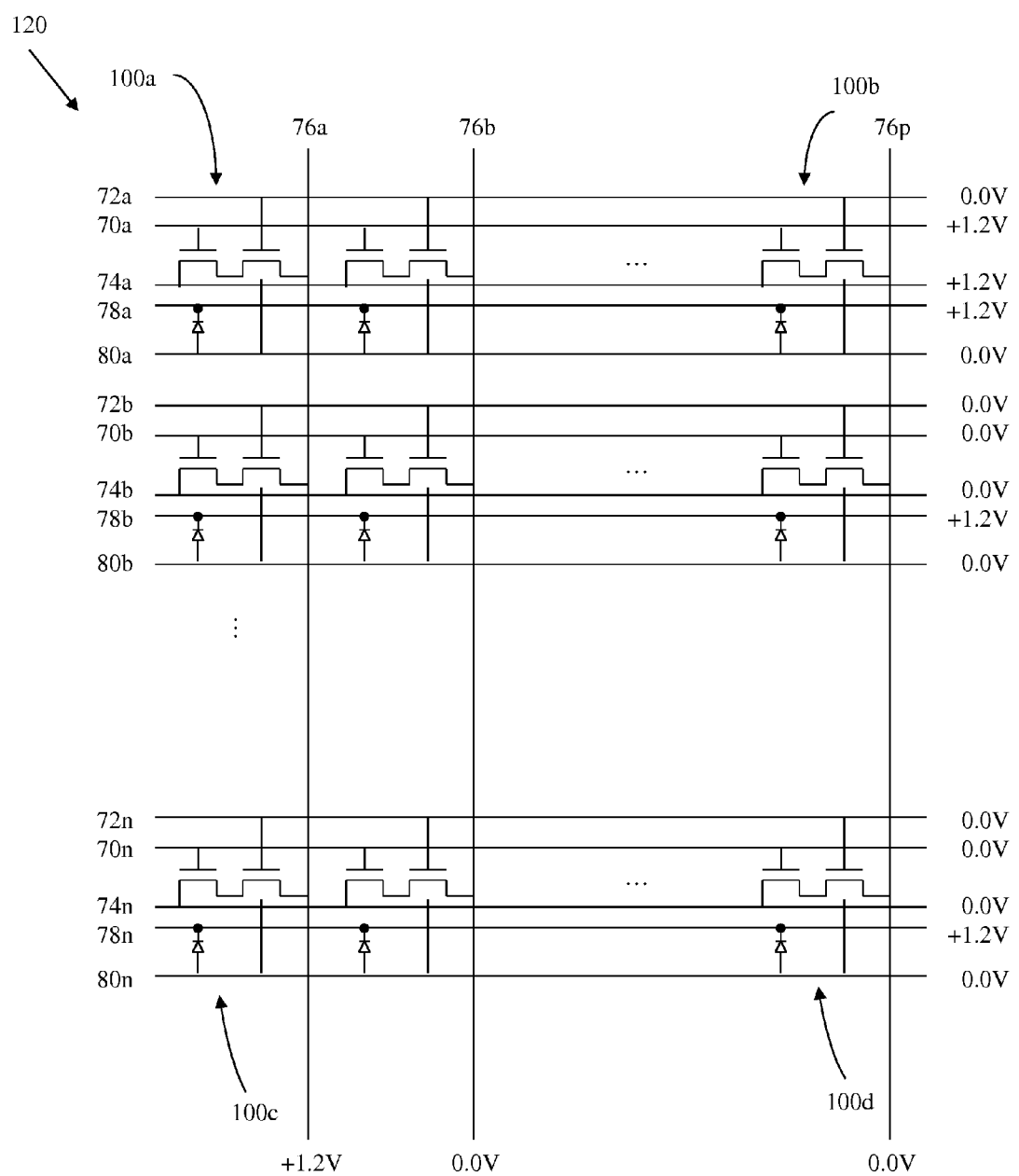
FIG. 18 schematically illustrates an alternative write logic-1 operation through capacitive coupling performed on a memory array according to an embodiment of the present invention.
Figure 19:
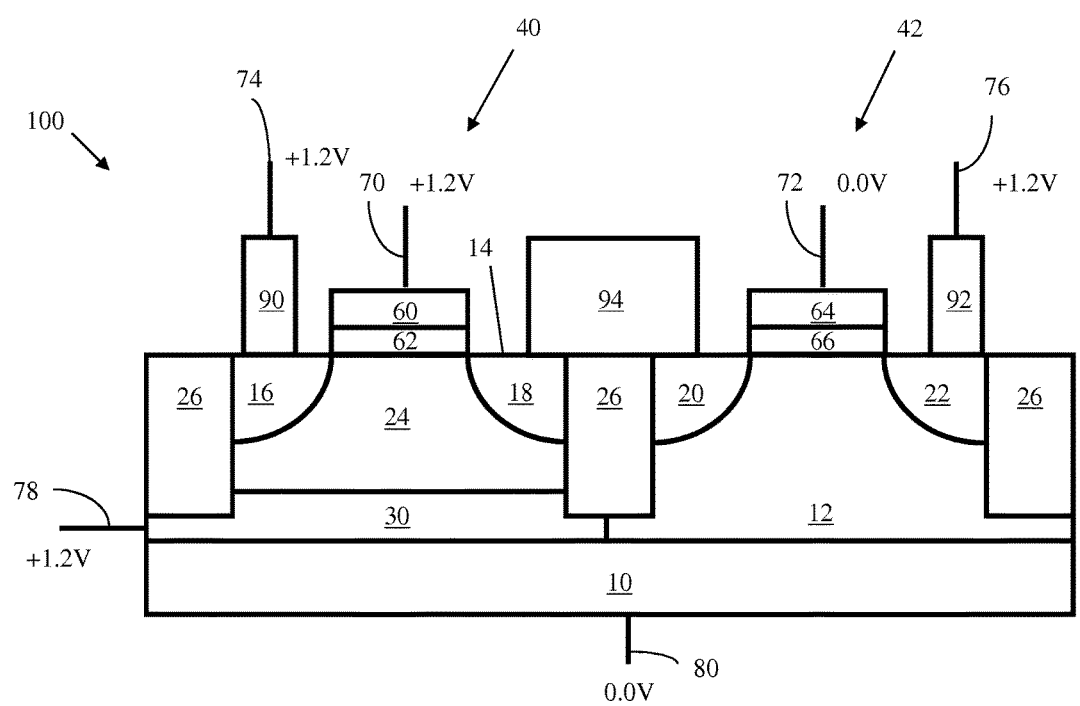
FIG. 19 illustrates bias conditions applied on the terminals of a memory cell to perform an alternative write logic-1 operation through capacitive coupling.

FIGS. 18 and 19 illustrate bias conditions for an exemplary write logic-1 operation through capacitive coupling from the gate 60 of the floating body transistor 40 to the floating body region 24, where the following bias conditions are applied: zero or low positive voltage is applied to the selected WL2 terminal 72, a positive bias is applied to the selected BL terminal 76, a positive voltage is applied to the SL terminal 74, a positive voltage is applied to the BW terminal 78, and zero voltage is applied to the SUB terminal 80. The WL1 terminal is initially grounded, and then its potential is increased to a positive voltage. The access transistor 42 of the selected memory cell is biased such that the source region 20 of the access transistor 42 is floating, for example by having the bias applied to the BL terminal 76 to be greater than the difference between the bias applied to the gate 64 and the threshold voltage of the access transistor 42. Because the channel region of the floating body transistor 40 is now floating, when the potential of the gate region 60 (connected to the WL1 terminal 70) is increased from zero (or negative voltage) to a positive voltage, the potential of the floating body region 24 will increase due to capacitive coupling. The positive bias applied to the buried well region 30 (through the BW terminal 78) will then generate holes through the impact ionization process, which maintains the positive charge of the floating body region 24.

In one particular non-limiting embodiment, about 0.0 volts is applied to the WL2 terminal 72, the voltage applied to the WL1 terminal is increased from 0.0 volts to about +1.2, about +1.2 volts is applied to the SL terminal 74, about +1.2 volts is applied to the BL terminal 76, about +1.2 volts is applied to the BW terminal 78, and about 0.0 volts is applied to the SUB terminal 80. These voltage levels are exemplary only and may vary from embodiment to embodiment. Thus the exemplary embodiments, features, bias levels, etc., described are not limiting.

The ramp rate of the positive bias applied to the WL1 terminal 70 (connected to gate electrode 60) may be optimized to increase the coupling ratio from the gate 60 to the floating body region 24. As described for example in "Substrate Response of a Floating Gate n-channel MOS Memory Cell Subject to a Positive Linear Ramp Voltage", H.-S. Lee and D. S. Lowrie, Solid-State Electronics 24, no. 3, pp. 267-273, 1981, which is hereby incorporated herein, in its entirety, by reference thereto, a higher coupling from the gate 60 to the floating body region 24 can be achieved with a higher ramp rate. The ramp rate applied to the gate 60 may also be higher in the write logic-1 operation than in other operations, such as read operation, to further improve the write logic-1 operation time.

Figure 20:
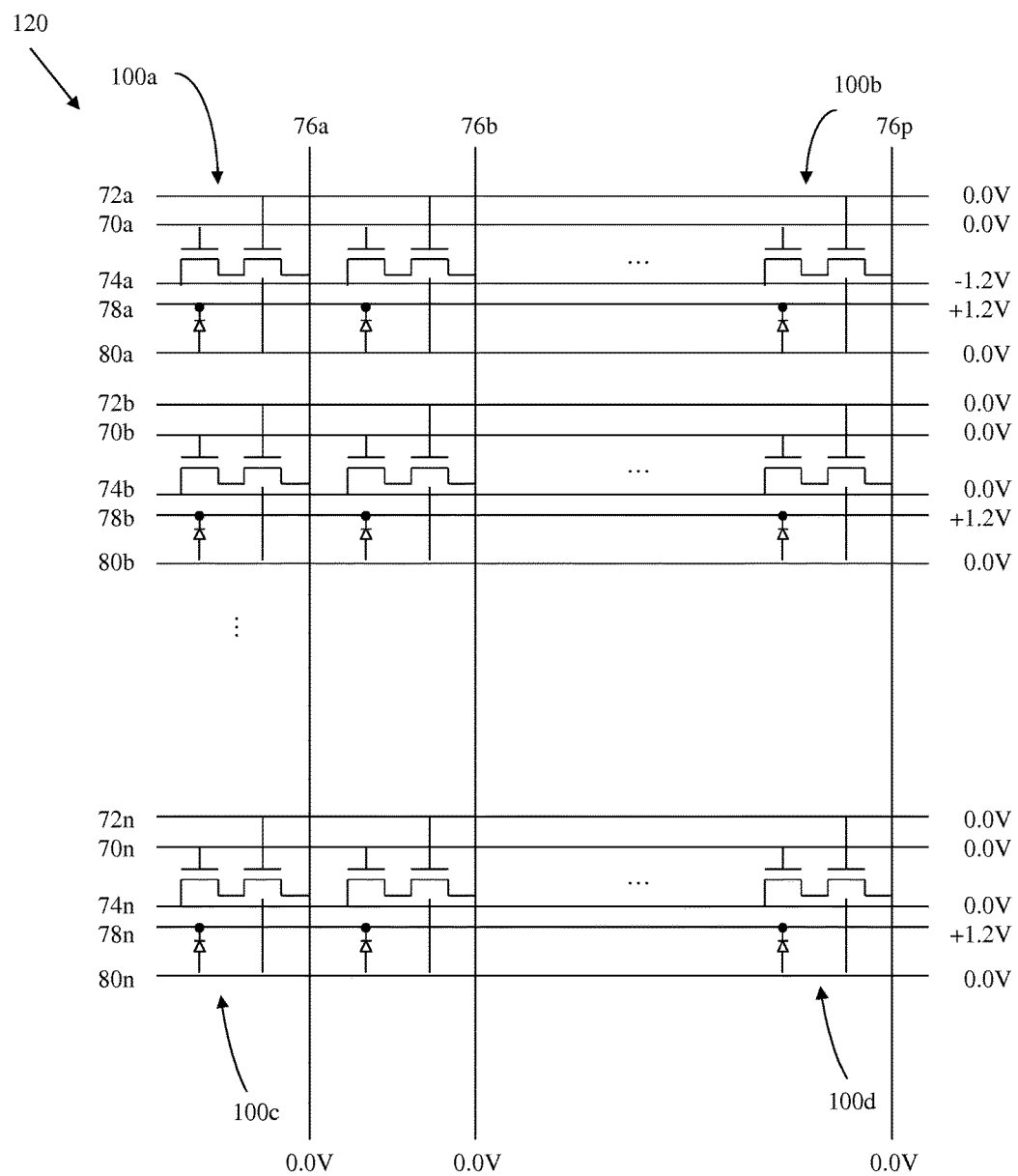
FIG. 20 schematically illustrates a write logic-0 operation performed on a memory array according to an embodiment of the present invention.
Figure 21:
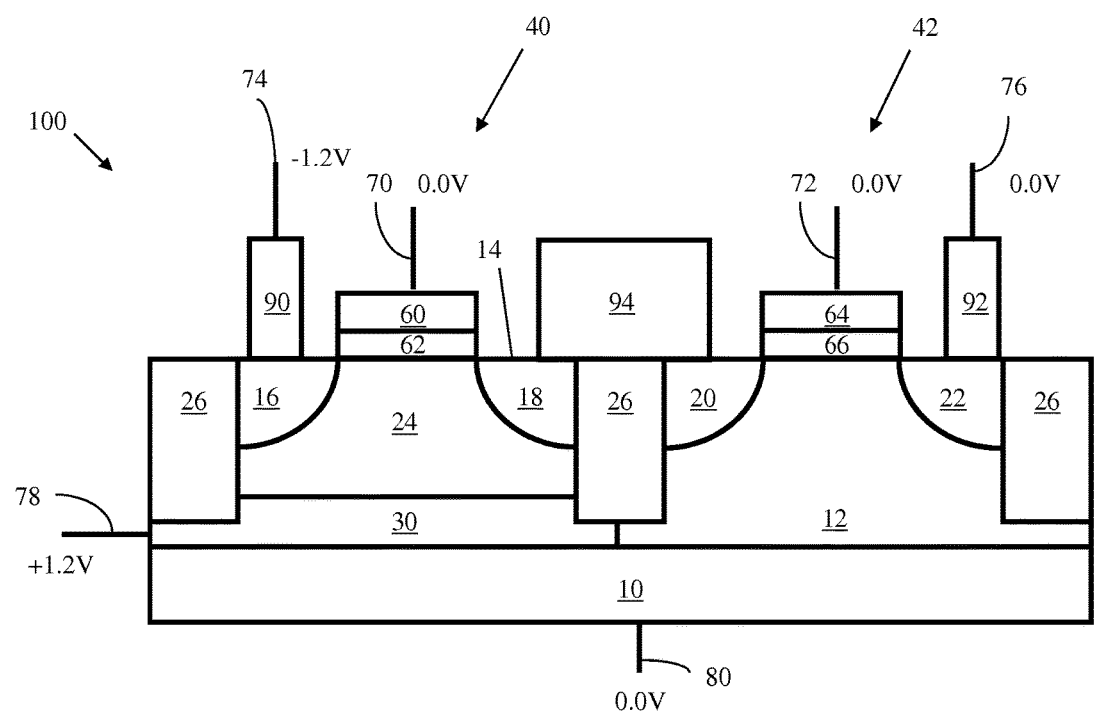
FIG. 21 illustrates bias conditions applied on the terminals of a memory cell to perform a write logic-0 operation.

FIGS. 20 and 21 illustrate exemplary bias conditions for a write logic-0 operation according to an embodiment of the present invention, by applying the following bias conditions: a negative voltage is applied to the SL terminal 74, zero voltage is applied to the WL1 terminal 70, WL2 terminal 72, BL terminal 76, and SUB terminal 80, and a positive bias to the BW terminal 78. Under these conditions, the p-n junction between the floating body 24 and the source line region 16 is forward-biased, evacuating holes from the floating body 24. All memory cells sharing the same SL terminal 74 will be written to simultaneously. To write arbitrary binary data to different memory cells 100, a write logic-0 operation is first performed on all the memory cells to be written, followed by one or more write logic-1 operations on the memory cells that must be written to logic-1.

In one particular non-limiting embodiment, about −1.2 volts is applied to the selected SL terminal 74, about 0.0 volts is applied to the WL1 terminal 70, WL2 terminal 72, BL terminal 76, and SUB terminal 80, and about +1.2 volts is applied to the BW terminal 78. These voltage levels are exemplary only and may vary from embodiment to embodiment. Thus the exemplary embodiments, features, bias levels, etc., described are not limiting.

Figure 22:
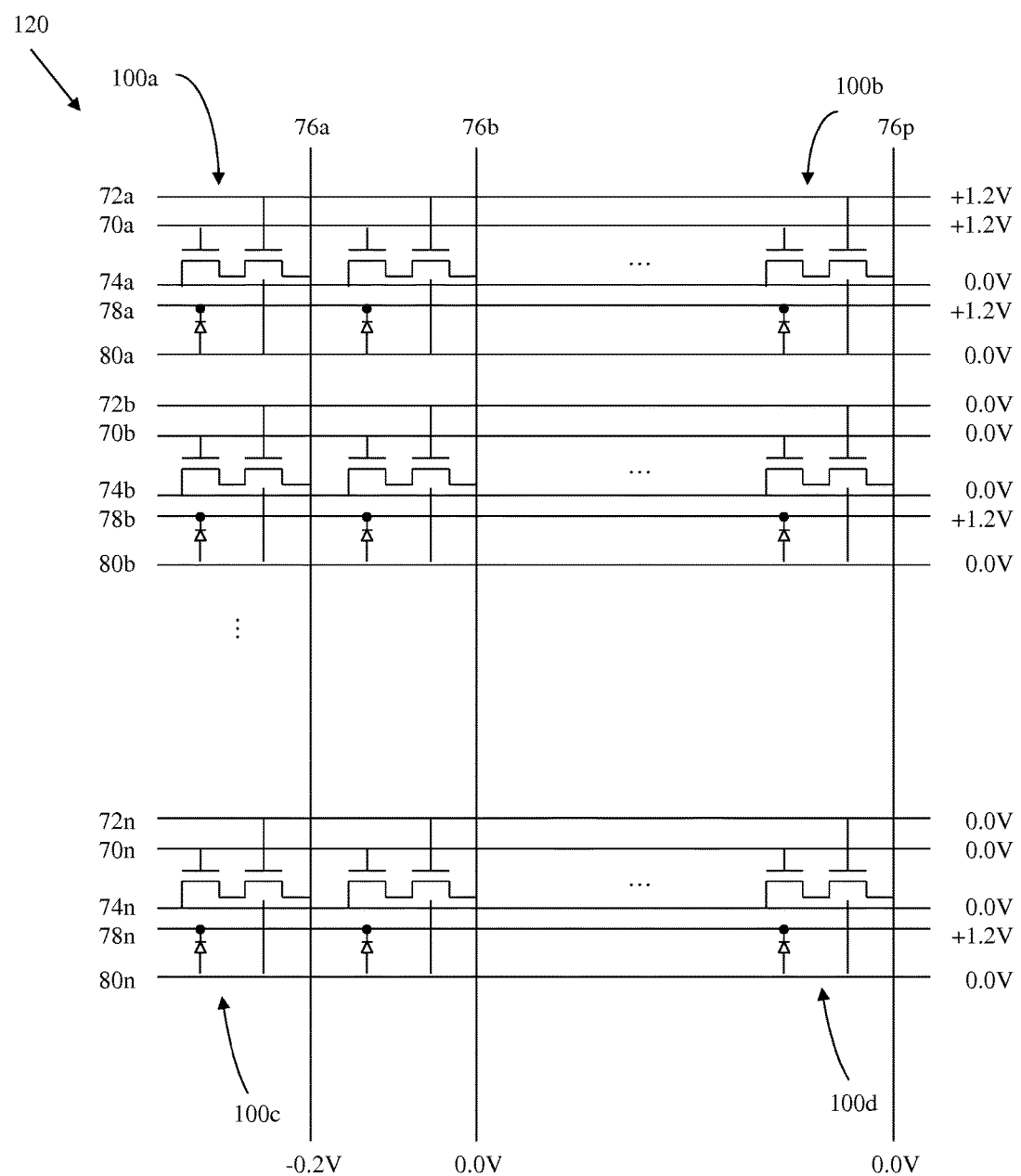
FIG. 22 schematically illustrates an alternative write logic-0 operation performed on a memory array according to an embodiment of the present invention.
Figure 23:
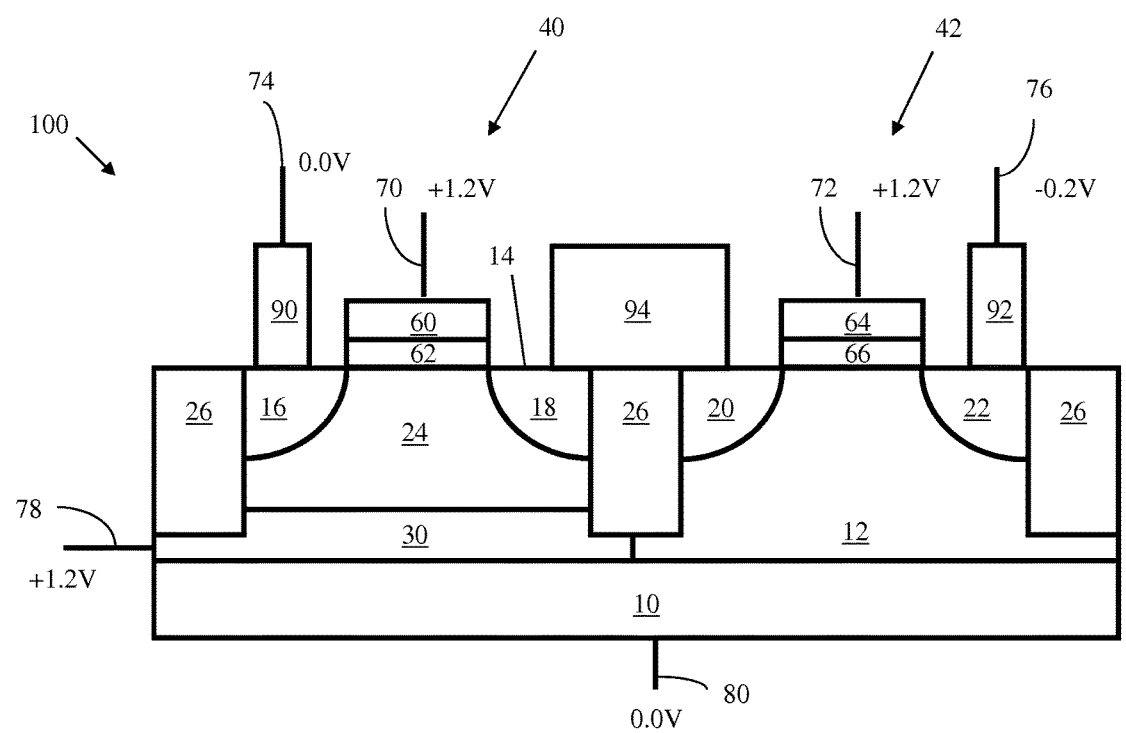
FIG. 23 illustrates bias conditions applied on the terminals of a memory cell to perform an alternative write logic-0 operation.

FIGS. 22 and 23 illustrate exemplary bias conditions for a write logic-0 operation according to another embodiment of the present invention by applying the following bias conditions: a positive bias is applied to the WL2 terminal 72, a positive bias is applied to the WL1 terminal 70, a negative bias is applied to the BL terminal 76, zero voltage is applied to the SL terminal 74, a positive bias is applied to the BW terminal 78, and zero voltage is applied to the SUB terminal 80. Under these conditions, the access transistor 42 will pass the negative voltage applied on the BL terminal 76 to the drain region 18 of the floating body transistor 40, forward biasing the p-n junction between the floating body 24 and the drain region 18. A positive bias can also be applied to the gate 60 of the floating body transistor 40 (connected to the WL1 terminal 70), which will increase the potential of the floating body 24 through capacitive coupling, which in turn will increase the electric field across the p-n junction between the floating body 24 and the drain region 18. The negative bias applied to the BL terminal 76 and the bias applied to the WL2 terminal are configured such that access transistors of the unselected cells 100 in different rows (for example, memory cells 100c and 100d) do not pass the negative bias to the drain region 18 of the floating body transistor 40.

In one particular non-limiting embodiment, about +1.2 volts is applied to the WL2 terminal 72, about +1.2 volts is applied to the WL1 terminal 70, about 0.0 volts is applied to the SL terminal 74, about −0.2 volts is applied to the BL terminal 76, about +1.2 volts is applied to the BW terminal 78, and about 0.0 volts is applied to the SUB terminal 80. These voltage levels are exemplary only and may vary from embodiment to embodiment. Thus the exemplary embodiments, features, bias levels, etc., described are not limiting.

An active low scheme—where the selected BL terminal 74 is biased at low voltage, for example zero voltage—can also be performed on memory cell 100 and memory array 120.

Figure 24:
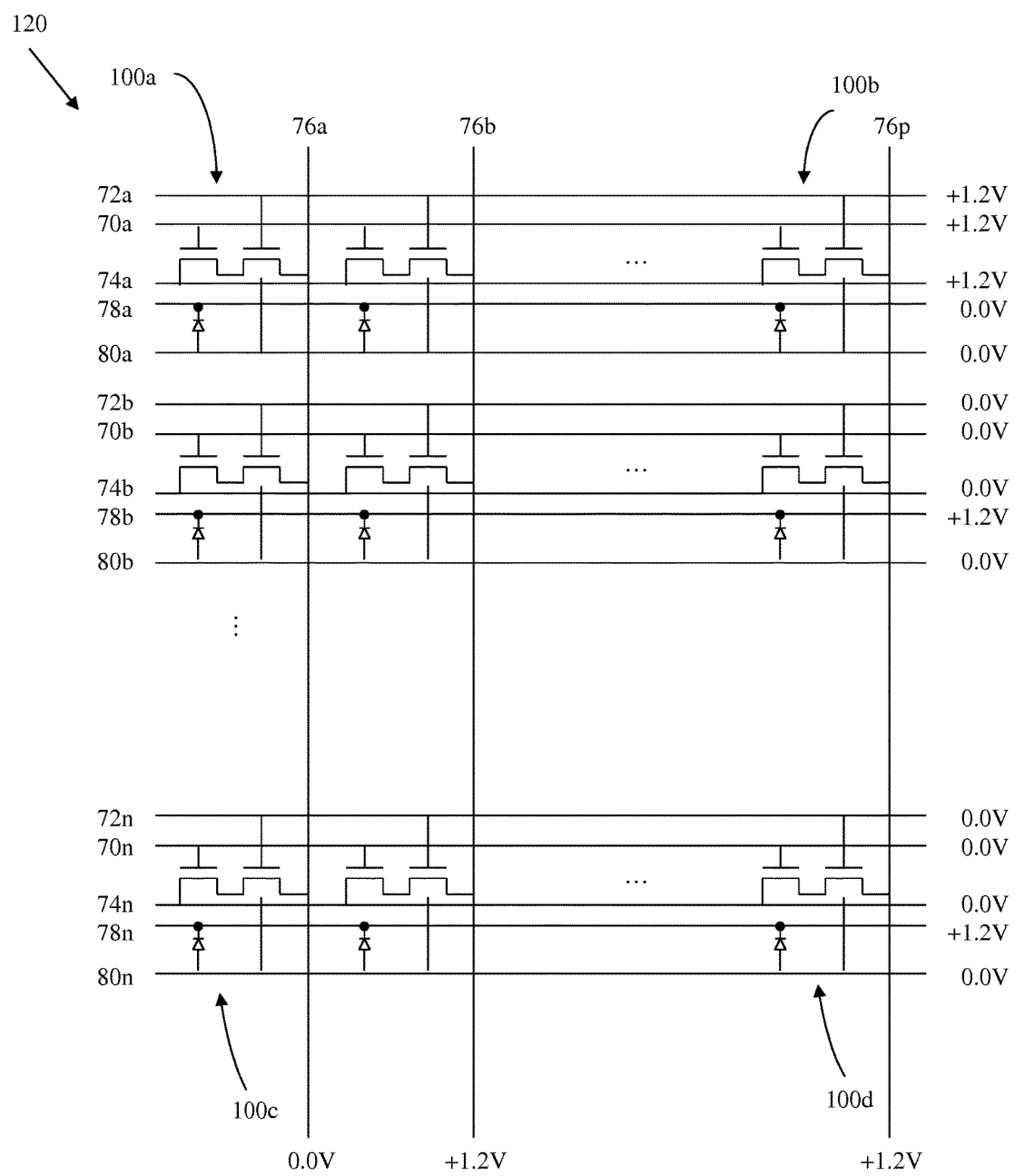
FIG. 24 schematically illustrates an active-low read operation performed on a memory array according to an embodiment of the present invention.

Exemplary bias conditions for an active low read operation according to an embodiment of the present invention are illustrated in FIG. 24, where the following bias conditions are applied to a selected memory cell 100a: a positive voltage is applied to WL2 terminal 72a, a positive voltage is applied to WL1 terminal 70a, zero voltage is applied to the BL terminal 76a, a positive voltage is applied to the SL terminal 74a, zero or positive voltage is applied to the BW terminal 78a, and zero voltage is applied to the SUB terminal 80a. The following bias conditions are applied to the unselected terminals: zero voltage is applied to the WL1 terminal 70, WL2 terminal 72, SL terminal 74, a positive voltage is applied to the BL terminal 76, zero or positive voltage is applied to the BW terminal 78, and zero voltage is applied to the SUB terminal 80.

In one particular non-limiting embodiment, the following conditions are applied to the selected terminals: about +1.2 volts is applied to the WL2 terminal 72, about +1.2 volts is applied to the WL1 terminal 70, about +1.2 volts is applied to the SL terminal 74, about 0.0 volts is applied to the BL terminal 76, about 0.0 volts is applied to the BW terminal 78, and about 0.0 volts is applied to the SUB terminal 80; while the following bias conditions are applied to the unselected terminals: about 0.0 volts is applied to the WL1 terminal 70, WL2 terminal 72, about 0.0 volts is applied to the SL terminal 74, about +1.2 volts is applied to the BL terminal 76, about +1.2 volts is applied to the BW terminal 78, and about 0.0 volts is applied to the SUB terminal 80. These voltage levels are exemplary only and may vary from embodiment to embodiment. Thus the exemplary embodiments, features, bias levels, etc., described are not limiting.

Figure 25:
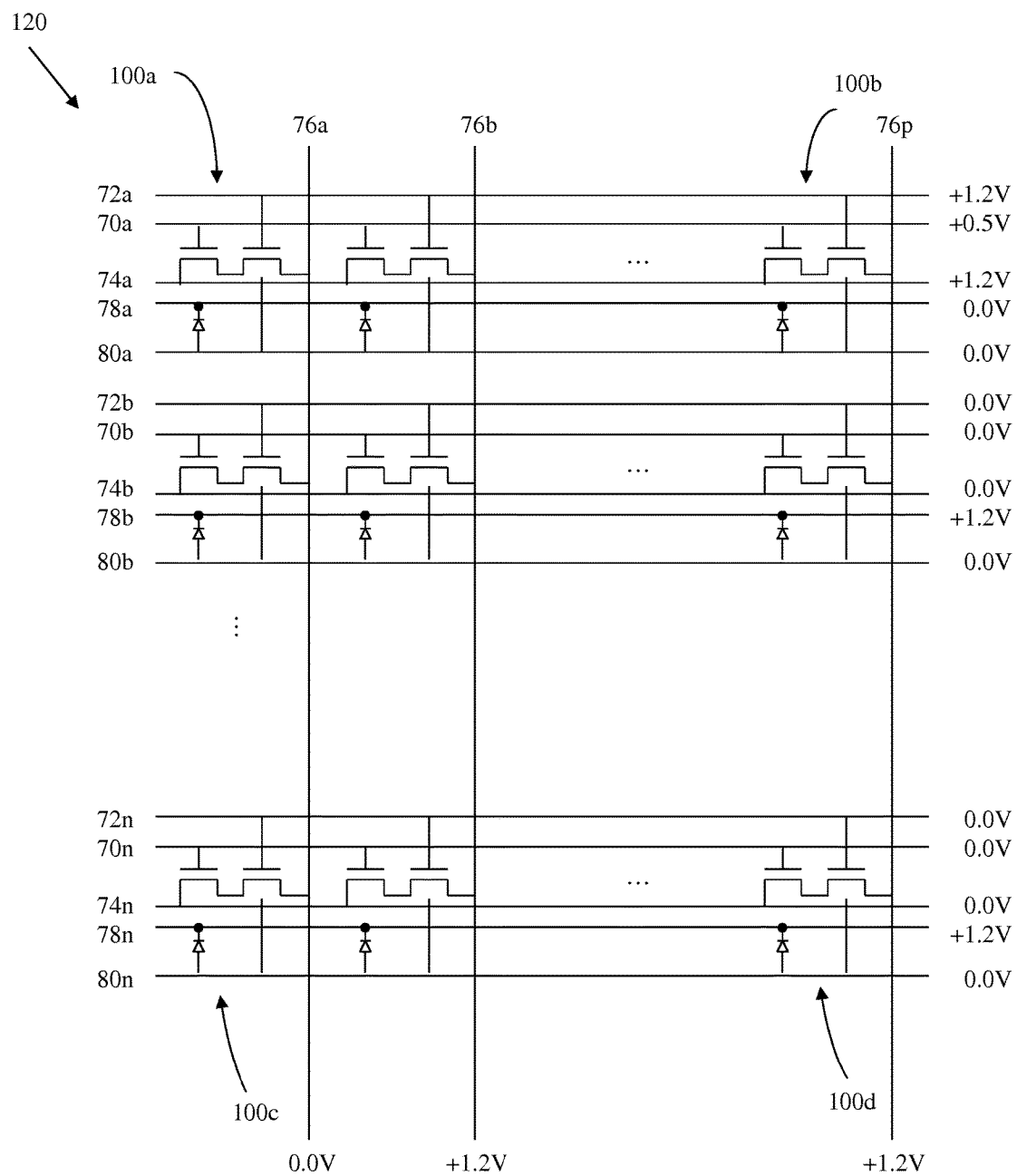
FIG. 25 schematically illustrates an active-low write logic-1 operation performed on a memory array according to an embodiment of the present invention.

FIG. 25 illustrates exemplary bias conditions applied to the selected terminals of memory array 120 for an active low write logic-1 operation according to an embodiment of the present invention: a positive voltage is applied to WL2 terminal 72a, a positive voltage is applied to WL1 terminal 70a, zero voltage is applied to the BL terminal 76a, a positive voltage higher than the positive voltage applied to WL1 terminal 70a is applied to the SL terminal 74a, zero or positive voltage is applied to the BW terminal 78a, and zero voltage is applied to the SUB terminal 80a. The following bias conditions are applied to the unselected terminals: zero voltage is applied to the WL1 terminal 70, WL2 terminal 72, SL terminal 74, a positive voltage is applied to the BL terminal 76, zero or positive voltage is applied to the BW terminal 78, and zero voltage is applied to the SUB terminal 80.

In one particular non-limiting embodiment, the following conditions are applied to the selected terminals: about +1.2 volts is applied to the WL2 terminal 72, about +0.5 volts is applied to the WL1 terminal 70, about +1.2 volts is applied to the SL terminal 74, about 0.0 volts is applied to the BL terminal 76, about 0.0 volts is applied to the BW terminal 78, and about 0.0 volts is applied to the SUB terminal 80; while the following bias conditions are applied to the unselected terminals: about 0.0 volts is applied to the WL1 terminal 70, WL2 terminal 72, about 0.0 volts is applied to the SL terminal 74, about +1.2 volts is applied to the BL terminal 76, about +1.2 volts is applied to the BW terminal 78, and about 0.0 volts is applied to the SUB terminal 80. These voltage levels are exemplary only and may vary from embodiment to embodiment. Thus the exemplary embodiments, features, bias levels, etc., described are not limiting.

Figure 26:
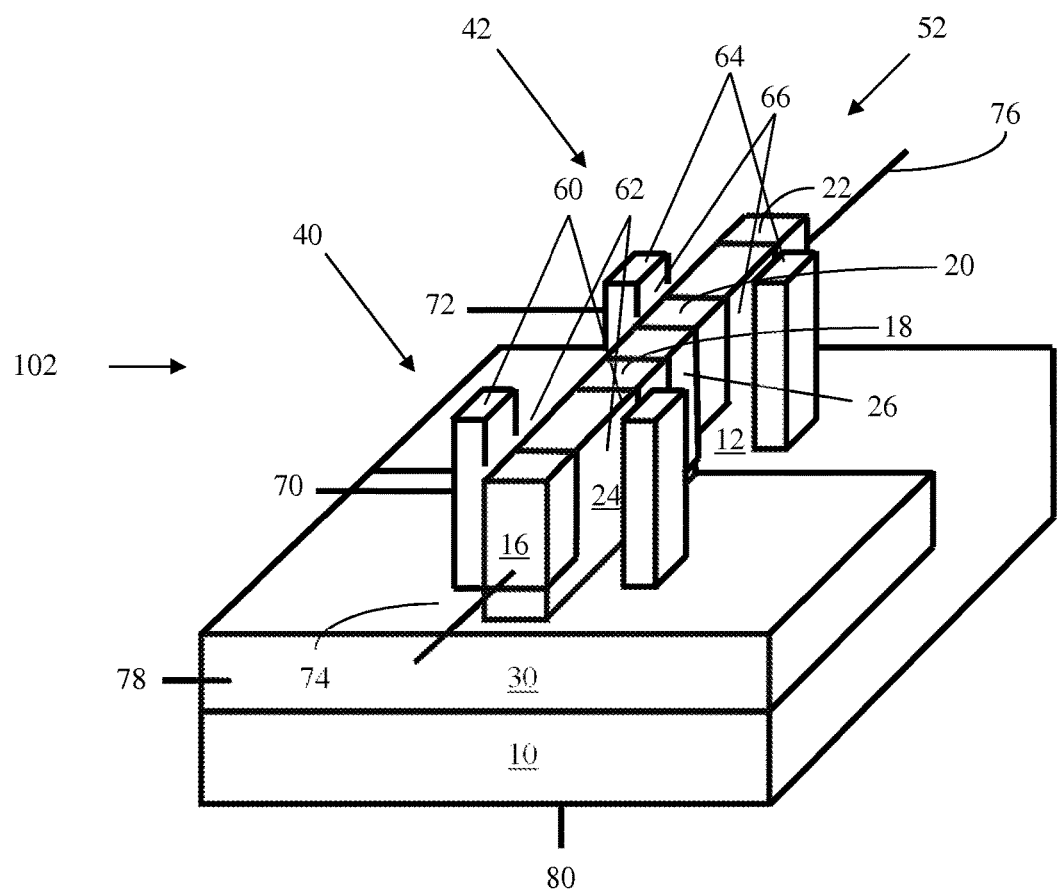
FIGS. 26 and 27 schematically illustrate cross-sectional schematic illustrations of a fin-type memory cell device according to an embodiment of the present invention.
Figure 27:
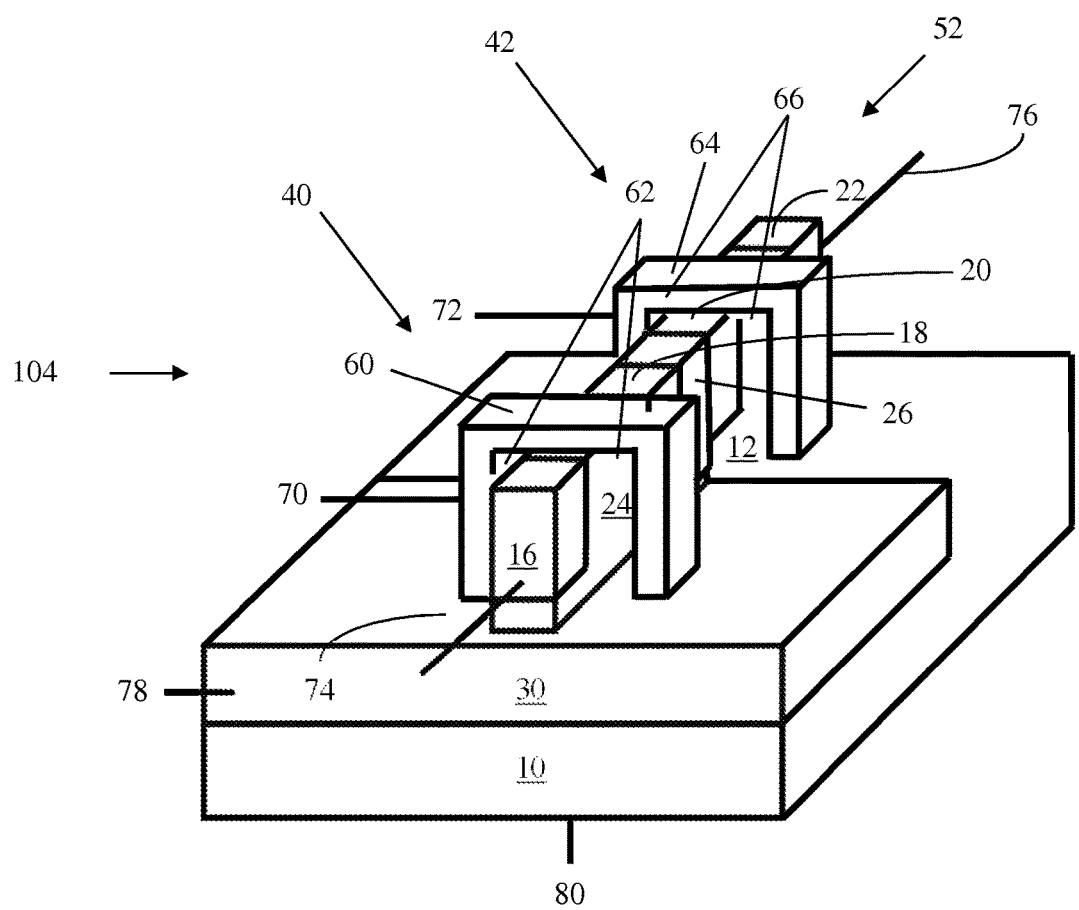

FIGS. 26 and 27 show alternative embodiments of memory cells 102 and 104, comprising a three-dimensional memory cell structure. In these embodiments, memory cells 102 and 104 have a fin structure 52 extending substantially perpendicular to, and above the top surface of the substrate 10. Fin structure 52 is conductive and may be built on buried well layer 30 or well region 12. Both memory cells 102 and 104 comprise floating body transistor 40 and access transistor 42. In floating body transistor 40, floating body region 24 is insulated by the buried well region 30, source line region 16, drain region 18, insulating layer 62, and insulating layer 26. In access transistor 42, the well region 12 has the same conductivity type as the substrate 10. The drain region 18 of the floating body transistor 40 is connected to the source region 20 of the access transistor 42 through a conductive element 44. For drawing simplicity, the conductive element 44 is not shown in FIGS. 26 and 27.

Memory cell 102 includes gates 60 on two opposite sides of the floating substrate region 24 of the floating body transistor 40 and gates 64 on two opposite sides of the well region 12 of the access transistor 42, see FIG. 26. Alternatively, gates 60 and gates 64 may enclose three sides of the floating body region 24 and well region 12, respectively, in memory cell 104, as illustrated in FIG. 27.

Memory cells 102 and 104 comprise source line (SL) terminal 74 connected to the source line region 16, bit line (BL) terminal 76 connected to the bit line region 22, word line 1 (WL1) terminal 70, which is electrically connected to the gate 60 of the floating body transistor 40, word line 2

(WL2) terminal 72, which is electrically connected to the gate 64 of the access transistor 42, buried well (BW) terminal 78, which is electrically connected to the buried well region 30 of the floating body transistor 40, and substrate (SUB) terminal 80, which is connected to the substrate region 10.

Figure 28:
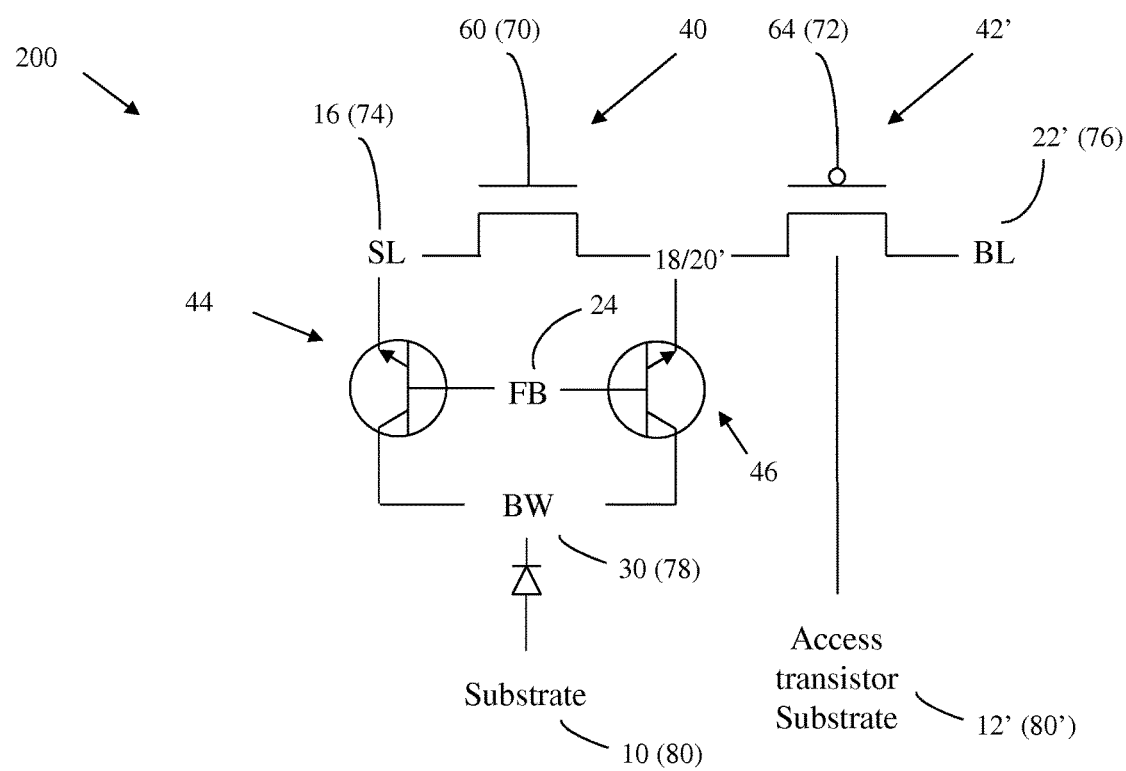
FIG. 28 is a schematic illustration of a memory cell according to another embodiment of the present invention.

Memory cells 100, 102, and 104 each have two transistors having the same conductivity type in series (two n-channel transistors 40 and 42 are used in the examples). FIG. 28 illustrates another embodiment of memory cell 200, where the memory transistor 40 and the access transistor 42' are comprised of transistors having different conductivity type. In this exemplary embodiment of memory cell 200, the floating body transistor 40 is similar to that of memory cell 100. However, the access transistor 42' has a different conductivity type from access transistor 42 of memory cell 100, and may comprise an additional Access Transistor Substrate terminal 80'.

Figure 29A:
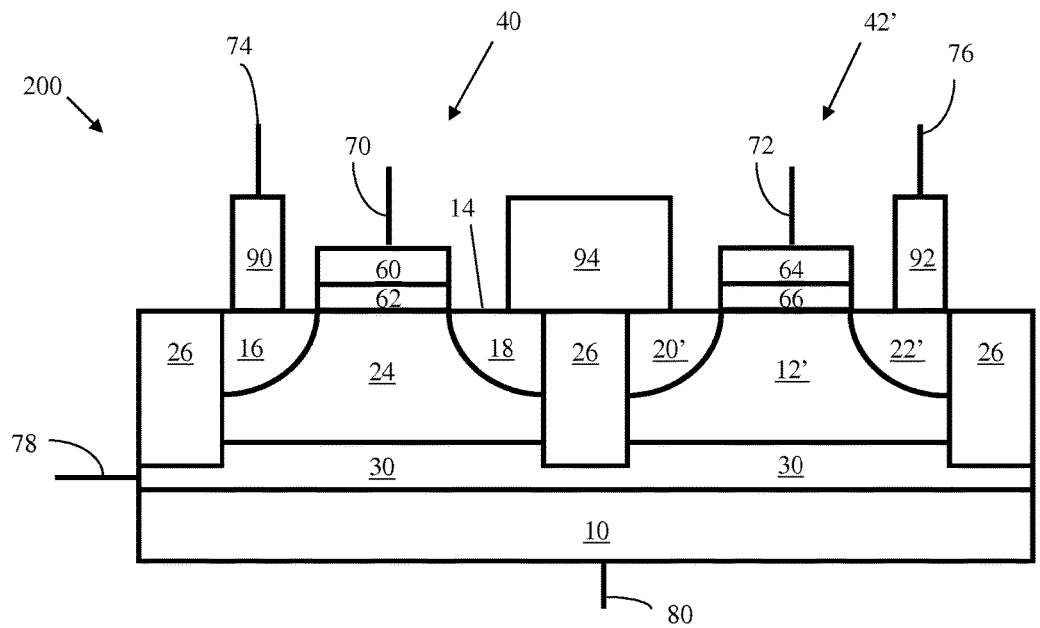
FIGS. 29A and 29B are schematic, cross-sectional illustrations of a memory cell according to another embodiment of the present invention.
Figure 29B:
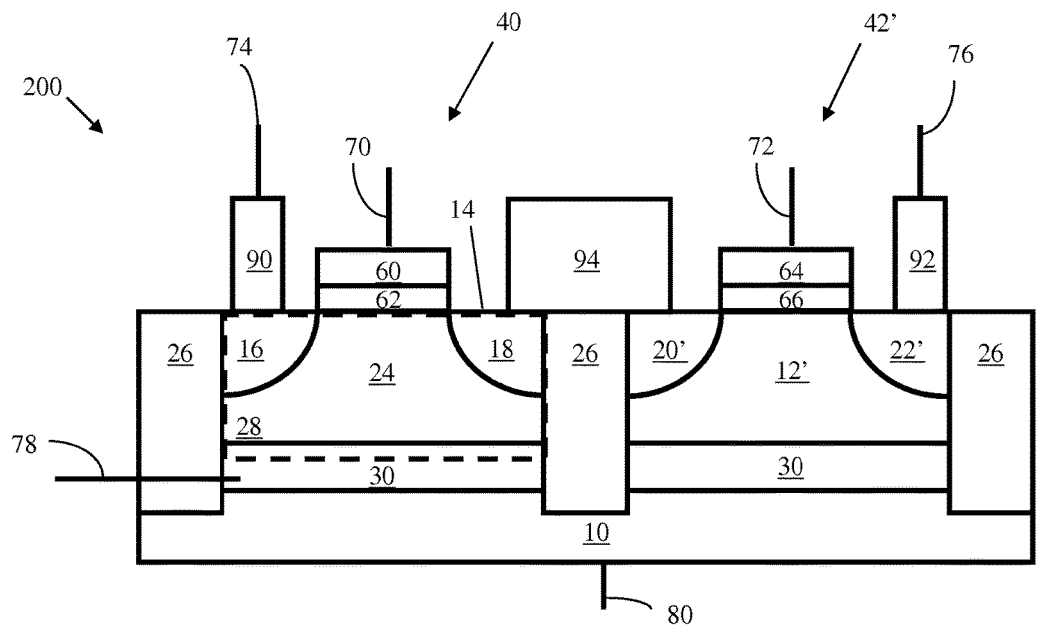

FIG. 29A illustrates memory cell 200 according to an embodiment of the present invention. Access transistor 42' comprises a well region 12' of the second conductivity type, such as n-type, source region 20' and bit line region 22' of the first conductivity type, such as p-type. The well region 12' of the second conductivity type is electrically connected to the buried well region 30, and is therefore not floating. A gate 64 is positioned in between the source region 20' and the bit line region 22'. The gate 64 is insulated from the well region 12' by an insulating layer 66. Insulating layer 66 may be made of silicon oxide and/or other dielectric materials, including high-K dielectric materials, such as, but not limited to, tantalum peroxide, titanium oxide, zirconium oxide, hafnium oxide, and/or aluminum oxide. The gate 64 may be made of, for example, polysilicon material or metal gate electrode, such as tungsten, tantalum, titanium and their nitrides. The bottom of insulating layer 26 may reside below the buried region 30 as shown in FIG. 29B. This requires a shallower insulating layer 28, which insulates the floating body region 24, but allows the buried layer 30 to be continuous in the perpendicular direction of the cross-sectional view shown in FIG. 29B. In memory cell 200 shown in FIGS. 29A and 29B, the well region 12' of the access transistor 42' is connected to the buried well region 30. Therefore, in this embodiment, the BW terminal 78 also serves as the Access Transistor Substrate terminal 80' shown in the equivalent circuit representation of memory cell 200 shown in FIG. 28.

Figure 30:
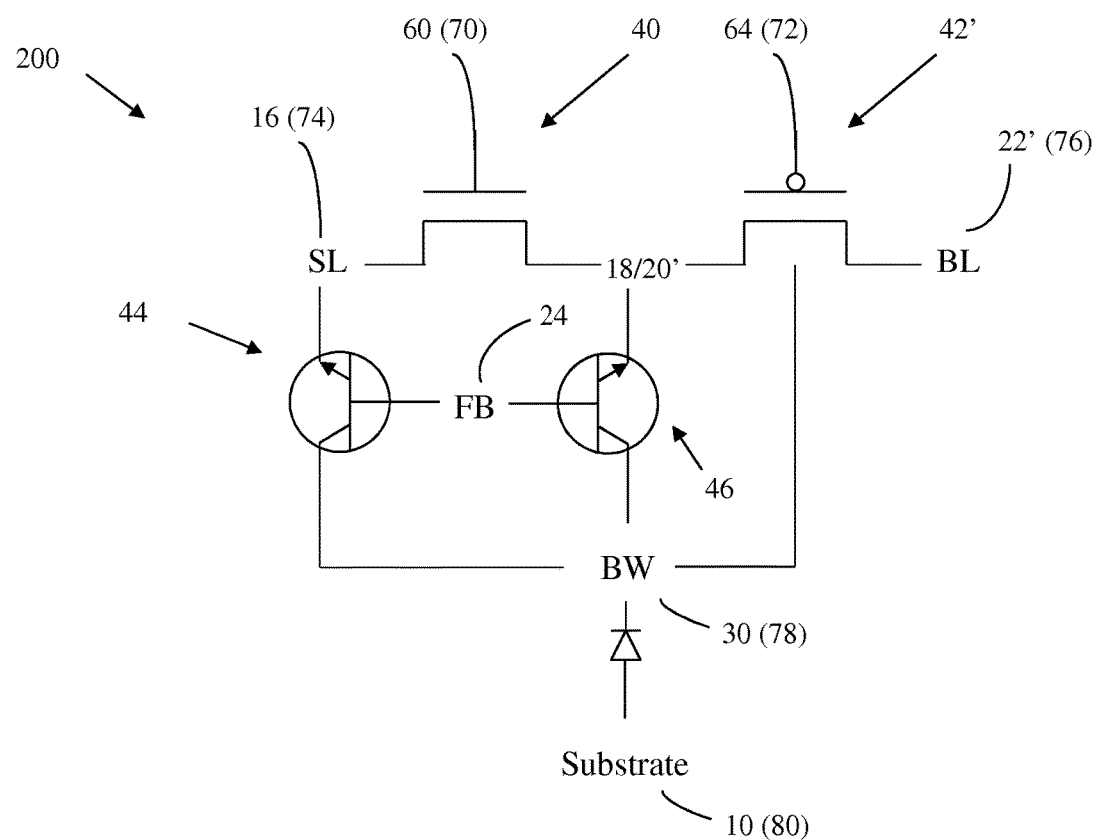
FIG. 30 schematically illustrates an equivalent circuit representation of the memory cells shown in FIGS. 29A-29B.
Figure 31:
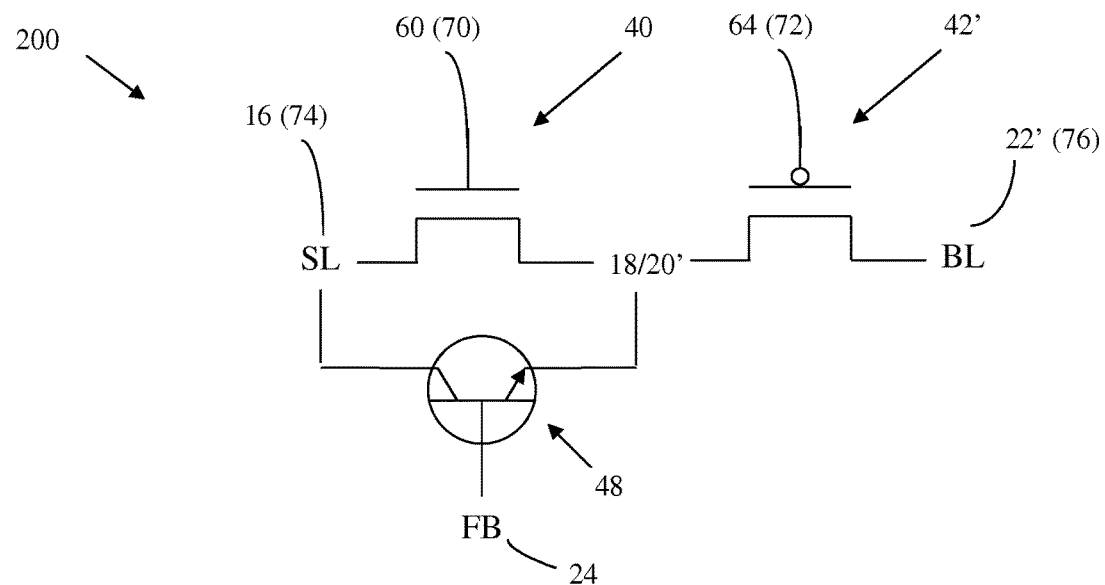
FIG. 31 schematically illustrates a bipolar device inherent in memory devices of FIGS. 29A-29B.

FIGS. 30 and 31 illustrate the equivalent circuit representation of the memory device 200, showing the floating body transistor 40, formed by the source line region 16, drain region 18, and the gate 60, and access transistor 42', formed by the source region 20', the bit line region 22', and the gate 64, connected in series. Inherent in the floating body transistor 40 is bipolar device 44, formed by the buried well region 30, the floating body region 24, and the source line region 16, and bipolar device 46, formed by the buried well region 30, the floating body region 24, and the drain region 18.

Also inherent in floating body transistor 40 is bipolar device 48, formed by the source line region 16, floating body region 24, and the drain region 18. For drawings clarity, bipolar device 48 is shown separately in FIG. 31.

Figure 32:
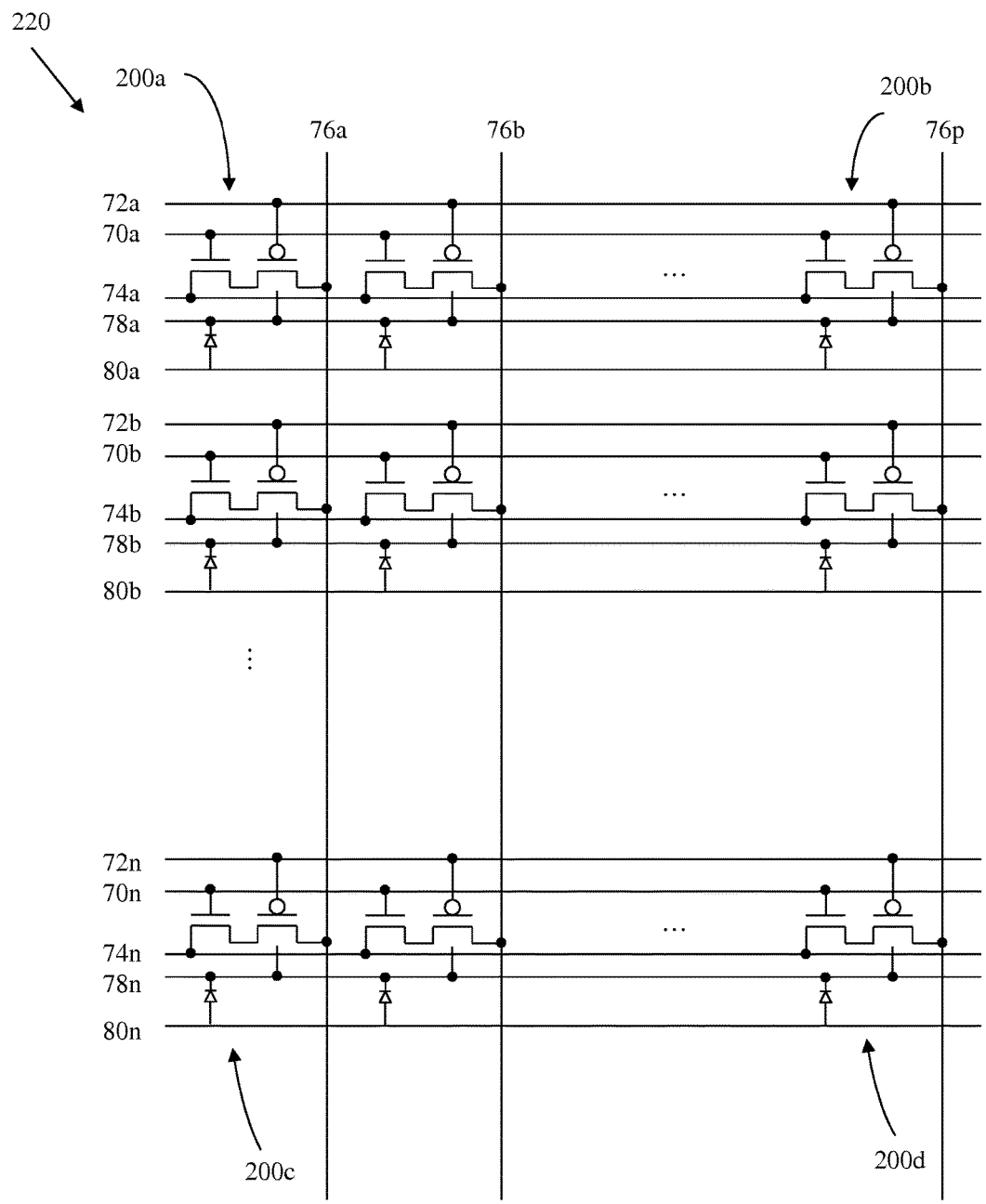
FIG. 32 schematically illustrates multiple cells of the type shown in FIGS. 29A-29B joined to make a memory array.

FIG. 32 shows an exemplary memory array 220 of memory cells 200 (including four exemplary instances of memory cell 200 being labeled as 200a, 200b, 200c, and 200d as shown) arranged in rows and columns. In many, but not all, of the figures where exemplary array 220 appears, representative memory cell 200a will be representative of a "selected" memory cell 200 when the operation being described has one (or more in some embodiments) selected memory cells 200. In such figures, representative memory cell 200b will be representative of an unselected memory cell 200 sharing the same row as selected representative memory cell 200a, representative memory cell 200c will be representative of an unselected memory cell 200 sharing the same column as selected representative memory cell 200a, and representative memory cell 200d will be representative of a memory cell 200 sharing neither a row or a column with selected representative memory cell 200a.

Several operations can be performed on memory cell 200, such as: holding, read, write logic-1 and write logic-0 operations.

Figure 33:
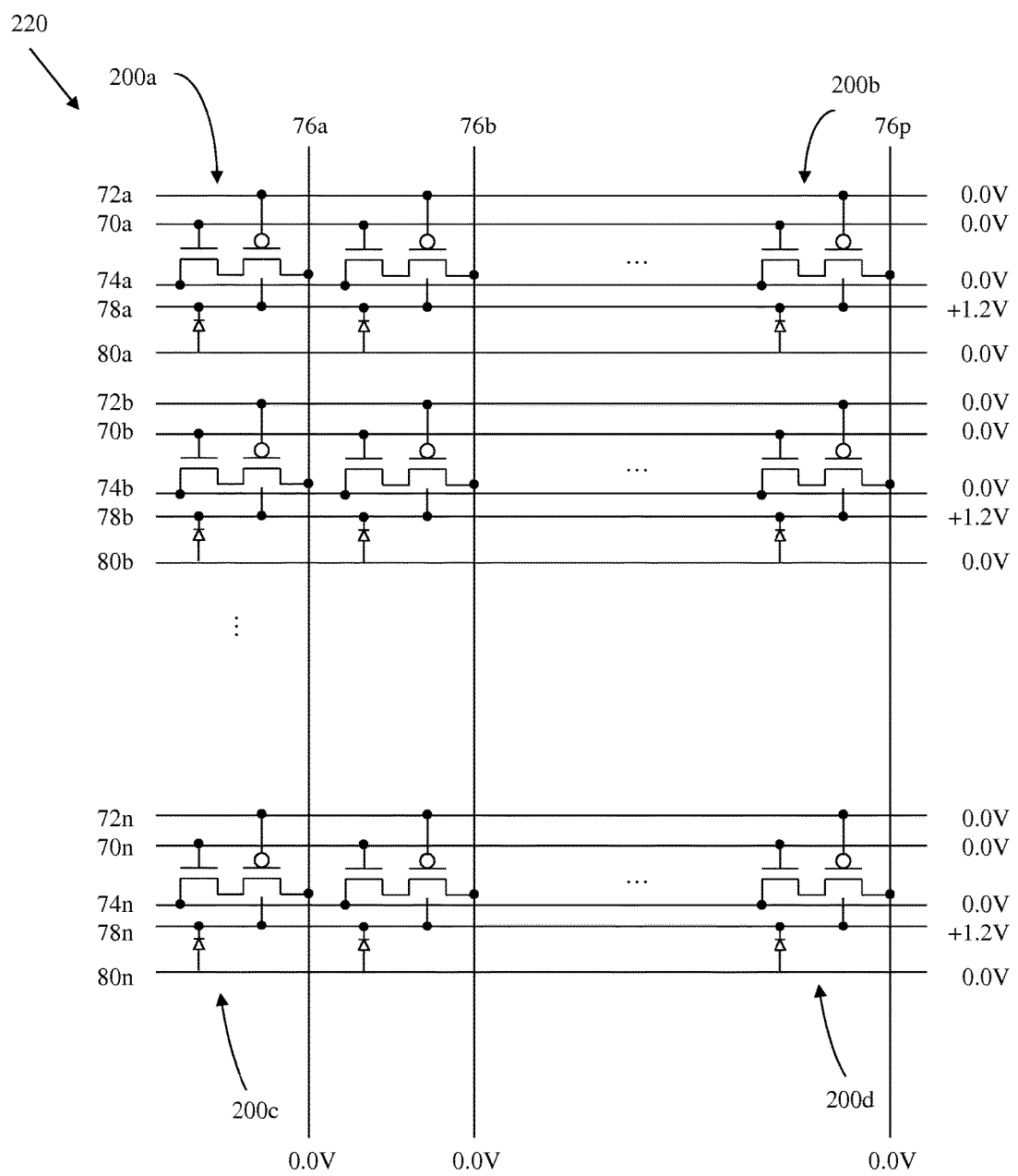
FIG. 33 schematically illustrates a holding operation performed on a memory array according to an embodiment of the present invention.

FIG. 33 shows a holding operation performed on memory array 220 according to an embodiment of the present invention, which follows the same mechanism as that of memory array 120. The holding operation is performed by applying a positive back bias to the BW terminal 78, and zero bias on the WL1 terminal 70, WL2 terminal 72, SL terminal 74, SUB terminal 80, and BL terminal 76. The positive back bias applied to the buried layer region 30 connected to the BW terminal 78 will maintain the state of the memory cell 200 that it is connected to by maintaining the charge stored in the floating body region 24 of the corresponding floating body transistor 40.

In one embodiment the bias conditions for the holding operation for memory cell 200 are: 0.0 volts is applied to WL1 terminal 70, WL2 terminal 72, SL terminal 74, BL terminal 76, and SUB terminal 78, and a positive voltage like, for example, +1.2 volts is applied to BW terminal 78. In other embodiments, different voltages may be applied to the various terminals of memory cell 200 as a matter of design choice and the exemplary voltages described are not limiting in any way.

Figure 34:
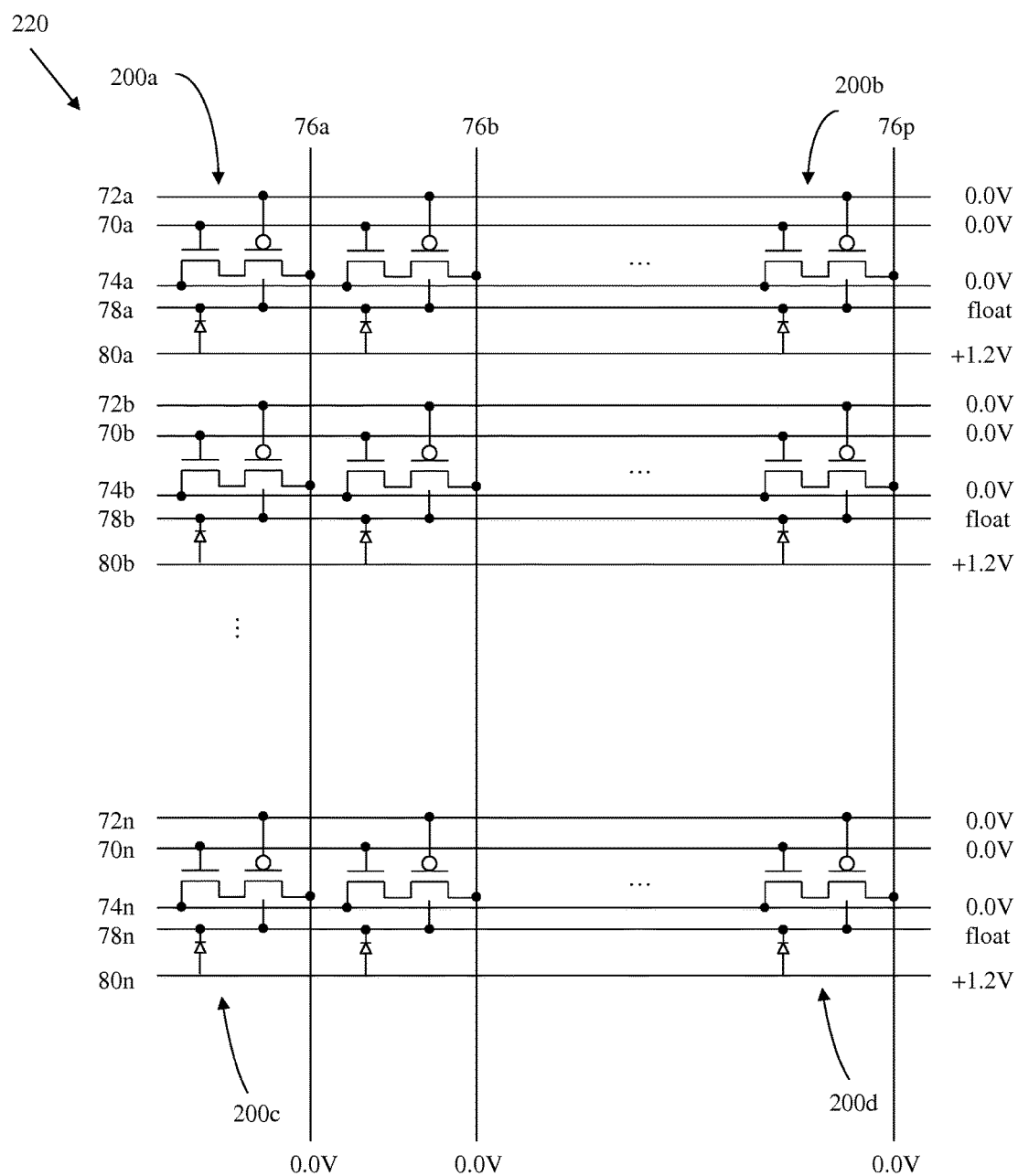
FIG. 34 schematically illustrates an alternative holding operation performed on a memory array according to an embodiment of the present invention.

FIG. 34 illustrates an alternative holding operation performed on memory array 220, according to an embodiment of the present invention. The holding operation is performed by applying a positive back bias to the SUB terminal 80, zero bias on the WL1 terminal 70, WL2 terminal 72, SL terminal 74, BL terminal 76, while leaving the BW terminal 78 floating. Under these conditions, if the memory cell 200 is in logic-1 state having a positive charge stored in the floating body region 24, the intrinsic silicon controlled rectifier (SCR) of memory cell 200, formed by the substrate 10, buried well region 30, floating body region 24, and the source line region 16 or the drain region 18, is turned on, thereby maintaining the positive charge on the floating body region 24. Memory cells in logic-0 state will remain in blocking mode, since the voltage of the floating body region 24 is not substantially positive and therefore floating body 24 does not turn on the SCR device. Accordingly, current does not flow through the SCR device and memory cell 200 maintains the logic-0 state. In this holding operation, all memory cells 200 commonly connected to the same SUB terminal will be maintained to accurately hold their data states.

In one embodiment, the following bias conditions are applied for the alternative holding operation: 0.0 volts is applied to WL1 terminal 70, WL2 terminal 72, SL2 terminal 74, BL terminal 76, a positive voltage like, for example, +1.2 volts is applied to SUB terminal 80, while the BW terminal 78 is left floating. In other embodiments, different voltages may be applied to the various terminals of memory cell 200 as a matter of design choice and the exemplary voltages described are not limiting in any way. Alternatively, the BW terminal 78 may be eliminated from the array 220, leaving the buried well region 30 floating.

Figure 35:
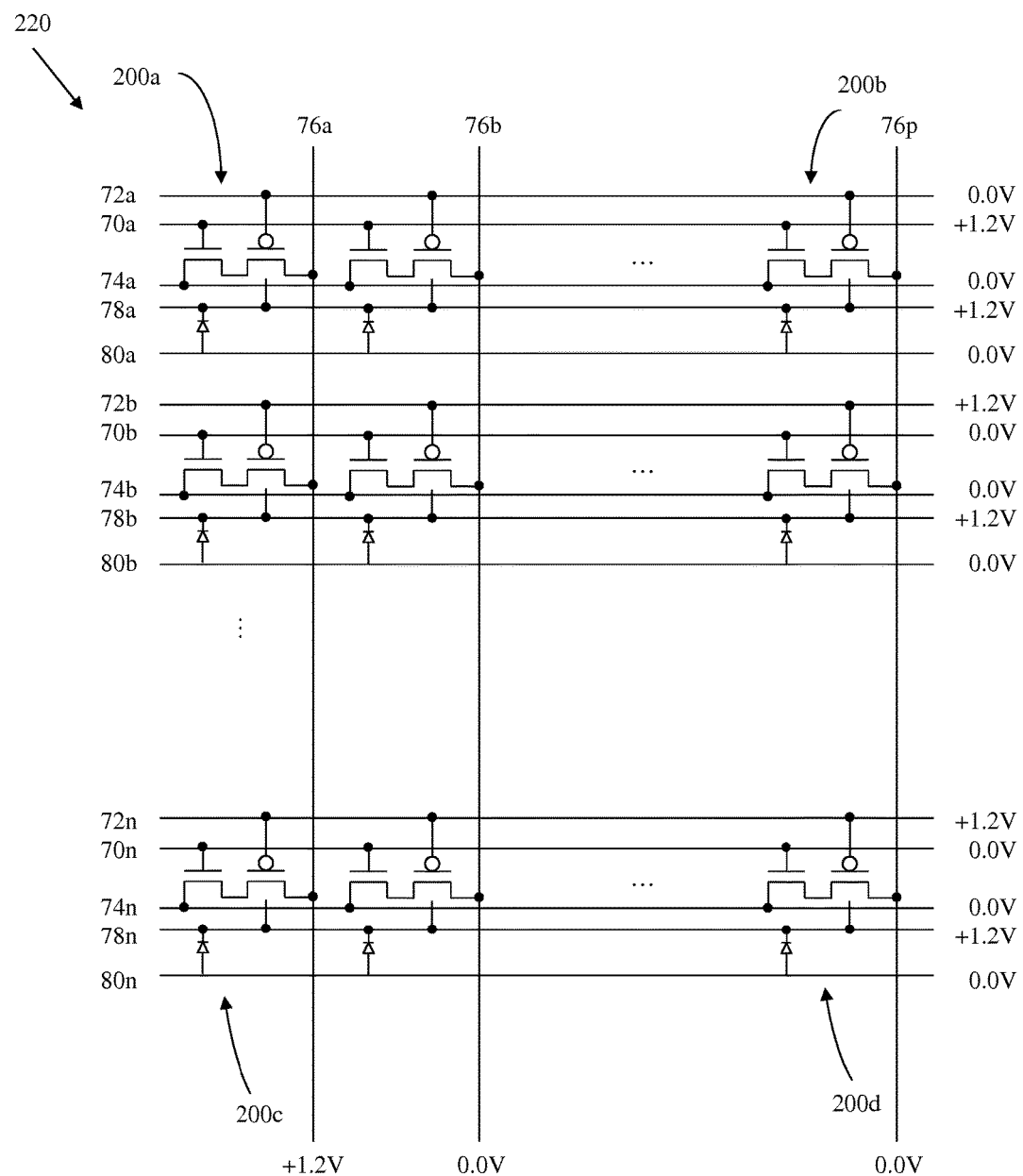
FIG. 35 schematically illustrates a read operation performed on a memory array according to an embodiment of the present invention.

FIG. 35 illustrates a read operation performed on memory array 220 according to an embodiment of the present invention. Any sensing scheme known in the art can be used with memory cell 200. The amount of charge stored in the floating body 24 can be sensed by monitoring the cell current of the memory cell 200. If memory cell 200 is in a logic-1 state having holes in the body region 24, then the memory cell will have a higher cell current (e.g. current flowing from the BL terminal 76 to SL terminal 74), compared to if cell 200 is in a logic-0 state having no holes in floating body region 24. A sensing circuit typically connected to BL terminal 76 can then be used to determine the data state of the memory cell.

The read operation for example can be performed on memory cell 200 by applying the following bias conditions: zero voltage is applied to the WL2 terminal 72, which turns on the access transistor 42, a positive voltage is applied to the BL terminal 76, zero voltage is applied to the SL terminal 74, zero or positive voltage is applied to the BW terminal 78, and zero voltage is applied to the SUB terminal 80. Positive voltage may also be applied to the WL1 terminal 70 to further enhance the current flowing through the memory cell 200, from the BL terminal 76 to the SL terminal 74. If memory cell 200 is in a logic-1 state having holes in the floating body region 24, then a higher current will flow from the BL terminal 76 to the SL terminal 74 of the selected memory cell 200, compared to if memory cell 200 is in a logic-0 state having no holes in the floating body region 24. In one particular embodiment, +1.2 volts is applied to the WL1 terminal 70, BL terminal 76, BW terminal 78, 0.0 volts is applied to the WL2 terminal 72, SL terminal 74, and SUB terminal 80. In other embodiments, different voltages may be applied to the various terminals of memory cell 200 as a matter of design choice and the exemplary voltages described are not limiting in any way.

The access transistor 42 is used to assist the selection of the memory cell 200 during the read operation. Because the access transistor 42 of the unselected memory cells in different rows (e.g. memory cells 200c and 200d) are turned off (through the application of a positive voltage applied on WL2 terminal 72), it will not pass the positive voltage applied to the BL terminal 76 to the drain region 18 of the floating body transistor 40. As a result, no current will flow through the floating body transistor 40 of the unselected memory cells in different rows.

The unselected memory cells in different columns (e.g. memory cells 200b and 200d) will not conduct current since zero bias is applied to both the BL terminal 76 and SL terminal 74.

Figure 36:
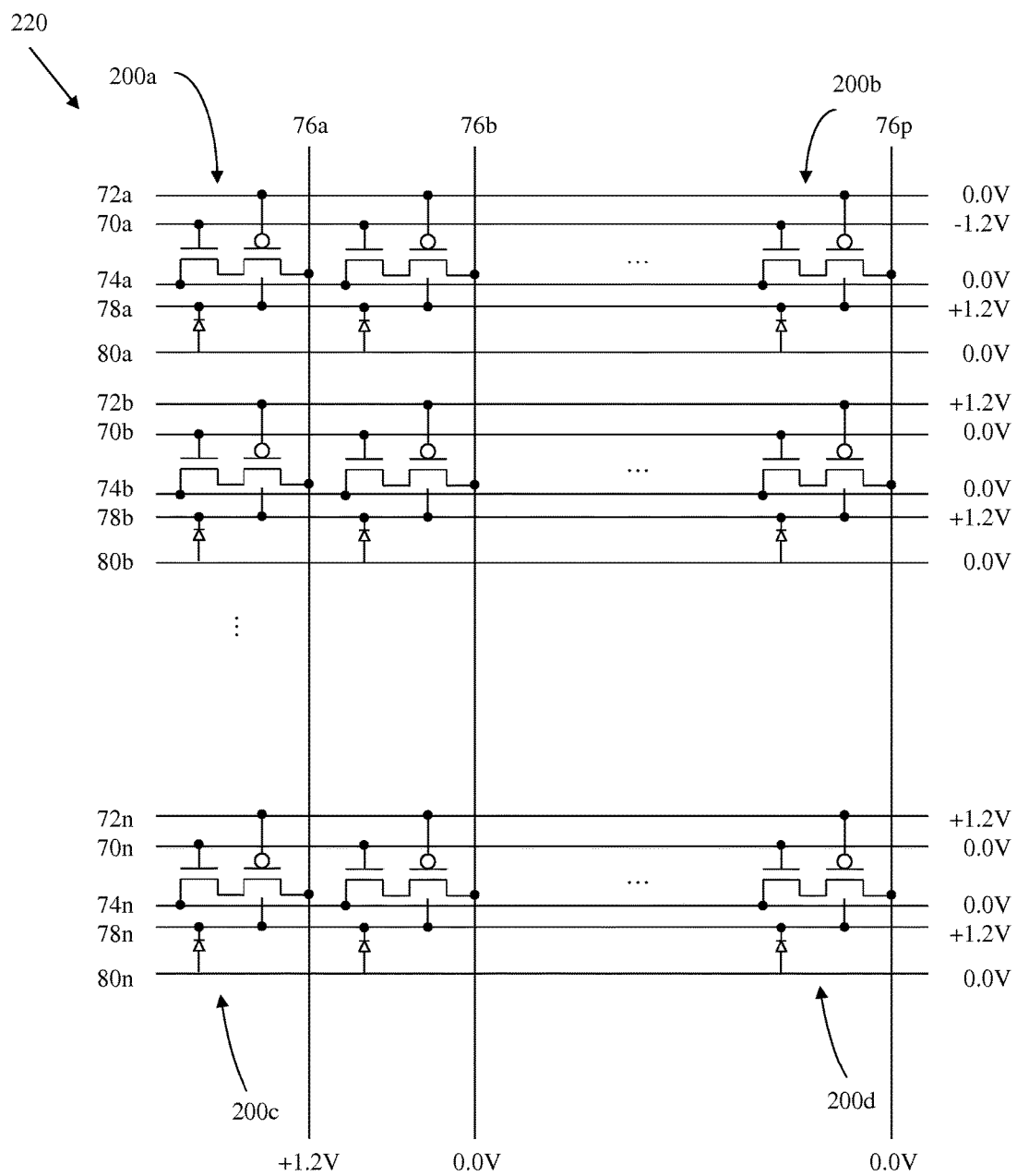
FIG. 36 schematically illustrates a write logic-1 operation using band-to-band tunneling mechanism performed on a memory array according to an embodiment of the present invention.

FIG. 36 illustrates a write logic-1 operation using band-to-band tunneling mechanism according to an embodiment of the present invention, where the following bias conditions are applied: zero voltage is applied to WL2 terminal 72, which turns on the access transistor 42 of the selected memory cell 200, a negative bias is applied to the WL1 terminal 70, a positive bias is applied to the BL terminal 76, zero bias is applied to the SL terminal 74, zero or positive bias is applied to the BW terminal 78, and zero bias is applied to the SUB terminal 80.

In one particular non-limiting embodiment, about 0.0 volts is applied to the selected WL2 terminal 72, about −1.2 volts is applied to the selected WL1 terminal 70, about +1.2 volts is applied to the selected BL terminal 76, about +1.2 volts is applied to the selected BW terminal 78, and about 0.0 volts is applied to the SUB terminal 80.

The zero voltage applied to the WL2 terminal 72 will turn on the p-type access transistor 42, which will pass the positive bias applied to the BL terminal 76 to the drain region 18 of the floating body transistor 40. The positive bias now present on the drain region 18 of the floating body transistor 40, along with the negative voltage applied to the WL1 terminal 70 (connected to the gate 60), will create a strong electric field around the junction area of the drain region 18 in the proximity of the gate 60. The strong electric field bends the energy band sharply upward near the gate and bit line junction overlap region, causing electrons to tunnel from the valence band to the conduction band, leaving holes in the valence band. The electrons which tunnel across the energy band become the drain leakage current, while the holes are injected into floating body region 24 and become the hole charge that creates the logic-1 state.

Figure 37:
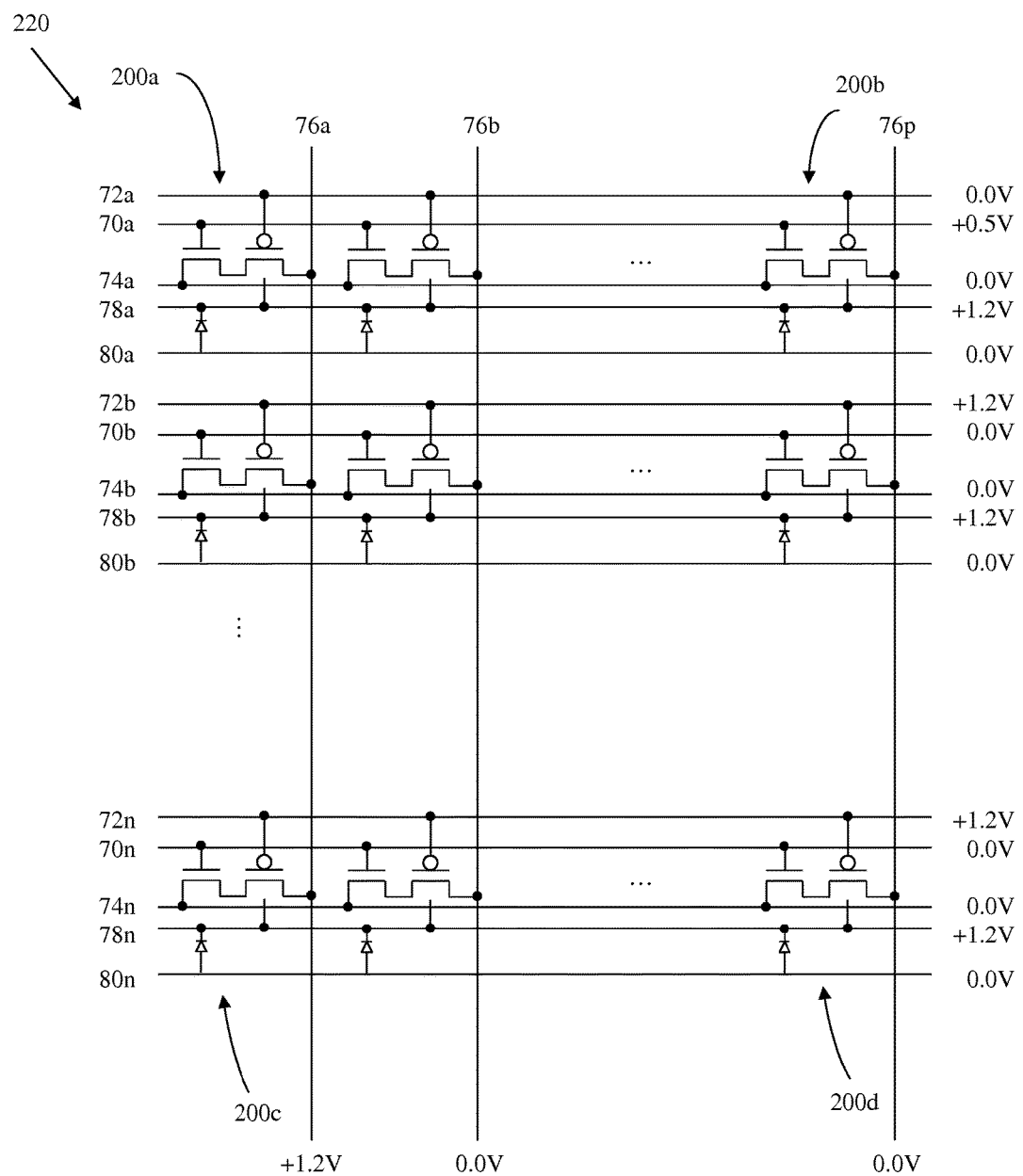
FIG. 37 schematically illustrates a write logic-1 operation using impact ionization mechanism performed on a memory array according to an embodiment of the present invention.

FIG. 37 illustrates exemplary bias conditions for a write logic-1 operation through an impact ionization mechanism, performed on the memory array 220 according to an embodiment of the present invention, where the following bias conditions are applied: zero voltage is applied to the selected WL2 terminal 72, a positive voltage is applied to the selected WL1 terminal 70, a positive voltage is applied to the selected BL terminal 76, zero voltage is applied to the SL terminal 74, zero or positive voltage is applied to the BW terminal 78, and zero voltage is applied to the SUB terminal 80. The positive voltage applied to the WL1 terminal 70 and the BL terminal 76 is configured to maximize hole generation through the impact ionization process, where the voltage on the drain region 18 of the floating body transistor 40 is typically greater than the voltage applied to the gate 60 (connected to the WL1 terminal 70) of the floating body transistor 40.

In one particular non-limiting embodiment, about 0.0 volts is applied to the selected WL2 terminal 72, about +0.5 volts is applied to the selected WL1 terminal 70, about +1.2 volts is applied to the selected BL terminal 76, about +1.2 volts is applied to the selected BW terminal 78, and about 0.0 volts is applied to the SUB terminal 80. These voltage levels are exemplary only may vary from embodiment to embodiment. Thus the exemplary embodiments, features, bias levels, etc., described are not limiting.

Figure 38:
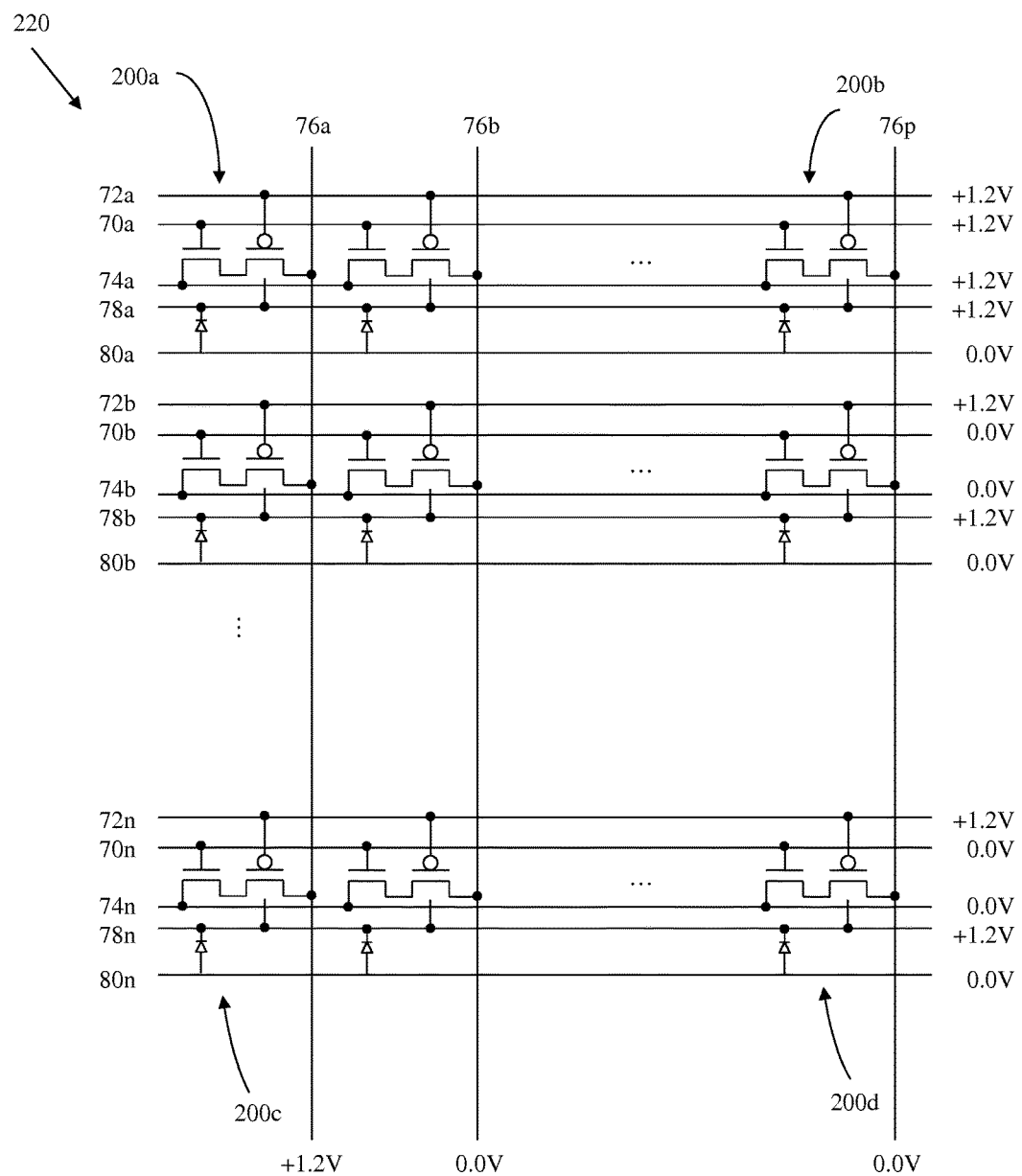
FIG. 38 schematically illustrates a write logic-1 operation through capacitive coupling performed on a memory array according to an embodiment of the present invention.

FIG. 38 illustrates exemplary bias conditions for a write logic-1 operation through capacitive coupling from the gate 60 of the floating body transistor 40 to the floating body region 24 according to an embodiment of the present invention, where the following bias conditions are applied: a positive voltage is applied to the selected WL2 terminal 72, a positive bias is applied to the selected BL terminal 76, a positive voltage is applied to the SL terminal 74, a positive voltage is applied to the BW terminal 78, and zero voltage is applied to the SUB terminal 80. The WL1 terminal 70 is initially grounded, and then its potential is increased to a positive voltage. The access transistor 42 of the selected memory cell is biased such that the source region 20 of the access transistor 42 is floating, for example by having the bias applied to the BL terminal 76 to be greater than the difference between the bias applied to the gate 64 and the threshold voltage of the access transistor 42. Because the channel region of the floating body transistor 40 is now floating, when the potential of the gate region 60 (connected to the WL1 terminal 70) is increased from zero (or negative voltage) to a positive voltage, the potential of the floating body region 24 will increase due to capacitive coupling. The positive bias applied to the buried well region 30 (through the BW terminal 78) will then generate holes through the impact ionization process, which maintains the positive charge of the floating body region 24.

In one particular non-limiting embodiment, about +1.2 volts is applied to the WL2 terminal 72, the voltage applied to the WL1 terminal is increased from 0.0 volts to about +1.2, about +1.2 volts is applied to the SL terminal 74, about +1.2 volts is applied to the BL terminal 76, about +1.2 volts is applied to the BW terminal 78, and about 0.0 volts is applied to the SUB terminal 80. These voltage levels are exemplary only may vary from embodiment to embodiment. Thus the exemplary embodiments, features, bias levels, etc., described are not limiting.

Figure 39:
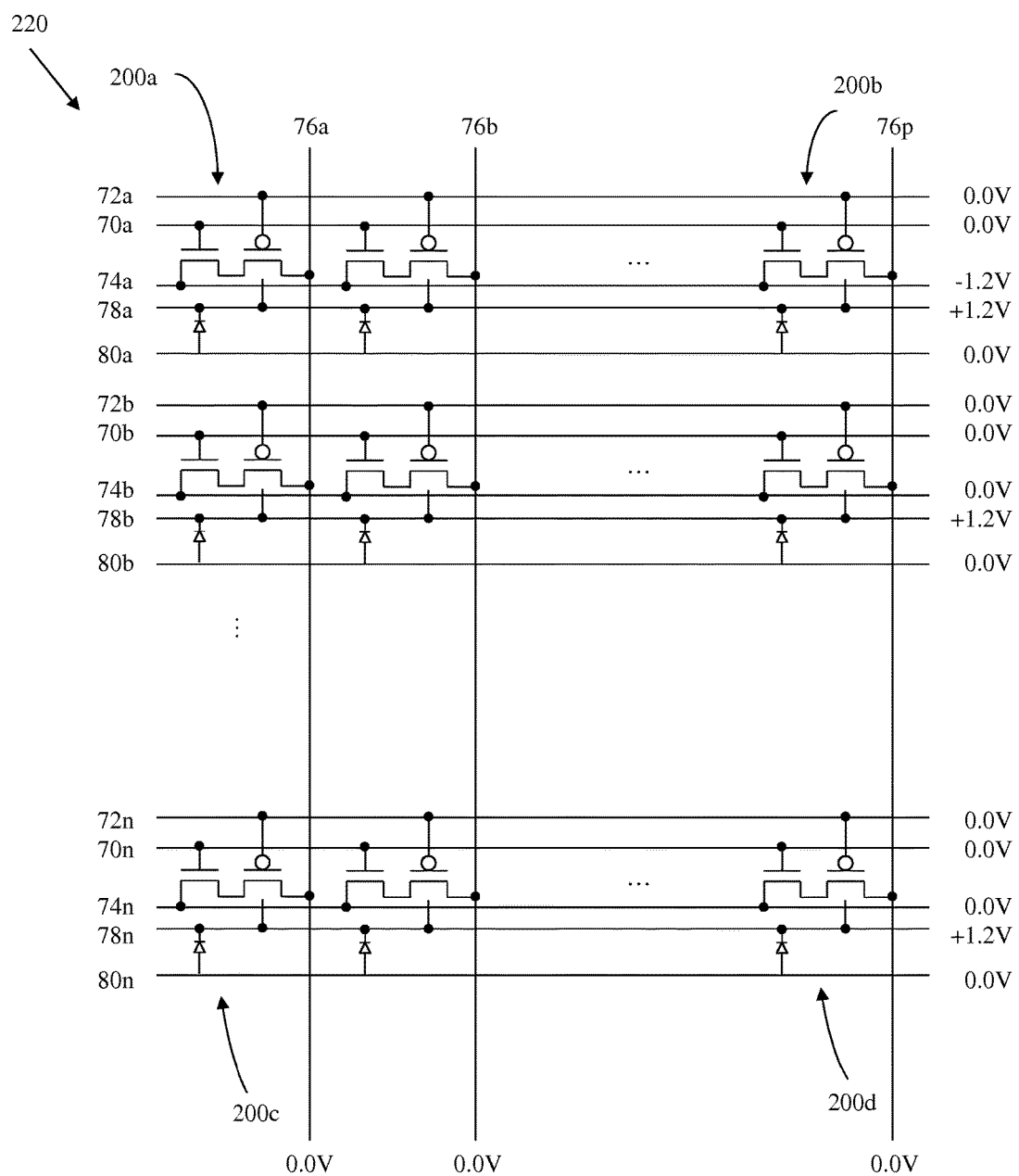
FIG. 39 schematically illustrates a write logic-0 operation performed on a memory array according to an embodiment of the present invention.

FIG. 39 illustrates exemplary bias conditions for a write logic-0 operation according to an embodiment of the present invention, by applying the following bias conditions: a negative voltage is applied to the SL terminal 74, zero voltage is applied to the WL1 terminal 70, BL terminal 76, and SUB terminal 80, zero or a positive voltage is applied to the WL2 terminal 72, and a positive bias to the BW terminal 78. Under these conditions, the p-n junction between the floating body 24 and the source line region 16 is forward-biased, evacuating holes from the floating body 24. All memory cells sharing the same SL terminal 74 will be written to simultaneously. To write arbitrary binary data to different memory cells 200, a write logic-0 operation is first performed on all the memory cells to be written, followed by one or more write logic-1 operations on the memory cells that must be written to logic-1.

In one particular non-limiting embodiment, about −1.2 volts is applied to the selected SL terminal 74, about 0.0 volts is applied to the WL1 terminal 70, BL terminal 76, and SUB terminal 80, about +1.2 volts is applied to the WL2 terminal 72, and about +1.2 volts is applied to the BW terminal 78. These voltage levels are exemplary only may vary from embodiment to embodiment. Thus the exemplary embodiments, features, bias levels, etc., described are not limiting.

Figure 40:
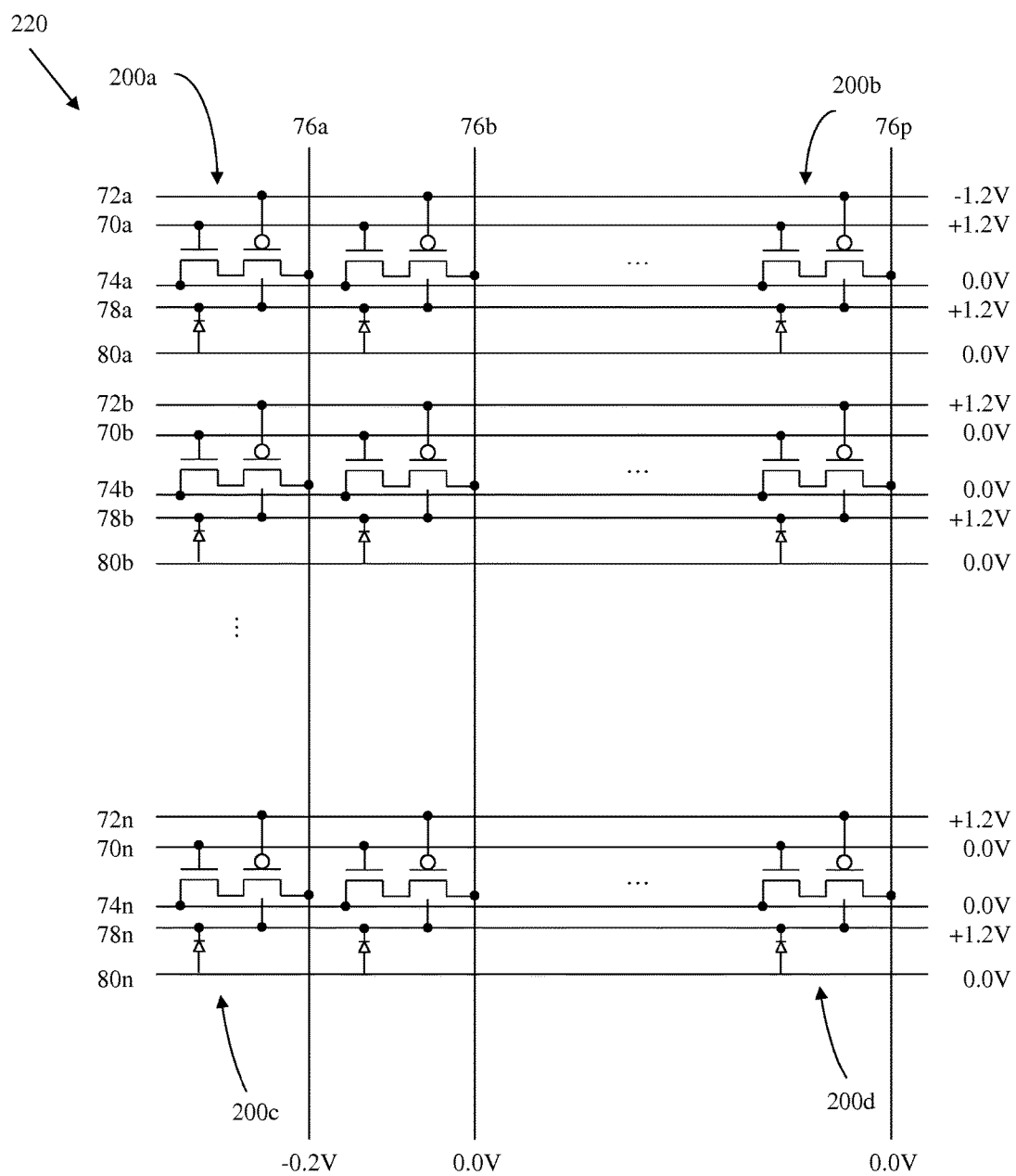
FIG. 40 schematically illustrates an alternative write logic-0 operation performed on a memory array according to an embodiment of the present invention.

FIG. 40 illustrates exemplary bias conditions for a write logic-0 operation according to another embodiment of the present invention by applying the following bias conditions: a negative voltage more negative than the voltage applied to the BL terminal 76 is applied to the WL2 terminal 72, a positive bias is applied to the WL1 terminal 70, a negative bias is applied to the BL terminal 76, zero voltage is applied to the SL terminal 74, a positive bias is applied to the BW terminal 78, and zero voltage is applied to the SUB terminal 80. Under these conditions, the access transistor 42 will pass the negative voltage applied on the BL terminal 76 to the drain region 18 of the floating body transistor 40, forward biasing the p-n junction between the floating body 24 and the drain region 18. A positive bias can also be applied to the gate 60 of the floating body transistor 40 (connected to the WL1 terminal 70), which will increase the potential of the floating body 24 through capacitive coupling, which in turn will increase the electric field across the p-n junction between the floating body 24 and the drain region 18. The negative bias applied to the BL terminal 76 and the bias applied to the WL2 terminal 72 are configured such that access transistors of the unselected cells 200 in different rows (for example, memory cells 200c and 200d) do not pass the negative bias to the drain region 18 of the floating body transistor 40.

In one particular non-limiting embodiment, about −1.2 volts is applied to the WL2 terminal 72, about +1.2 volts is applied to the WL1 terminal 70, about 0.0 volts is applied to the SL terminal 74, about −0.2 volts is applied to the BL terminal 76, about +1.2 volts is applied to the BW terminal 78, and about 0.0 volts is applied to the SUB terminal 80. These voltage levels are exemplary only may vary from embodiment to embodiment. Thus the exemplary embodiments, features, bias levels, etc., described are not limiting.

Figure 41:
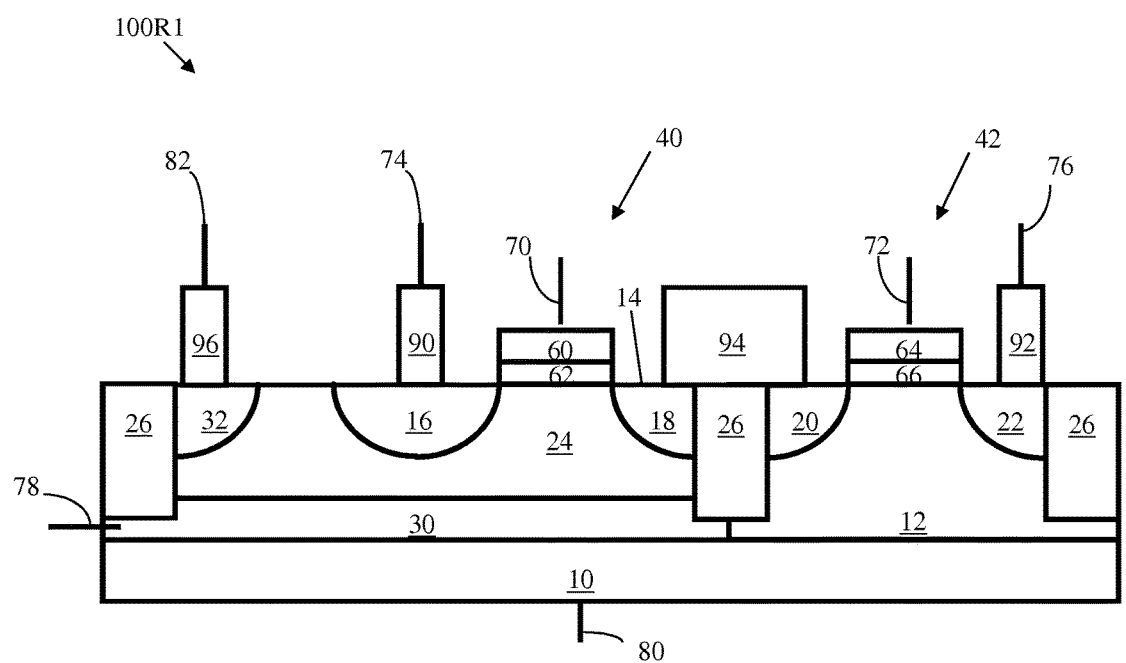
FIG. 41 is a schematic, cross-sectional illustration of a memory cell which can be used as a reference cell in sensing the state of a floating body memory cell according to an embodiment of the present invention.

A reference cell may be used in the sensing operation of the memory cells 100 and 200 described above. The properties (e.g. cell current) of the reference cell can be used to compare the properties of the memory cell being sensed to determine its logic state. FIG. 41 illustrates a schematic cross-sectional view of a reference cell 100R1. A corresponding reference cell for memory cell 200 can be constructed by having an access transistor having a different conductivity type as the floating body transistor and is not shown.

Figure 42:
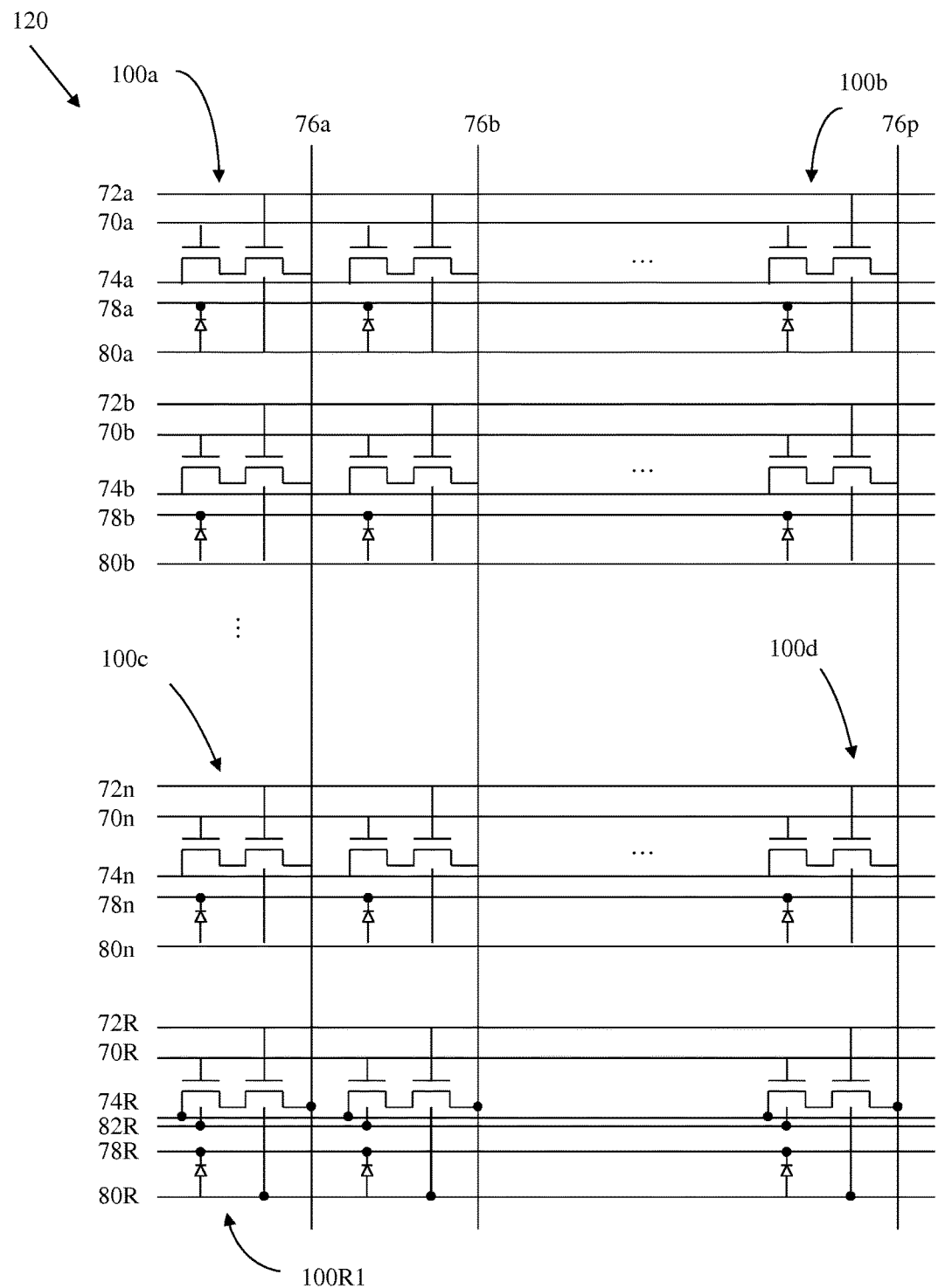
FIG. 42 schematically illustrates a memory array comprising multiple cells of the type shown in FIGS. 2A-2C and a reference cell of the type shown in FIG. 41.

Reference cell 100R1 comprises a sense line region 32 having the same conductivity type as the floating body region 24, which allows for an electrical connection to the floating body region 24 of the floating body transistor 40. The sense line region 32 is located in the same plane as the source and drain regions 16, 18, 20, and 22 of the floating body transistor 40 and the access transistor 42. The sense line region 32 can be connected to sense line terminal 82 as shown in FIG. 42, where the reference cell 100R1 is shown located in a row adjacent to a row of memory cells 100.

Figure 43A:
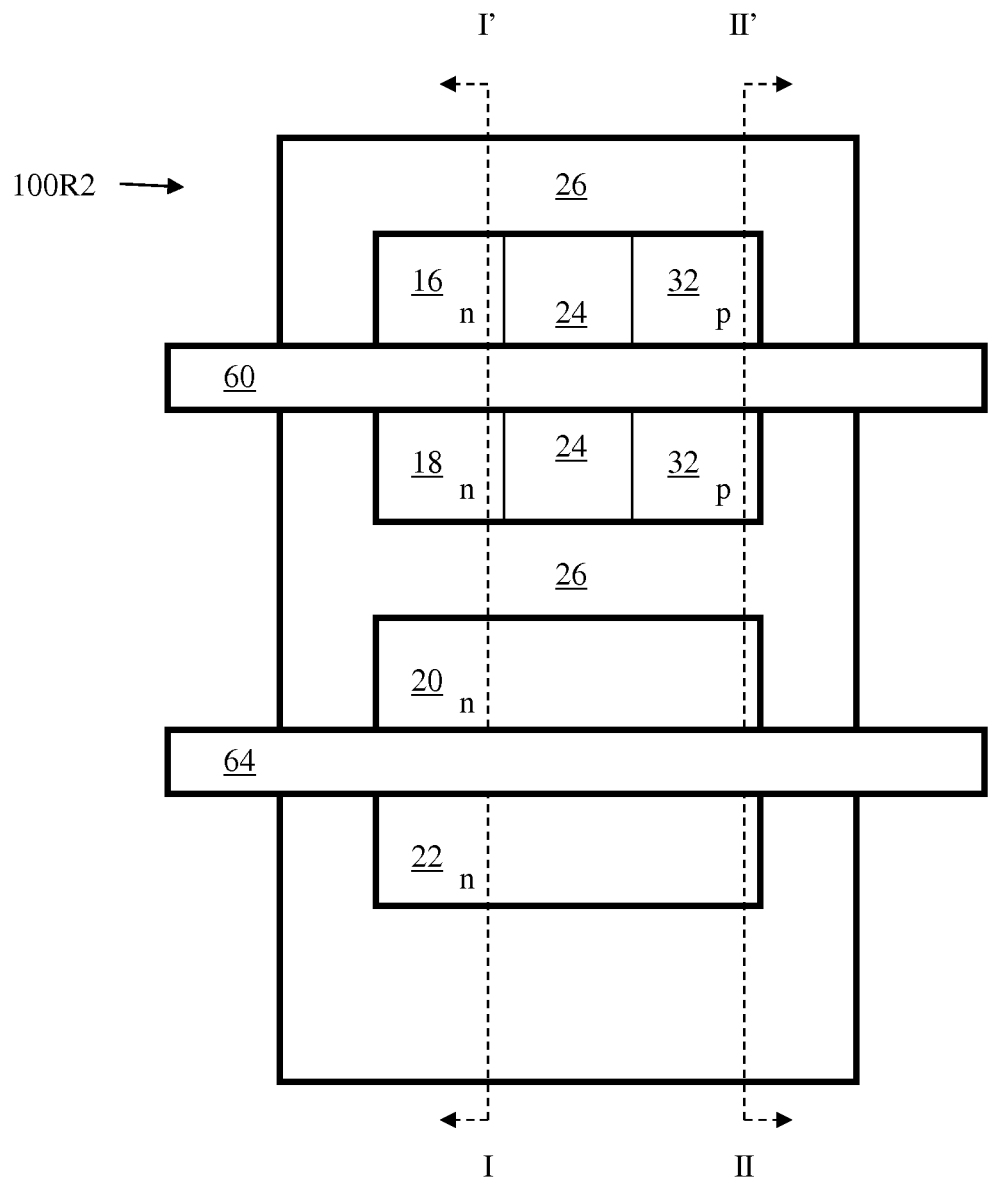
FIG. 43A is a schematic illustration of a top view of a reference cell according to another embodiment of the present invention.
Figure 43B:
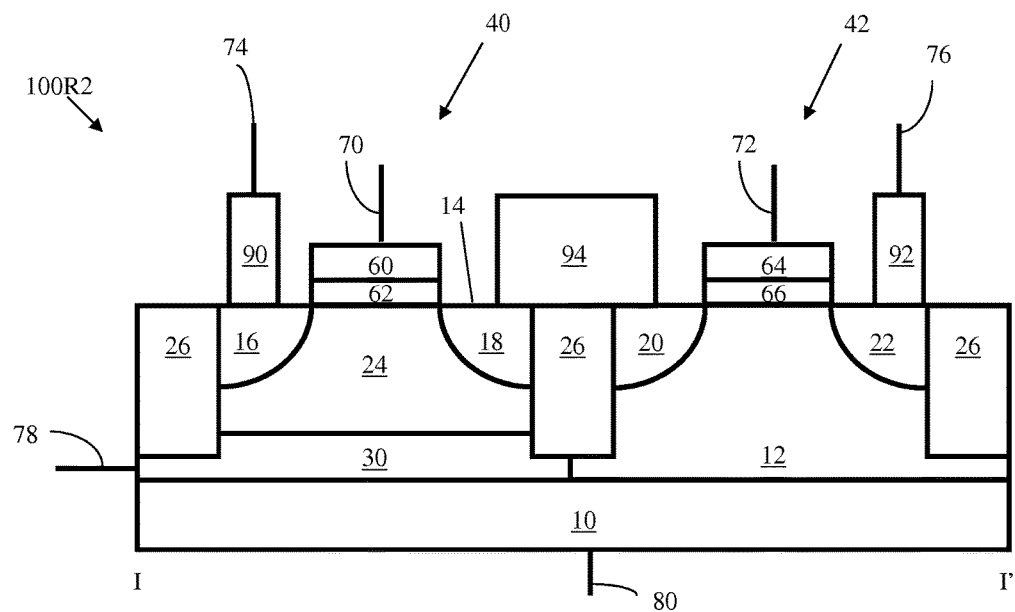
FIGS. 43B and 43C are schematic, cross-sectional illustrations of the cell of FIG. 43A taken along the I-I' and II-II' cut lines, respectively.
Figure 43C:
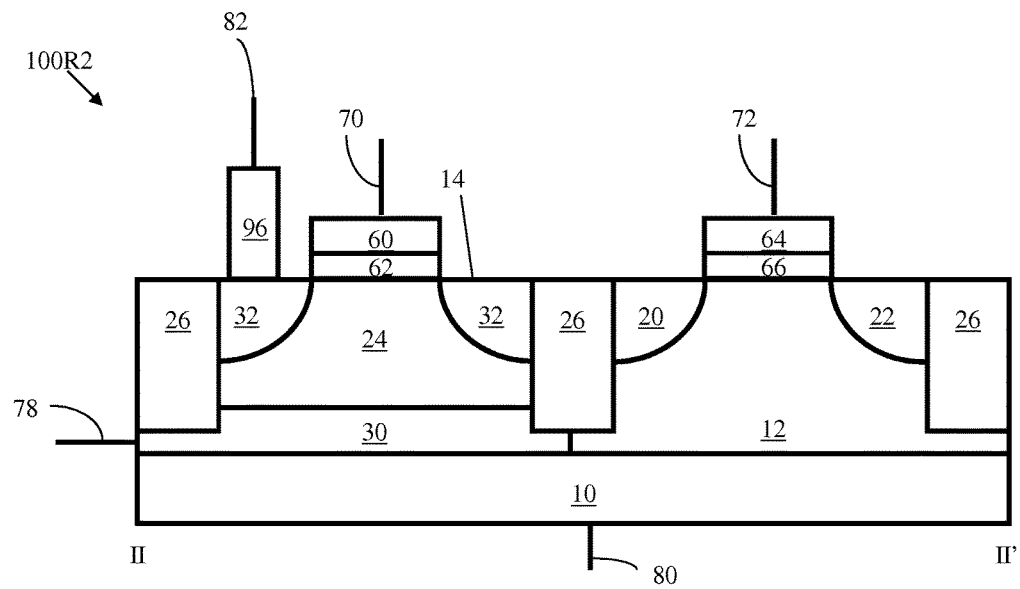

FIGS. 43A-43C illustrate reference cell 100R2 according to another embodiment of the present invention. FIG. 43A illustrates a schematic top-view illustration of the reference cell 100R2, while FIGS. 43B and 43C illustrate schematic cross-sectional views along the I-I' and II-II' cut lines of FIG. 43A. The sense region 32 in this embodiment is located adjacent to floating body transistor 40 of the memory cell 100 in a different plane from the plane that source and drain regions 16, 18, 20 and 22 are located along. The sense region 32 has the same conductivity type as the floating body region 24, and allows for an Ohmic contact to the floating body region 24.

Figure 44:
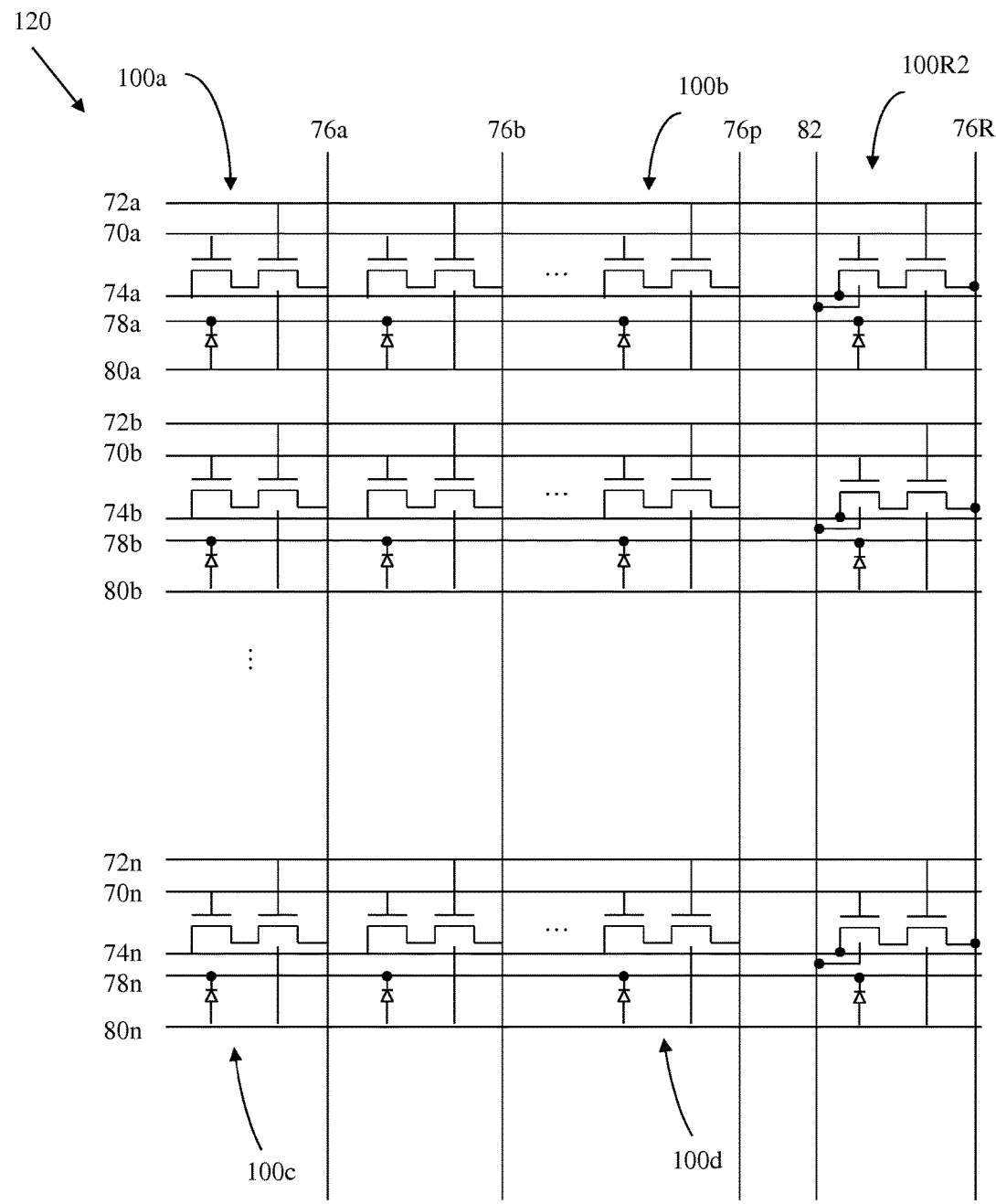
FIG. 44 schematically illustrates a memory array comprising multiple cells of the type shown in FIGS. 2A-2C and a reference cell of the type shown in FIGS. 43A-43C.

FIG. 44 illustrates a memory array 120 which contains reference cell 100R2, located in a column adjacent to a column of memory cells 100.

Figure 45:
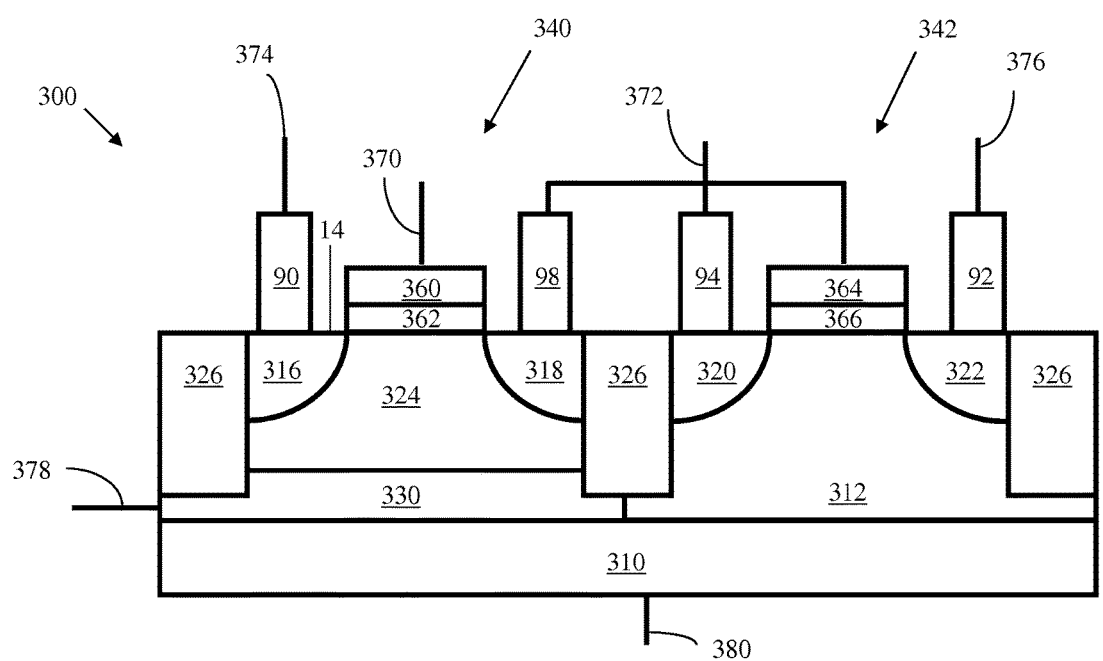
FIG. 45 is a schematic, cross-sectional illustration of a memory cell according to an embodiment of the present invention.

FIG. 45 illustrates memory cell 300 according to another embodiment of the present invention. Memory cell 300 comprises a floating body transistor 340 and an access transistor 342. Memory cell 300 includes a substrate 310 of a first conductivity type such as p-type, for example. Substrate 310 is typically made of silicon, but may also comprise, for example, germanium, silicon germanium, gallium arsenide, carbon nanotubes, or other semiconductor materials. In some embodiments of the invention, substrate 310 can be the bulk material of the semiconductor wafer. In other embodiments, substrate 310 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate 310 will usually be drawn as the semiconductor bulk material as it is in FIG. 45.

Floating body transistor 340 also comprises a buried layer region 330 of a second conductivity type, such as n-type, for example; a floating body region 324 of the first conductivity type, such as p-type, for example; and source or drain region 316 of the second conductivity type, such as n-type, for example; and sense line region 318 of the first conductivity type (same conductivity type as that of floating body region 324), such as p-type, for example.

Buried layer 330 may be formed by an ion implantation process on the material of substrate 310. Alternatively, buried layer 330 can be grown epitaxially on top of substrate 310.

The floating body region 324 of the first conductivity is bounded on top by surface 314, source line region 316, sense line region 318, and insulating layer 362, on the sides by insulating layer 326, and on the bottom by buried layer 330. Floating body 324 may be the portion of the original substrate 310 above buried layer 330 if buried layer 330 is implanted. Alternatively, floating body 324 may be epitaxially grown. Depending on how buried layer 330 and floating body 324 are formed, floating body 324 may have the same doping as substrate 310 in some embodiments or a different doping, if desired in other embodiments.

A gate 360 is positioned in between the source line region 316 and the sense region 318, above the floating body region 324. The gate 360 is insulated from the floating body region 324 by an insulating layer 362. Insulating layer 362 may be made of silicon oxide and/or other dielectric materials, including high-K dielectric materials, such as, but not limited to, tantalum peroxide, titanium oxide, zirconium oxide, hafnium oxide, and/or aluminum oxide. The gate 360 may be made of, for example, polysilicon material or metal gate electrode, such as tungsten, tantalum, titanium and their nitrides.

Insulating layers 326 (like, for example, shallow trench isolation (STI)), may be made of silicon oxide, for example, though other insulating materials may be used. Insulating layers 326 insulate floating body transistor 340 from adjacent floating body transistor 340 and adjacent access transistor 342. The bottom of insulating layer 326 may reside inside the buried region 330 allowing buried region 330 to be continuous as shown in FIG. 45. Alternatively, the bottom of insulating layer 326 may reside below the buried region 330 (similar to how the insulating layer 26 may reside below the buried region 30 of the memory cell 100 as shown in FIG. 2). This requires a shallower insulating layer (like 28 in FIG. 2), which insulates the floating body region 324, but allows the buried layer 330 to be continuous in the perpendicular direction of the cross-sectional view shown in FIG. 45. For simplicity, only memory cell 300 with continuous buried region 330 in all directions will be shown from hereon.

Access transistor 342 comprises a well region 312 of the first conductivity type, such as p-type, source region 320 and bit line region 322 of the second conductivity type, such as n-type. The well region 312 of the first conductivity type is electrically connected to the substrate region 310, and is therefore not floating. A floating gate 364 is positioned in between the source region 320 and the bit line region 322. The floating gate 364 is insulated from the well region 312 by an insulating layer 366 and is not connected to any terminals. The floating gate 364 is connected to the sense line region 318, which in turn is connected to the floating body region 324.

Insulating layer 366 may be made of silicon oxide and/or other dielectric materials, including high-K dielectric materials, such as, but not limited to, tantalum peroxide, titanium oxide, zirconium oxide, hafnium oxide, and/or aluminum oxide. The gate 364 may be made of, for example, polysilicon material or metal gate electrode, such as tungsten, tantalum, titanium and their nitrides.

The sense line region 318 of the floating body transistor 340 is connected to the floating gate 364 of the access transistor 342 through a conductive element 98. Conductive element 90 connects the source/drain region 316 of the floating body transistor 340 (which may be referred to as the source/drain region 316 of the memory device 300 interchangeably) to the bit line 1 (BL1) terminal 374, the conductive element 92 connects the bit line region 322 of the access transistor (which may be referred to as the bit line region 322 of the memory device 300 interchangeably) to the bit line 2 (BL2) terminal 376, while the conductive element 94 connects the source region 320 of the access transistor 342 to the source line (SL) terminal. The conductive elements 90, 92, 94, and 98 may be formed of, but are not limited to, tungsten or silicided silicon.

In addition to the SL terminal 372, BL1 terminal 374 and BL2 terminal 376, memory cell 300 also includes word line (WL) terminal 370, which is electrically connected to the gate 360 of the floating body transistor 340, buried well (BW) terminal 378, which is electrically connected to the buried well region 330 of the floating body transistor 340, and substrate (SUB) terminal 380, which is connected to the substrate region 310.

Figure 46:
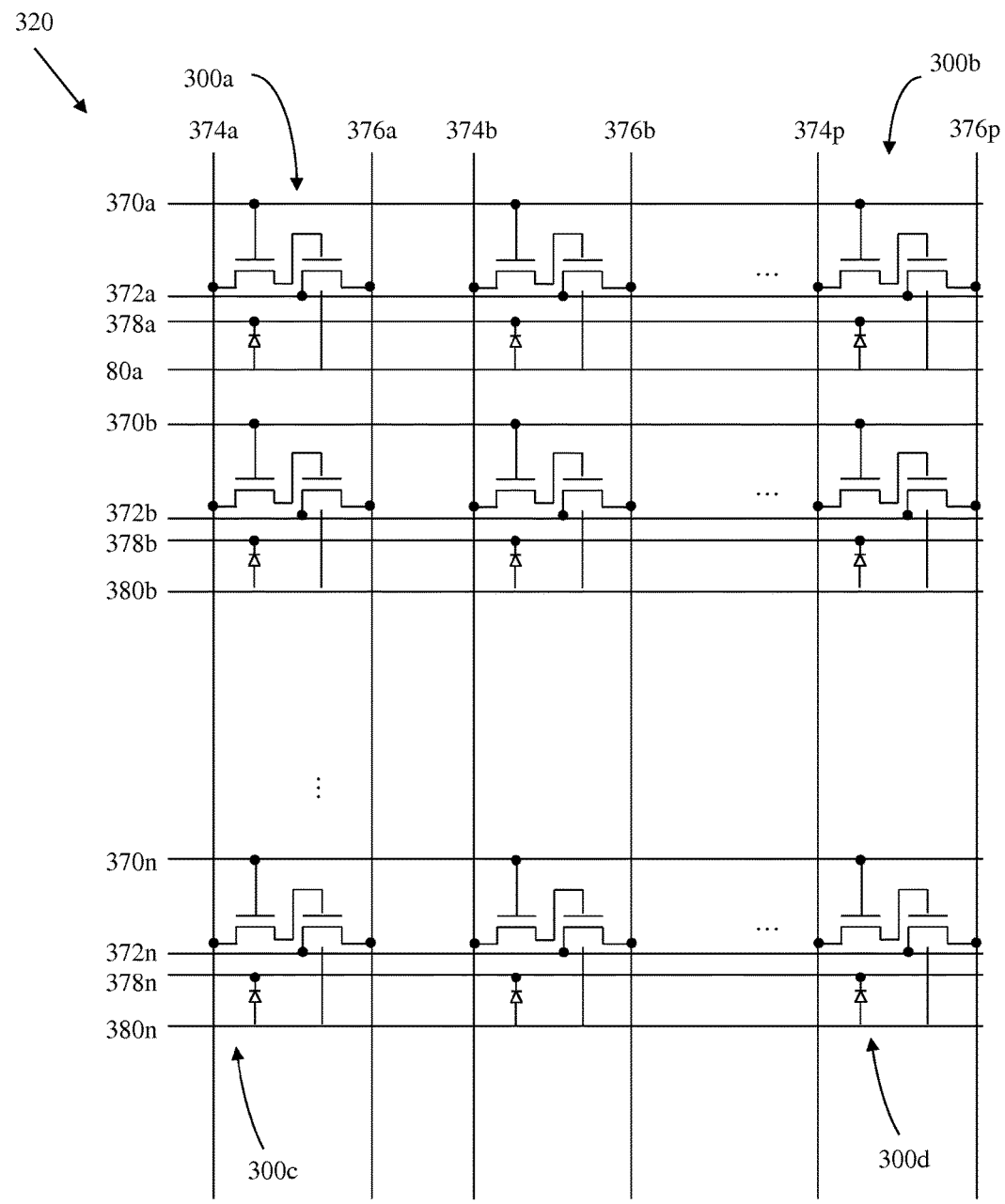
FIG. 46 schematically illustrates a memory array comprising multiple cells of the type shown in FIG. 45.

FIG. 46 shows an exemplary memory array 320 of memory cells 300, according to an embodiment of the present invention (including four exemplary instances of memory cell 300 being labeled as 300a, 300b, 300c, and 300d) arranged in rows and columns. In many, but not all, of the figures where exemplary array 320 appears, representative memory cell 300a will be representative of a "selected" memory cell 300 when the operation being described has one (or more in some embodiments) selected memory cells 300. In such figures, representative memory cell 300b will be representative of an unselected memory cell 300 sharing the same row as selected representative memory cell 300a, representative memory cell 300c will be representative of an unselected memory cell 300 sharing the same column as selected representative memory cell 300a, and representative memory cell 300d will be representative of a memory cell 300 sharing neither a row or a column with selected representative memory cell 300a.

Present in FIG. 46 are WL terminals 370a through 370n, SL terminals 372a through 372n, BL1 terminals 374a through 374p, BL2 terminals 376a through 376p, BW terminals 378a through 378n, SUB terminals 380a through 380n. Each of the WL, SL, and BW terminals are shown associated with a single row of memory cells 300 and each of the BL1 and BL2 terminals is associated with a single column of memory cells 300. Persons of ordinary skill in the art will appreciate that many other organizations and layouts of memory array 320 are possible, for example, only one common SUB terminal 380 is present throughout a segment of the memory array 320 or throughout the entire memory array 320. Similarly, other terminals may be segmented or buffered, while control circuits such as word decoders, column decoders, segmentation devices, sense amplifiers, write amplifiers, etc. may be arrayed around array 320 or inserted between sub-arrays of array 320. Thus the exemplary embodiments, features, design options, etc., described are not limiting in any way.

Lu et al. describes a two-transistor floating-body gate DRAM cell in "A Novel Two-Transistor Floating-Body/Gate Cell for Low-Power Nanoscale Embedded DRAM", Z. Lu et al., pp. 1511-1518, IEEE Transactions on Electron Devices, vol. 55, no. 6, June 2008 ("Lu-1") and "A Simplified Superior Floating-Body/Gate DRAM Cell", Z. Lu et al., pp. 282-284, IEEE Electron Device Letters, vol. 30, no. 3, March 2009 ("Lu-2"), which are hereby incorporated herein, in their entireties, by reference thereto.

The two-transistor memory cell described in Lu-1 and Lu-2 utilizes the floating body region as the charge storage region and operates similar to capacitor-less DRAMs as described in Okhonin-1 and Ohsawa-1. As a result, the two-transistor memory cell described by Lu-1 and Lu-2 has a limited data retention time, and requires a refresh operation.

The floating body transistor 340 in memory cell 300 is a bi-stable memory cell, where the two stable states are obtained through the application of a positive bias to the back-bias region 330 (connected to terminal 378), following similar principles as those of memory cells 100 and 200. The state of the floating body transistor 340 can be sensed through the properties of the access transistor 342, for example the cell current flowing from the BL2 terminal 376 to the SL terminal 372 of the access transistor 342. A positively charged floating body region 324 (i.e. logic-1 state) will turn on the access transistor 342, and as a result, the access transistor 342 will conduct a higher current compared to if the floating body region 324 is neutral (or low positive charge) state (i.e. logic-0 state).

Figure 47:
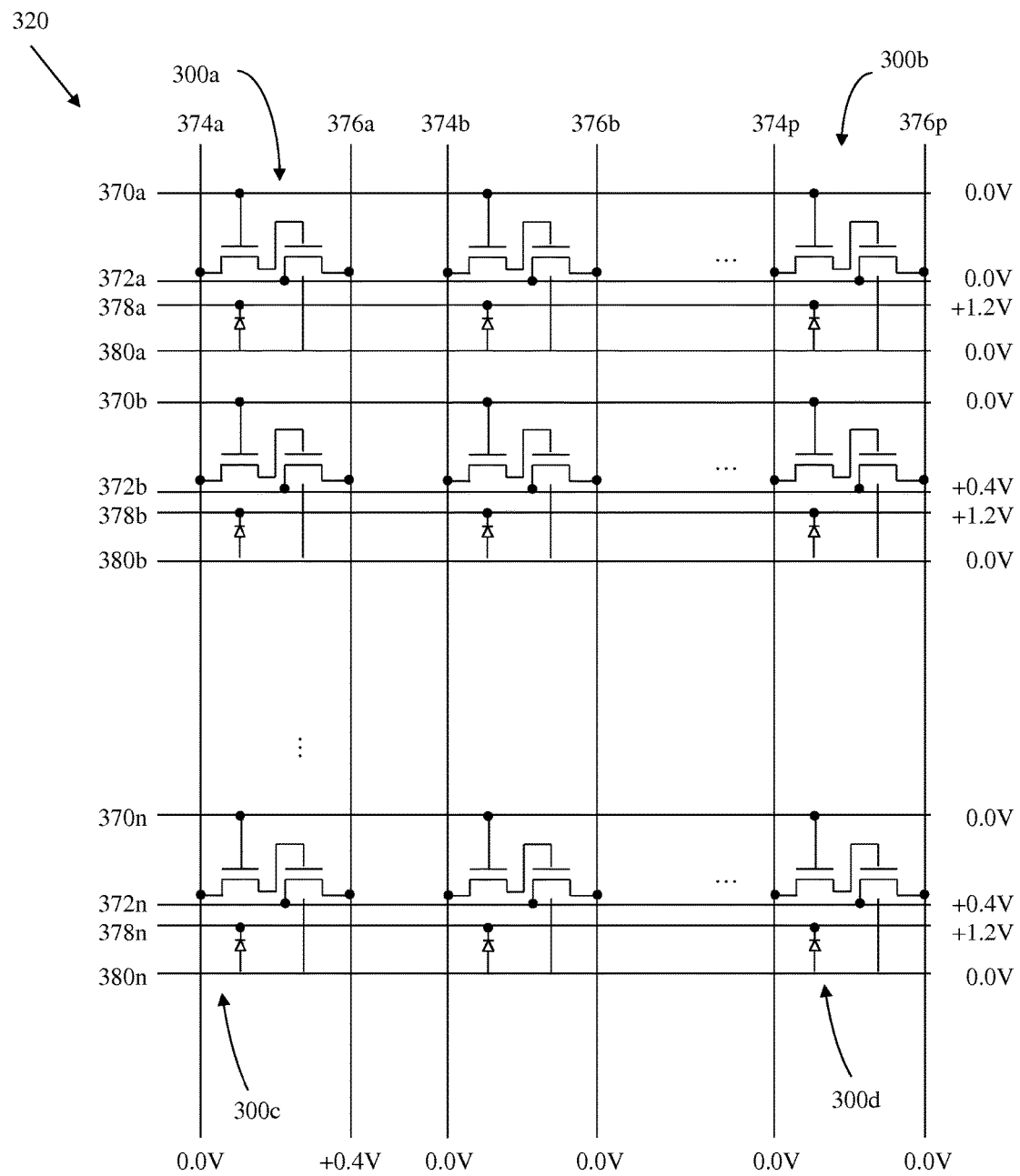
FIG. 47 schematically illustrates a read operation performed on a memory array according to an embodiment of the present invention.

FIG. 47 illustrates exemplary bias conditions for a read operation performed on the selected memory cell 300a in a memory array 320 according to an embodiment of the present invention: zero voltage is applied to WL terminal 370a, zero voltage is applied to BL1 terminal 374a, a positive voltage is applied to BL2 terminal 376a, zero voltage is applied to SL terminal 372a, zero or positive voltage is applied to the BW terminal 378, and zero voltage is applied to the SUB terminal 380a; while the following bias conditions are applied to the unselected terminals: zero voltage is applied to WL terminal 370, zero voltage is applied to BL1 terminal 374, zero voltage is applied to BL2 terminal 376, a positive voltage equal to the positive voltage applied to the selected BL2 terminal 376a is applied to the SL terminal 372 (alternatively, unselected SL terminals 372 are left floating), zero or positive voltage is applied to BW terminal 378, and zero voltage is applied to the SUB terminal 380.

In one particular non-limiting embodiment, the following bias conditions are applied to the selected terminals: about 0.0 volts is applied to the WL terminal 370, about 0.0 volts is applied to the SL terminal 372, about 0.0 volts is applied to the BL1 terminal 374, about +0.4 volts is applied to the BL2 terminal 376, about +1.2 volts is applied to the BW terminal 378, and about 0.0 volts is applied to the SUB terminal 380; while the following bias conditions are applied to the unselected terminals: about 0.0 volts is applied to the WL terminal 370, about +0.4 volts is applied to the SL terminal 372, about 0.0 volts is applied to the BL1 terminal 374, about 0.0 volts is applied to the BL terminal 376, about +1.2 volts is applied to the BW terminal 378, and about 0.0 volts is applied to the SUB terminal 380. These voltage levels are exemplary only may vary from embodiment to embodiment. Thus the exemplary embodiments, features, bias levels, etc., described are not limiting.

The writing operations of the floating body transistor 340 are similar to the operations of "half transistor memory cell" described by Y. Widjaja and Z. Or-Bach, for example in U.S. application Ser. No. 12/897,516, "A Semiconductor Memory Device Having an Electrically Floating Body Transistor" and U.S. application Ser. No. 12/897,538, "A Semiconductor Memory Device Having an Electrically Floating Body Transistor", which are hereby incorporated herein, in their entireties, by reference thereto.

Figure 48:
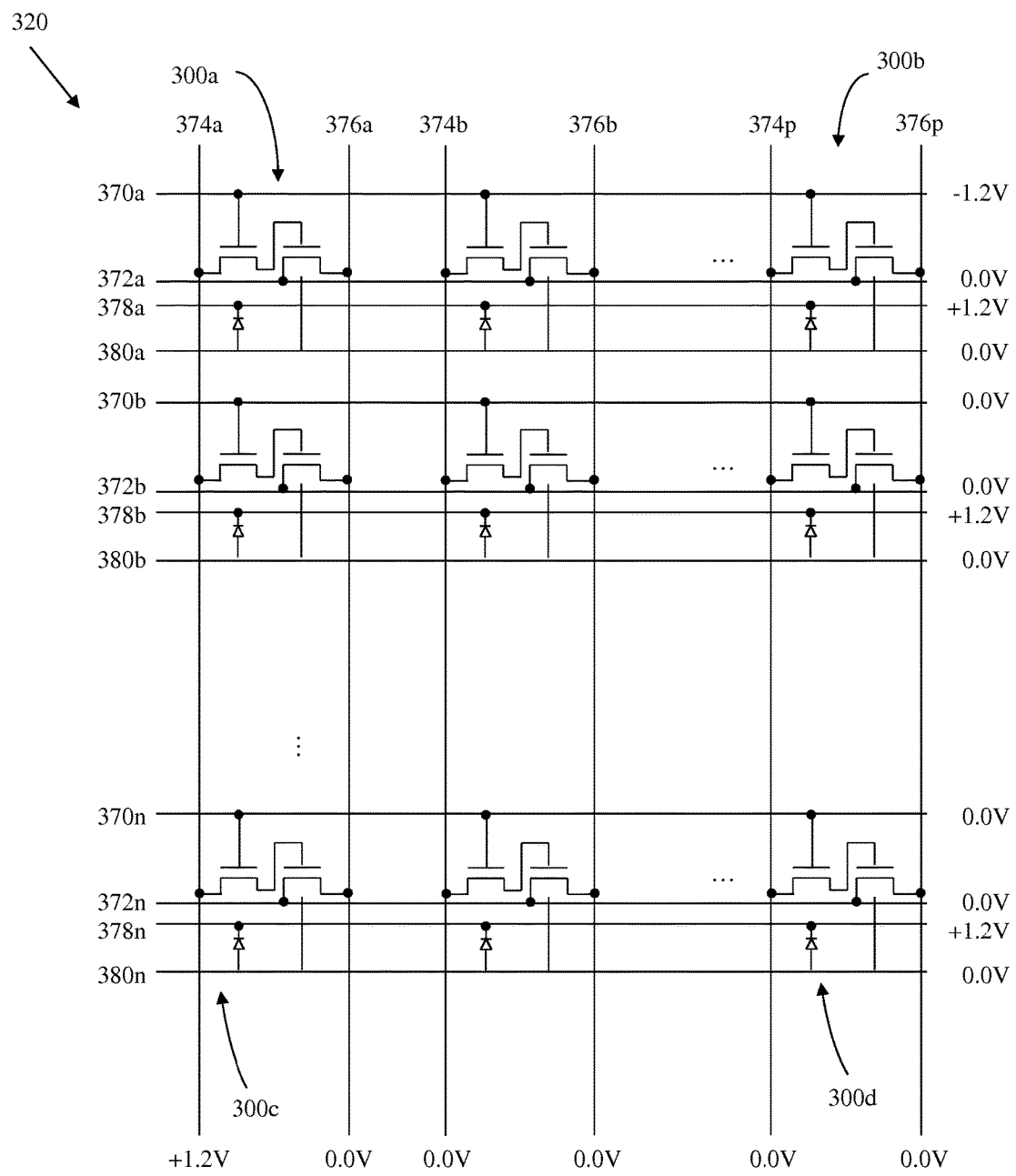
FIG. 48 schematically illustrates a write logic-1 operation using band-to-band tunneling mechanism performed on a memory array according to an embodiment of the present invention.

FIG. 48 illustrates exemplary bias conditions for a write logic-1 operation using band-to-band tunneling performed on the selected memory cell 300a in a memory array 320 according to an embodiment of the present invention: a negative voltage is applied to WL terminal 370a, a positive voltage is applied to BL1 terminal 374a, zero voltage is applied to BL2 terminal 376a, zero voltage is applied to SL terminal 372a, zero or positive voltage is applied to the BW terminal 378, and zero voltage is applied to the SUB terminal 380a; while the following bias conditions are applied to the unselected terminals: zero voltage is applied to WL terminal 370, zero voltage is applied to BL1 terminal 374, zero voltage is applied to BL2 terminal 376, zero voltage is applied to the SL terminal 374, zero or positive voltage is applied to BW terminal 378, and zero voltage is applied to the SUB terminal 380.

In one particular non-limiting embodiment, the following bias conditions are applied to the selected terminals: about −1.2 volts is applied to the WL terminal 370, about 0.0 volts is applied to the SL terminal 372, about +1.2 volts is applied to the BL1 terminal 374, about 0.0 volts is applied to the BL2 terminal 376, about +1.2 volts is applied to the BW terminal 378, and about 0.0 volts is applied to the SUB terminal 380; while the following bias conditions are applied to the unselected terminals: about 0.0 volts is applied to the WL terminal 370, about 0.0 volts is applied to the SL terminal 372, about 0.0 volts is applied to the BL1 terminal 374, about 0.0 volts is applied to the BL terminal 376, about +1.2 volts is applied to the BW terminal 378, and about 0.0 volts is applied to the SUB terminal 380. These voltage levels are exemplary only may vary from embodiment to embodiment. Thus the exemplary embodiments, features, bias levels, etc., described are not limiting.

Figure 49:
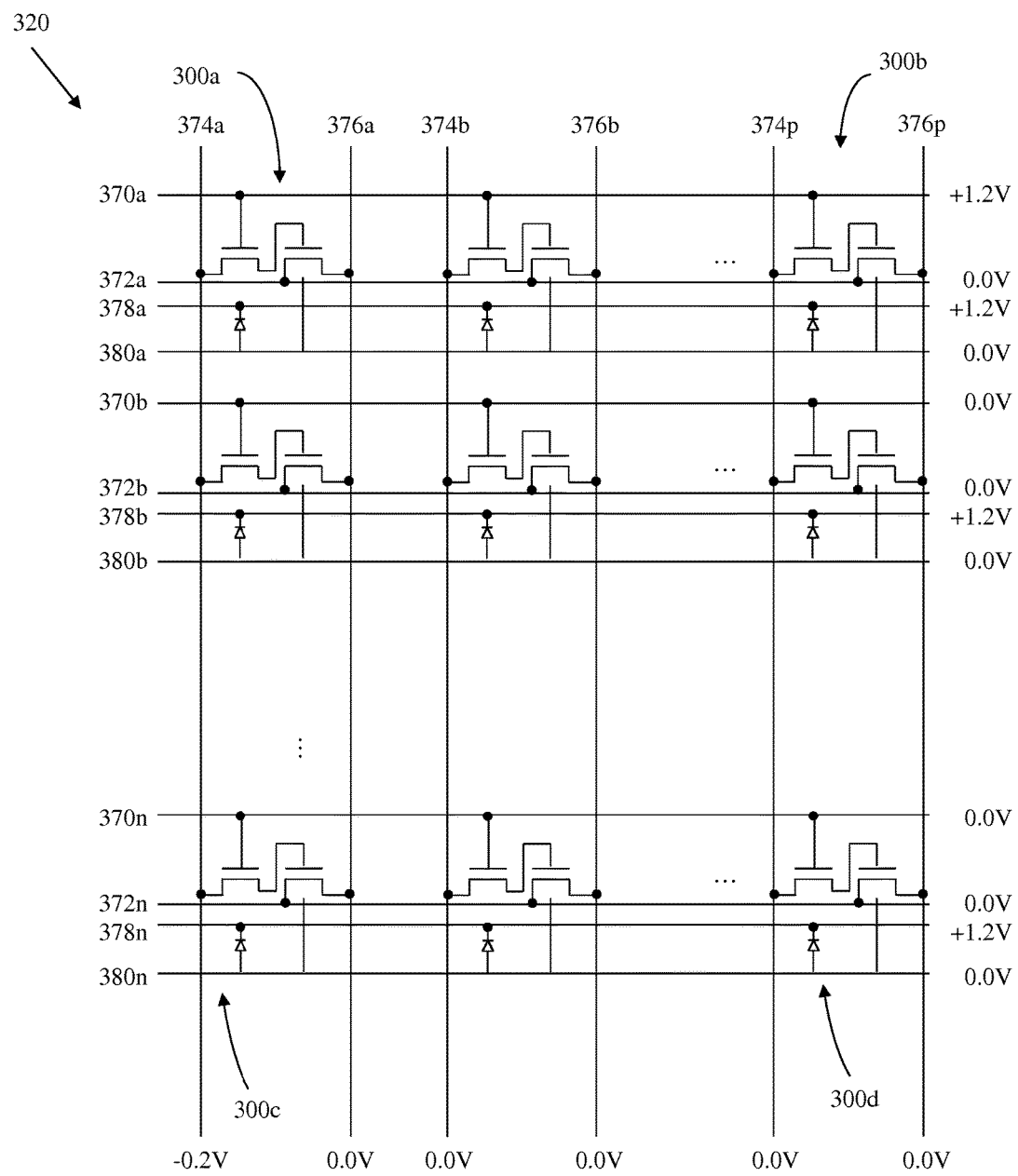
FIG. 49 schematically illustrates a write logic-0 operation performed on a memory array according to an embodiment of the present invention.

FIG. 49 illustrates exemplary bias conditions for a write logic-0 operation performed on the selected memory cell 300a in a memory array 320 according to an embodiment of the present invention: a positive voltage is applied to WL terminal 370a, a negative voltage is applied to BL1 terminal 374a, zero voltage is applied to BL2 terminal 376a, zero voltage is applied to SL terminal 372a, zero or positive voltage is applied to the BW terminal 378, and zero voltage is applied to the SUB terminal 380a; while the following bias conditions are applied to the unselected terminals: zero voltage is applied to WL terminal 370, zero voltage is applied to BL1 terminal 374, zero voltage is applied to BL2 terminal 376, zero voltage is applied to the SL terminal 374, zero or positive voltage is applied to BW terminal 378, and zero voltage is applied to the SUB terminal 380.

In one particular non-limiting embodiment, the following bias conditions are applied to the selected terminals: about +1.2 volts is applied to the WL terminal 370, about 0.0 volts is applied to the SL terminal 372, about −0.2 volts is applied to the BL1 terminal 374, about 0.0 volts is applied to the BL2 terminal 376, about +1.2 volts is applied to the BW terminal 378, and about 0.0 volts is applied to the SUB terminal 380; while the following bias conditions are applied to the unselected terminals: about 0.0 volts is applied to the WL terminal 370, about 0.0 volts is applied to the SL terminal 372, about 0.0 volts is applied to the BL1 terminal 374, about 0.0 volts is applied to the BL terminal 376, about +1.2 volts is applied to the BW terminal 378, and about 0.0 volts is applied to the SUB terminal 380. These voltage levels are exemplary only may vary from embodiment to embodiment. Thus the exemplary embodiments, features, bias levels, etc., described are not limiting.

Figure 50:
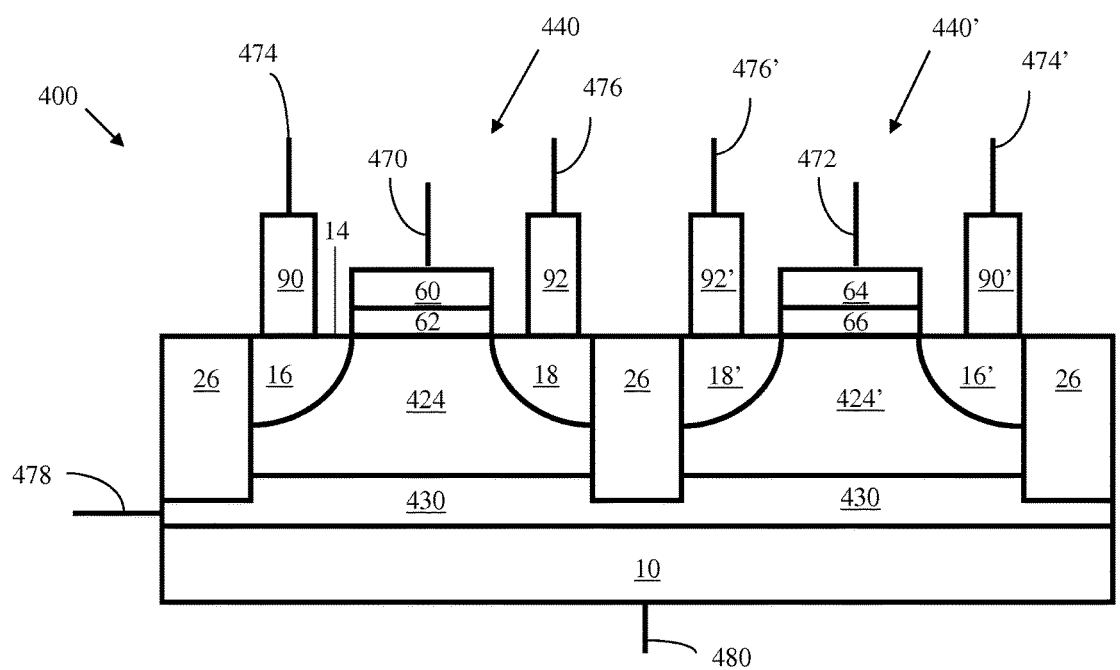
FIG. 50 is a schematic, cross-sectional illustration of a memory cell according to an embodiment of the present invention.

FIG. 50 illustrates memory cell 400 according to another embodiment of the present invention. Memory cell 400 comprises two bi-stable floating body transistors 440 and 440', which store complementary charges on the corresponding floating body regions 424 and 424'. Thus, if floating body transistor 440 is in logic-0 state, the floating body transistor 440' is in logic-1 state, and vice versa. The complementary floating body charges will result in complementary states of the BL terminal 474 and the $\overline{BL}$ terminal 474'. The pair of BL and $\overline{BL}$ terminals can then be used to determine the state of the memory cell 400. Both floating body transistors 440 and 440' are bi-stable floating body transistors through the application of a positive back bias to the buried well region 430 (connected to the BW terminal 478), following the same principle as memory cells 100 and 200.

Figure 51:
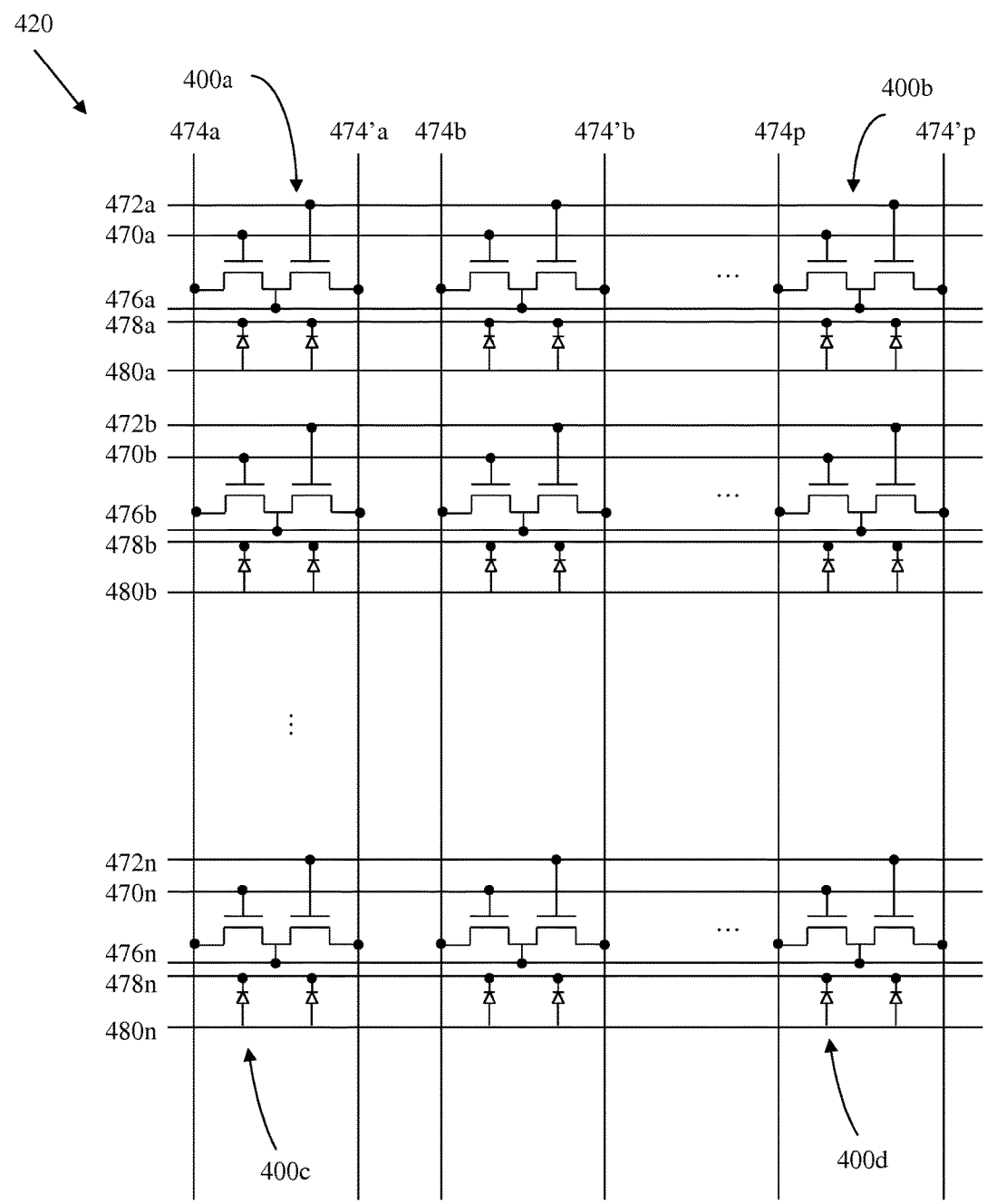
FIG. 51 schematically illustrates a memory array comprising multiple cells of the type shown in FIG. 50.
Figure 52:
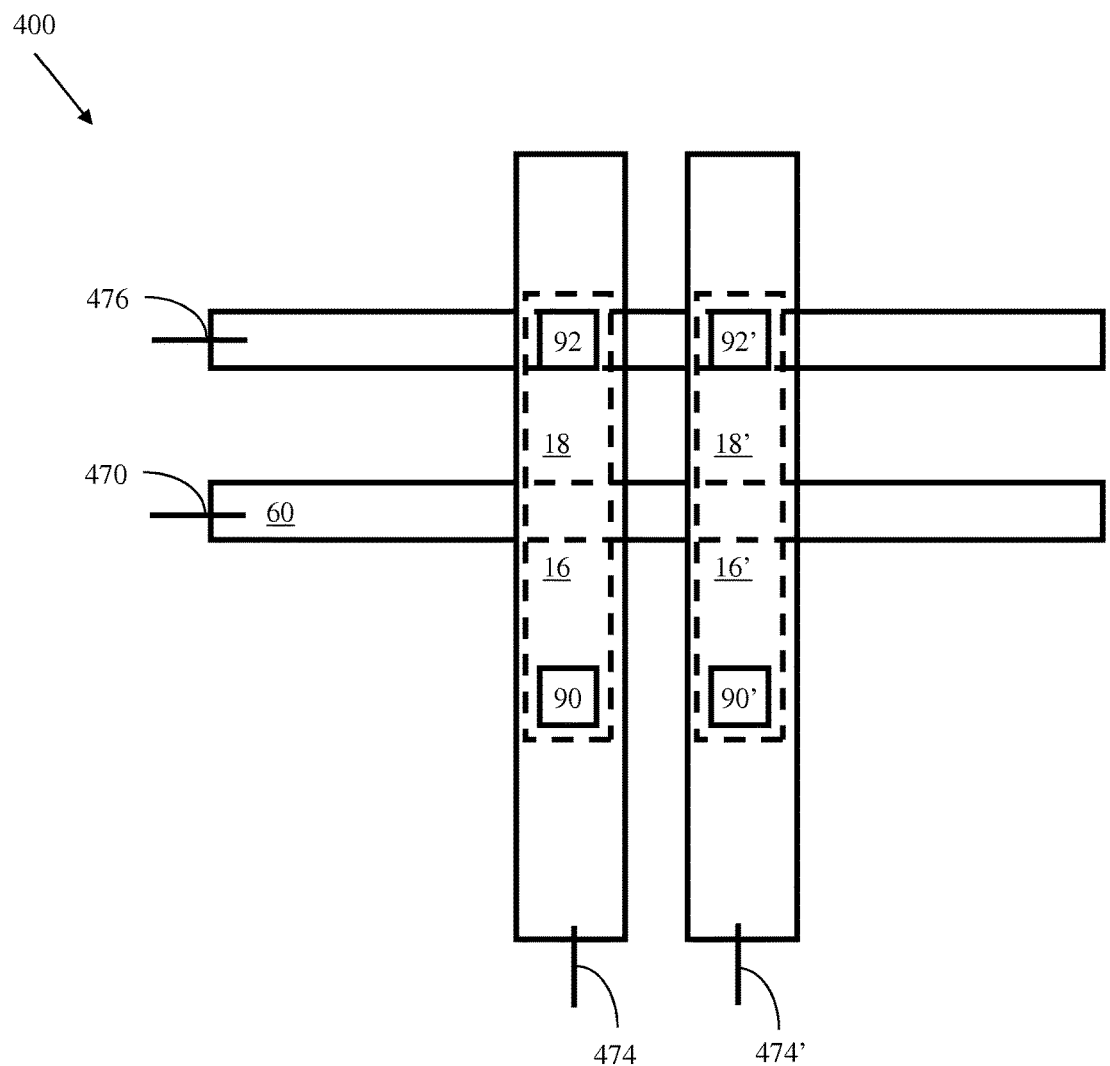
FIG. 52 is a schematic, top view illustration of a memory cell of the type shown in FIG. 50.

FIG. 51 illustrates an exemplary memory array 420 comprising memory cells 400, according to an embodiment of the present invention. Present in FIG. 51 are WL terminals 470*a* through 470*n* connected to the gate regions 60, WL terminals 472*a* through 472*n* connected to the gate regions 64, SL terminals 476*a* through 476*n* connected to both the source line regions 18 and 18' of the floating body transistors 440 and 440', BL terminals 474*a* through 474*p* connected to the drain regions 16 of the floating body transistors 440, $\overline{BL}$ terminals 474'*a* through 474'*p* connected to the drain regions 16' of the floating body transistors 440', BW terminals 478*a* through 478*n* connected to the buried well regions 430, and SUB terminals 480*a* through 480*n*. In the exemplary memory array 420 shown in FIG. 51, the source line regions 18 and 18' of the floating body transistors 440 and 440' are connected to the same SL terminal 372. However, each of the source line regions 18 and 18' may be connected to separate terminals, for example SL terminal 476 and $\overline{SL}$ terminal 476'. Similarly, the exemplary memory array 420 shows that the gate regions 60 and 64 are connected to separate WL terminals 470 and 472. In an alternate embodiment, the gate regions 60 and 64 may be connected to the same WL terminals. FIG. 52 illustrates a schematic top-view of the memory cell 400 where the gate regions of the floating body transistors 440 and 440' are joined together, where connections between conductive materials 90 and 90' to the BL terminal 474 and $\overline{BL}$ terminal 474' may be made through metal lines, for example aluminum or copper. Similarly, connections between conductive materials 92 and 92' to the SL terminal 476 may be made through metal conductive lines, for example aluminum or copper.

Figure 53:
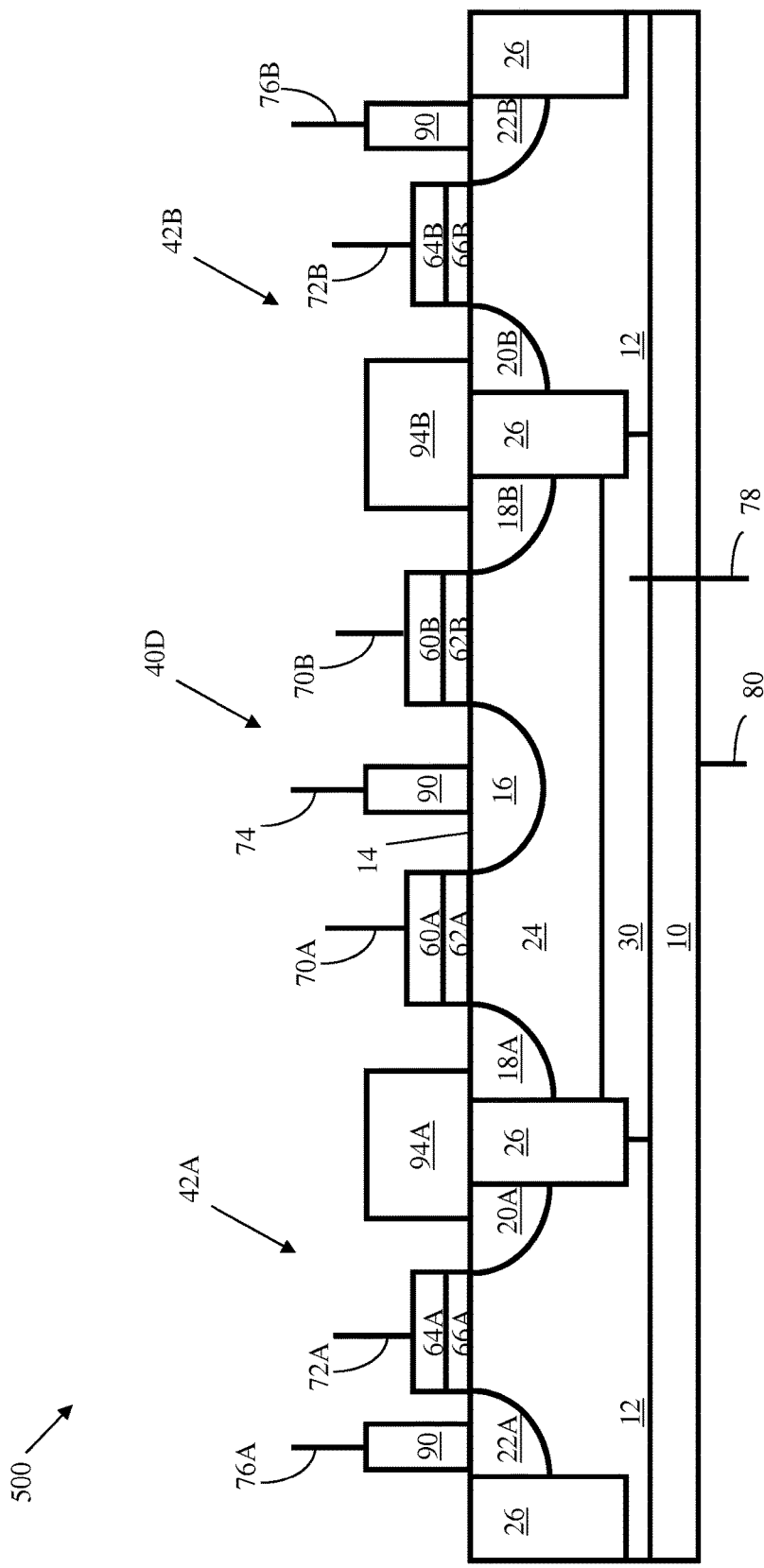
FIG. 53 is a schematic illustration of a dual-port memory cell in which a dual-port floating body transistor is connected in series to two access transistors, according to another embodiment of the present invention.

FIG. 53 illustrates a dual-port memory cell 500, according to another embodiment of the present invention, where the state of the memory cell 500 is stored in dual-port floating body transistor 40D, and transistors 42A and 42B function as the access transistors of the dual-port memory cell 500. The operation and structure of dual-port floating body transistor 40D have been described, for example in U.S. Patent Application Publication No. 2012/0120752, titled "Dual-Port Semiconductor Memory and First-In First-Out (FIFO) Memory Having Electrically Floating Body Transistor" ("Widjaja-5"), which is hereby incorporated herein, in its entirety, by reference thereto. The state of the memory cell 500 is stored in the floating body region 24 of the dual-port floating body transistor 40D.

Memory cell 500 further includes a word line #1A (WL1A) terminal 70A electrically connected to gate 60A, a word line #1B (WL1B) terminal 70B electrically connected to gate 60B, a word line #2A (WL2A) 72A electrically connected to gate 64A, a word line #2B (WL2B) 72B electrically connected to gate 64B, a source line (SL) terminal 74 electrically connected to region 16, a bit line #1 (BL1) terminal 76A electrically connected to the region 22A, a bit line #2 (BL2) terminal 76B electrically connected to the region 22B, a buried well (BW) terminal 78, which is electrically connected to the buried well region 30 of the dual-port floating body transistor 40D, and substrate (SUB) terminal 80, which is connected to the substrate region 10. WL1A terminal 70A, WL2A terminal 72A, and BL1 terminal 76A also may be referred to as 'port #1', while WL1B terminal 70B, WL2B terminal 72B, and BL2 terminal 76B also may be referred to as 'port #2'.

The dual-port floating body transistor 40D is connected in series to the access transistors 42A and 42B. The drain region 18A of the floating body transistor 40D is connected to the source region 20A of the access transistor 42A of the port #1 through a conductive element 94A. Similarly, the drain region 18B of the floating body transistor 40D is connected to the source region 20B of the access transistor 42B of the port #2 through conductive element 94B.

Access to the memory cell 500, i.e. read and write operations to the memory cell 500, may be performed independently by port #1 and/or port #2 irrespective of timing.

As described in Widjaja-5, a multi-port floating body transistor may also be formed in place of the dual-port floating body transistor 40D by forming additional source or drain regions and positioning an additional gate(s) above the surface and in between the source and drain regions. For an n-port memory cell, the number of gates and the number of bit lines of the floating body transistor are equal to n, while the number of regions of the second conductivity type (i.e. the source or drain regions) of the floating body transistor is equal to (n+1). All regions of a second conductivity type and gates in a multi-port memory cell will be coupled to the same floating body region 24. Correspondingly, for an n-port memory cell, the number of access transistors is equal to n.

From the foregoing it can be seen that a memory cell comprising two transistors, for example a floating body transistor and an access transistor in series, a floating body transistor and a floating gate transistor, or two floating body transistors storing complementary charges, has been described. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:
1. A semiconductor memory cell comprising:
a bi-stable floating body transistor comprising a back-bias region configured to generate impact ionization when said memory cell is in one of first and second states, and wherein said back-bias region is configured so as not to generate impact ionization when the memory cell is in the other of said first and second states; and
an access device;
wherein said bi-stable floating body transistor and said access device are electrically connected in series.

2. The semiconductor memory cell of claim 1, wherein said access device comprises a metal-oxide-semiconductor transistor.

3. The semiconductor memory cell of claim 2, wherein said access transistor is of the same conductivity type as said bi-stable floating body transistor.

4. The semiconductor memory cell of claim 2, wherein said access transistor has a conductivity type different from a conductivity type of said bi-stable floating body transistor.

5. The semiconductor memory cell of claim 1, wherein said bi-stable floating body transistor comprises a buried well region.

6. A semiconductor memory cell comprising:
a first transistor having a floating body;
a buried layer below said floating body, wherein application of voltage on said buried layer maintains a state of said memory cell; and
a second transistor;
wherein said first transistor having a floating body transistor comprises a back-bias region configured to generate impact ionization when said memory cell is in one of first and second states, and wherein said back-bias region is configured so as not to generate impact ionization when the memory cell is in the other of said first and second states; and
wherein said first and second transistors are connected in series.

7. A semiconductor memory cell comprising:
a bi-stable floating body transistor; and
a floating gate transistor;
wherein said bi-stable floating body transistor comprises a back-bias region configured to generate impact ionization when said memory cell is in one of first and second states, and wherein said back-bias region is configured so as not to generate impact ionization when the memory cell is in the other of said first and second states.

8. A semiconductor memory cell comprising:
a first bi-stable floating body transistor; and
a second bi-stable floating body transistor;
wherein said first and second floating body transistors are configured to store complementary charges; and
wherein both said first bi-stable floating body transistor and said second bi-stable floating body transistor comprise a back-bias region configured to generate impact ionization when said memory cell is in one of first and second states, and wherein said back-bias region is configured so as not to generate impact ionization when the memory cell is in the other of said first and second states.

9. A semiconductor memory cell comprising:
a first transistor having a first body;
a second transistor having a second body;
a substrate underlying both of said first and second bodies;
a buried layer interposed between said substrate and at least one of said first and second bodies;
a first source region contacting said first body;
a first drain region separated from said first source line region and contacting said first body;
a first gate insulated from said first body;
an insulating member insulating said first body from said second body;
a second source region contacting said second body;
a second drain region separated from said second source region and contacting said second body; and
a second gate insulated from said second body;
wherein said first body is a floating body and said second body is a well region electrically connected to said buried layer;
wherein said first body has a first conductivity type selected from p-type conductivity type and n-type conductivity type;
wherein said second body has a second conductivity type selected from said p-type conductivity type and n-type conductivity type; and
wherein said first conductivity type is different from said second conductivity type.

10. The semiconductor memory cell of claim 9, wherein said first gate is positioned between said first source region and said first drain region and said second gate is positioned between said second source region and said second drain region.

11. The semiconductor memory cell of claim 9, wherein said first transistor is a floating body transistor and said second transistor is an access transistor.

12. The semiconductor memory cell of claim 9, wherein said first body is a floating body and said second body is a well region electrically connected to said substrate.

13. The semiconductor memory cell of claim 9, wherein said first body has a first conductivity type selected from p-type conductivity type and n-type conductivity type, wherein said second body has said first conductivity type, and wherein said first and second source regions and first and second drain regions each have a second conductivity type selected from said p-type conductivity type and n-type conductivity type, and wherein said first conductivity type is different from said second conductivity type.

14. A semiconductor memory cell comprising:
a first transistor having a first body;
a second transistor having a second body;
a substrate underlying both of said first and second bodies;
a buried layer interposed between said substrate and at least one of said first and second bodies;
a first source region contacting said first body;
a first drain region separated from said first source line region and contacting said first body;
a first gate insulated from said first body;
an insulating member insulating said first body from said second body;
a second source region contacting said second body;
a second drain region separated from said second source region and contacting said second body; and
a second gate insulated from said second body;
wherein said semiconductor memory cell comprises a reference cell, said reference cell further comprising:
a sense line region spaced apart from said first source region and said first drain region and contacting said first body, wherein said first body has a first conductivity type selected from p-type conductivity type and n-type conductivity type, and wherein said sense line region has said first conductivity type.

* * * * *